(12) United States Patent
Wu

(10) Patent No.: US 10,448,501 B2
(45) Date of Patent: Oct. 15, 2019

(54) CIRCUIT STRUCTURE

(71) Applicant: INDUSTRIAL TECHNOLOGY RESEARCH INSTITUTE, Hsinchu (TW)

(72) Inventor: Shih-Hsien Wu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 412 days.

(21) Appl. No.: 14/968,021

(22) Filed: Dec. 14, 2015

(65) Prior Publication Data

US 2017/0019994 A1     Jan. 19, 2017

(30) Foreign Application Priority Data

Jul. 17, 2015   (TW) .............................. 104123296 A

(51) Int. Cl.
     *H05K 1/02*        (2006.01)
     *H05K 3/46*        (2006.01)
     *H05K 3/42*        (2006.01)

(52) U.S. Cl.
CPC ........... *H05K 1/0251* (2013.01); *H05K 3/429* (2013.01); *H05K 3/4602* (2013.01); *H05K 2201/0959* (2013.01); *H05K 2201/09536* (2013.01); *H05K 2201/09563* (2013.01); *H05K 2201/09627* (2013.01); *H05K 2201/09809* (2013.01)

(58) Field of Classification Search
CPC .... H05K 1/0251; H05K 3/4602; H05K 3/429; H05K 2010/9536; H05K 2201/09563; H05K 2201/0959; H05K 2201/09627; H05K 2201/09809; H05K 1/0222

USPC ......................................................... 174/262
See application file for complete search history.

(56) References Cited

U.S. PATENT DOCUMENTS

| | | |
|---|---|---|
| 5,374,788 A | 12/1994 | Endoh et al. |
| 5,421,083 A | 6/1995 | Suppelsa et al. |
| 6,388,206 B2 | 5/2002 | Dove et al. |
| 6,717,071 B2 | 4/2004 | Chang et al. |
| 7,360,308 B2 | 4/2008 | Oggioni et al. |
| 7,404,250 B2 | 7/2008 | Cheng et al. |
| 7,409,668 B2 | 8/2008 | Lin et al. |
| 7,602,059 B2 | 10/2009 | Nobutaka et al. |

(Continued)

FOREIGN PATENT DOCUMENTS

| | | |
|---|---|---|
| CN | 101489358 A | 7/2009 |
| CN | 201986262 U | 9/2011 |

(Continued)

OTHER PUBLICATIONS

Lu Ming-Tsun et al., "The study of coaxial via in multi-layers PCB", 13th Electronic Circuits World Convention, 2014, 1-4.

(Continued)

*Primary Examiner* — Steven T Sawyer
(74) *Attorney, Agent, or Firm* — Locke Lord LLP; Tim Tingkang Xia, Esq.

(57) ABSTRACT

A circuit structure includes an annular conductor, a conductive via and at least one extension conductor. The annular conductor extends along a direction. The conductive via is disposed in the annular conductor and extending along the direction. The at least one extension conductor is electrically connected to at least one end of the annular conductor and extending toward the conductive via.

19 Claims, 73 Drawing Sheets

(56) References Cited

U.S. PATENT DOCUMENTS

| | | | |
|---|---|---|---|
| 7,687,723 | B2 | 3/2010 | Izuchi et al. |
| 8,058,956 | B2 | 11/2011 | Jow et al. |
| 8,304,666 | B2 | 11/2012 | Ko et al. |
| 8,765,512 | B2 | 7/2014 | Kohl et al. |
| 2002/0179332 | A1 | 12/2002 | Uematsu et al. |
| 2006/0258187 | A1 | 11/2006 | Behziz |
| 2007/0193775 | A1 | 8/2007 | Chen et al. |
| 2009/0200682 | A1* | 8/2009 | Zhang ............ H01L 21/486 257/774 |
| 2009/0294161 | A1* | 12/2009 | Yoshimura ....... H05K 3/4608 174/258 |
| 2010/0163295 | A1* | 7/2010 | Roy ................ H05K 1/0222 174/262 |
| 2011/0005814 | A1 | 1/2011 | Liu et al. |
| 2011/0090651 | A1 | 4/2011 | Jung et al. |
| 2011/0095851 | A1 | 4/2011 | Wyland |
| 2011/0203842 | A1 | 8/2011 | Russell |
| 2011/0209911 | A1* | 9/2011 | Ishida ............. H05K 1/0222 174/264 |
| 2012/0187550 | A1* | 7/2012 | Wu ................. H05K 1/0222 257/659 |

FOREIGN PATENT DOCUMENTS

| | | |
|---|---|---|
| CN | 102612253 A | 7/2012 |
| CN | 104735907 A | 6/2015 |
| EP | 2053721 A2 | 4/2009 |
| TW | 511288 B | 11/2002 |
| TW | I283077 B | 6/2007 |
| TW | I396480 B1 | 5/2013 |
| WO | 2010063715 A2 | 6/2010 |

OTHER PUBLICATIONS

Yoshiyuki Takasu et al., "Simulated High-Frequency Characteristics of Coaxial Via Connection Structures in Printed Circuit Boards Using Three-Dimensional Electromagnetic Field Analysis", EDAPS, 2009.

Wu Zhaohua, "Study on Signal Transmission Performance of Microwave Multi-chip Modules Interconnect Via Hole Structure", ICEPT-HDP, 2012, 1352-1356.

Jun So Pak et al., "Coupling of Through-Hole Signal Via to Power/Ground resonance and excitation of Edge Radiation in Multi-Layer PCB", Electromagnetic Compatibility, 2003, IEEE International Symposium on (vol. 1 ), vol. 1, pp. 231-235.

Shaowei Deng et al., "Effects of Open Stubs Associated with Plated Through-Hole Vias in Backpanel Designs", , Electromagnetic Compatibility, EMC, 2004, InternationalSymposium on (vol. 3 ), vol. 3, pp. 1017-1022.

Intellectual Property Office, Ministry of Economic Affairs, R. O. C, "Office Action", dated Dec. 28, 2016, Taiwan.

SIPO State Intellectual Property Office, "Office Action", dated Jun. 25, 2018, China.

Chinese Patent Office, "Office Action", dated Jan. 24, 2019, China.

* cited by examiner

CIRCUIT STRUCTURE

CROSS-REFERENCE TO RELATED APPLICATIONS

This non-provisional application claims priority under 35 U.S.C. § 119(a) on Patent Application No(s). 104123296 filed in Taiwan, R.O.C. on Jul. 17, 2015, the entire contents of which are hereby incorporated by reference.

BACKGROUND

In a conventional circuit structure, the electrical signals are transmitted in the horizontal direction by the conductive line. When the electrical signals are transmitted from a conductive line in one layer to a conductive line in another layer, the conductive via electrically connecting the conductive lines located on the two different layers is used for transmitting the electrical signals in the vertical direction. Therefore, the electrical signals are able to be transmitted across different layers.

SUMMARY

One embodiment of the disclosure provides a circuit structure including an annular conductor, a conductive via and at least one extension conductor. The annular conductor extends along a direction. The conductive via is disposed in the annular conductor and extending along the direction. The at least one extension conductor is electrically connected to at least one end of the annular conductor and extending toward the conductive via.

Another embodiment of the disclosure provides a circuit structure including a conductive via, a first arcuate conductor and at least one extension conductor. The conductive via extends along a direction. The first arcuate conductor is disposed at one side of the conductive via, and the first arcuate conductor is electrically insulated from the conductive via. The at least one extension conductor is electrically connected to at least one end of the first arcuate conductor and extends toward the conductive via.

BRIEF DESCRIPTION OF THE DRAWINGS

The disclosure will become better understood from the detailed description given hereinbelow and the accompanying drawings which are given by way of illustration only and thus are not limitative of the present disclosure and wherein.

DETAILED DESCRIPTION

Figure 1A:
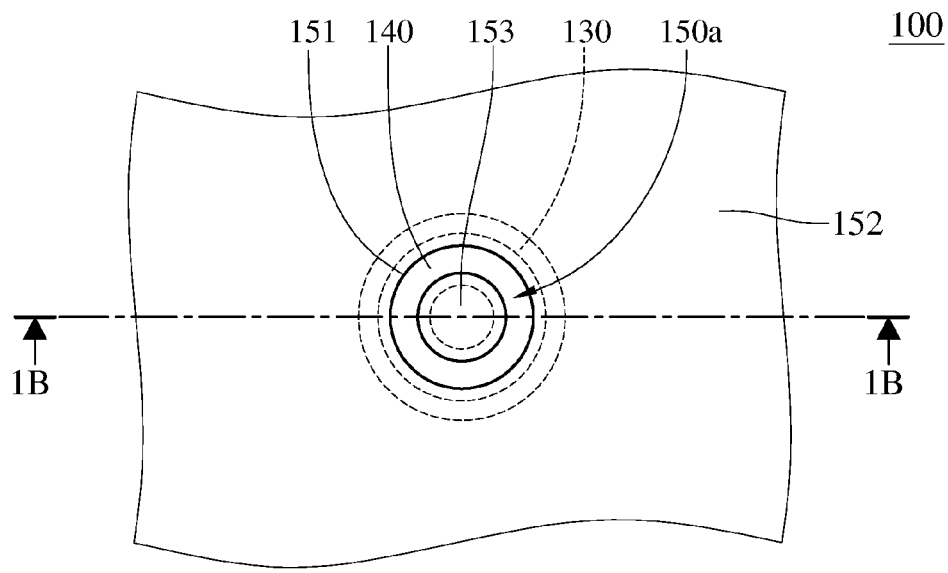
FIG. 1A is a top view of a circuit structure according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In the disclosure, the terms "top" and "bottom" mean two opposite directions in the drawings for providing a through understanding of the disclosed embodiments in the following descriptions but are not limitations of the disclosure. The terms "on" and "under" mean two opposite positions of an object in the drawings for providing a through understanding of the disclosed embodiments in the following descriptions but are not limitations of the disclosure. The term "insulating" means electrically insulating in the disclosure.

Figure 1B:
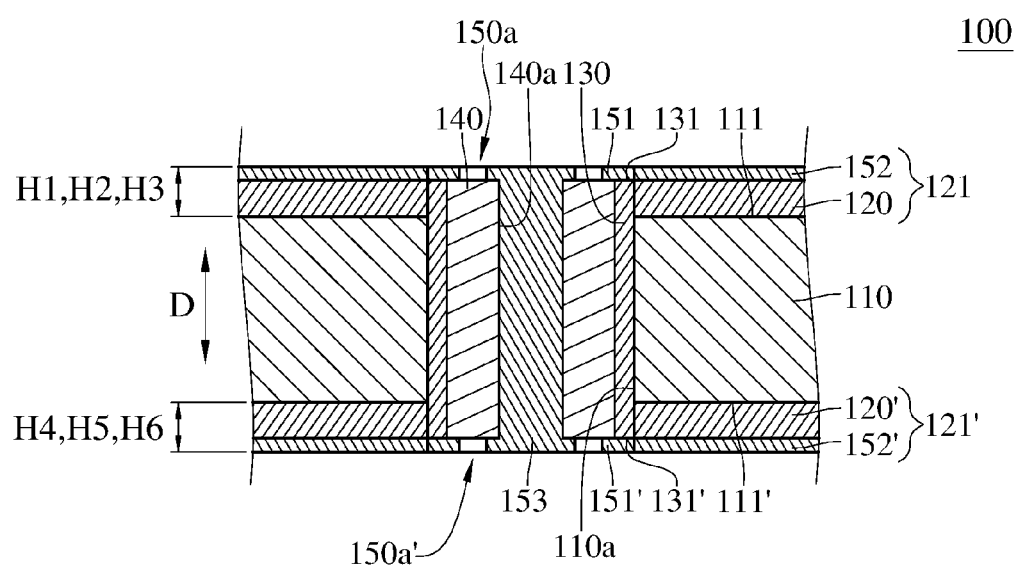
FIG. 1B is a cross-sectional view of the circuit structure along a line 1B-1B in FIG. 1A.

Please refer to FIG. 1A and FIG. 1B. FIG. 1A is a top view of a circuit structure according to a first embodiment of the disclosure. FIG. 1B is a cross-sectional view of the circuit structure along a line 1B-1B in FIG. 1A. In the first embodiment of the present disclosure, the circuit structure 100 includes a core substrate 110, a top conductive layer 121, a bottom conductive layer 121', an annular conductor 130, a dielectric element 140, a top extension conductor 151, a bottom extension conductor 151' and a conductive via 153.

The core substrate 110 includes a top surface 111, a bottom surface 111' and a through hole 110a. The through hole 110a extends along a direction D. The core substrate 110, for example, is a single-layer board or a multilayer board. The single-layer board, for example, is made of dielectric materials, electrical insulation materials or semiconductor materials. The dielectric material and the electrical insulation material, for example, are glass or ceramic. The semiconductor material, for example, is silicon. The multilayer board, for example, is a stack of multiple single-layer boards and multiple conductive layers with the single-layer board and the conductive layer arranged in a repeating sequence, and the multiple conductive layers can be electrically connected to a signal source, a power source or a reference potential.

The annular conductor 130 is disposed on a sidewall of the through hole 110a and extends along the direction D. The conductive via 153 is located in the annular conductor 130 and extends along the direction D. In the first embodiment of the present disclosure, the conductive via 153 is made of a solid conductive pillar, but the disclosure is not limited thereto. In other embodiments of the present disclosure, the conductive via can be made of a hollow conductive pillar, and conductive glue can be filled in the conductive via.

The dielectric element 140 is located between the conductive via 153 and the annular conductor 130, and the dielectric element 140 has a through hole 140a. The conductive via 153 is located on a sidewall of the through hole 140a. A dielectric constant of the dielectric element 140 can be between 1 and 6.

The top extension conductor 151 is electrically connected to a top end 131 of the annular conductor 130 and extends toward the conductive via 153. The top extension conductor 151 is electrically insulated from the conductive via 153. The bottom extension conductor 151' is electrically connected to a bottom end 131' of the annular conductor 130 and extends toward the conductive via 153. The bottom extension conductor 151' is electrically insulated from the conductive via 153. A top opening 150a separates the top extension conductor 151 and the conductive via 153, and the bottom opening 150a' separates the bottom extension conductor 151' and the conductive via 153. The top extension conductor 151 and the bottom extension conductor 151' can extend on two opposite surfaces of the dielectric element 140, respectively, and the shapes of the top extension conductor 151 and the bottom extension conductor 151', for example, is ring shape, circular sector, polygon, circle, rectangle or other shapes.

The top conductive layer 121 can be a stacking structure including a top first conductive layer 120 and a top second conductive layer 152 stacking on the top first conductive layer 120. The top first conductive layer 120 is located on the top surface 111 of the core substrate 110 and electrically connected to the top end 131 of the annular conductor 130. The top second conductive layer 152 is located on the top first conductive layer 120 and electrically connected to the top end 131 of the annular conductor 130 and the top extension conductor 151. The bottom conductive layer 121' can be a stacking structure including a bottom first conductive layer 120' and a bottom second conductive layer 152' stacking on the bottom first conductive layer 120'. The bottom first conductive layer 120' is located under the bottom surface 111' of the core substrate 110 and electrically connected to the bottom end 131' of the annular conductor 130. The bottom second conductive layer 152' is located under the bottom first conductive layer 120' and electrically connected to the bottom end 131' of the annular conductor 130 and the bottom extension conductor 151'.

In the first embodiment of the present disclosure, taking the top surface 111 of the core substrate 110 as a reference plane, a height H1 of the top extension conductor 151 is equal to a height H2 of a top end of the conductive via 153 and a height H3 of the top conductive layer 121. Moreover, taking the bottom surface 111' of the core substrate 110 as a reference plane, a height H4 of the bottom extension conductor 151' is equal to a height H5 of a bottom end of the conductive via 153 and a height H6 of the bottom conductive layer 121'.

In addition, when the circuit structure 100 is in practical application, the annular conductor 130, the top extension conductor 151 and the bottom extension conductor 151', for example, is electrically connected to a reference potential. In detail, both of the top conductive layer 121 and the bottom conductive layer 121' can be electrically connected to the reference potential, or both of the top extension conductor 151 and the bottom extension conductor 151', which are respectively electrically connected to the top conductive layer 121 and the bottom conductive layer 121', can be electrically connected to a conductive layer (not shown) having a reference potential by a via (not shown). The way that electrically connects the annular conductor 130, the top extension conductor 151 and the bottom extension conductor 151' to the reference potential is not limited in the present disclosure. The reference potential can be a ground potential or other potentials.

The following describes a manufacturing process of the circuit structure 100; please refer to FIG. 2A to FIG. 8B. FIG. 2A, FIG. 3A, FIG. 4A, FIG. 5A, FIG. 6A, FIG. 7A and FIG. 8A are top views of the circuit structure in FIG. 1A at different manufacturing steps. FIG. 2B, FIG. 3B, FIG. 4B, FIG. 5B, FIG. 6B, FIG. 7B and FIG. 8B are cross-sectional views of the circuit structure in FIG. 1B at different manufacturing steps.

Figure 2A:
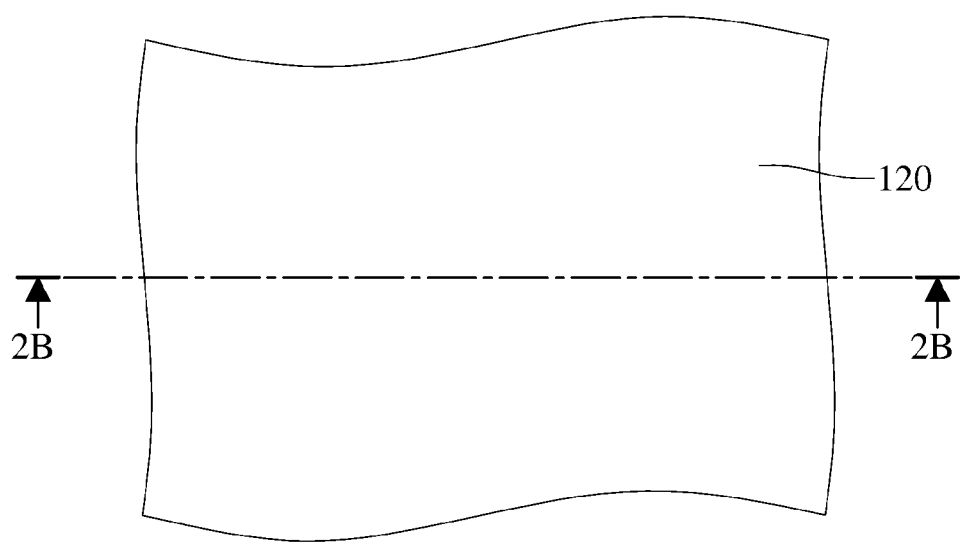
FIG. 2A, FIG. 3A, FIG. 4A, FIG. 5A, FIG. 6A, FIG. 7A and FIG. 8A are top views of the circuit structure in FIG. 1A at different steps of the manufacturing process.
Figure 2B:
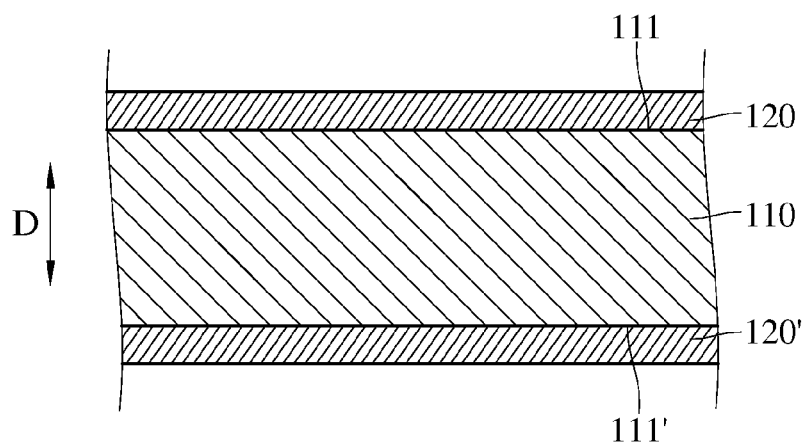
FIG. 2B, FIG. 3B, FIG. 4B, FIG. 5B, FIG. 6B, FIG. 7B and FIG. 8B are cross-sectional views of the circuit structure in FIG. 1B at different manufacturing steps.

As shown in FIG. 2A and FIG. 2B, a core substrate 110 is provided. A top first conductive layer 120 is formed on a top surface 111 of the core substrate 110 as well as a bottom first conductive layer 120' is formed under a bottom surface 111' of the core substrate 110.

Figure 3A:
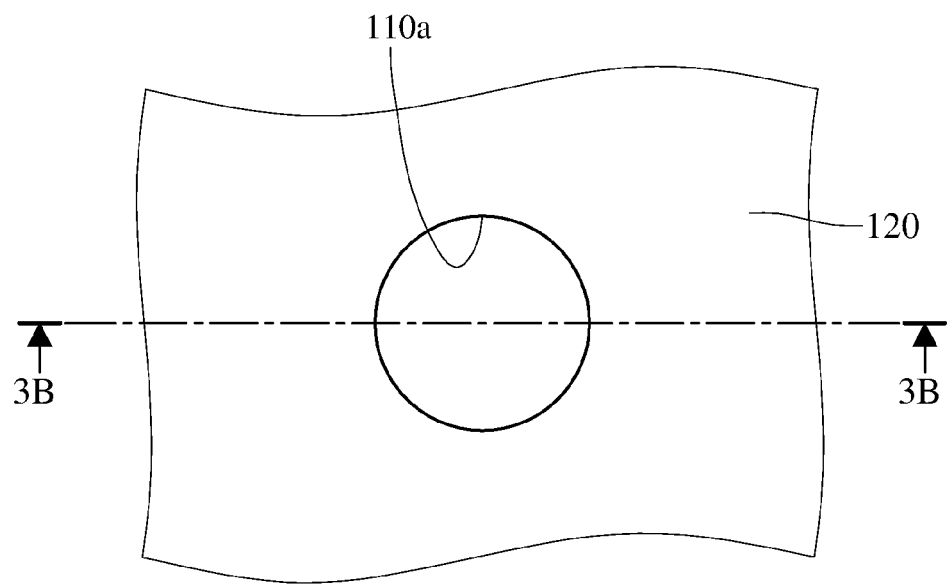
Figure 3B:
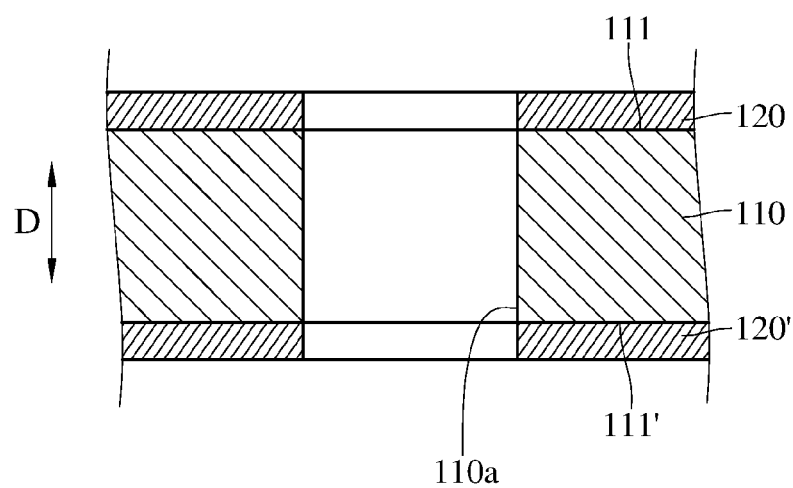

As shown in FIG. 3A and FIG. 3B, a through hole 110a penetrating through the top first conductive layer 120, the core substrate 110 and the bottom first conductive layer 120' is formed. The through hole 110a extends along a direction D.

Figure 4A:
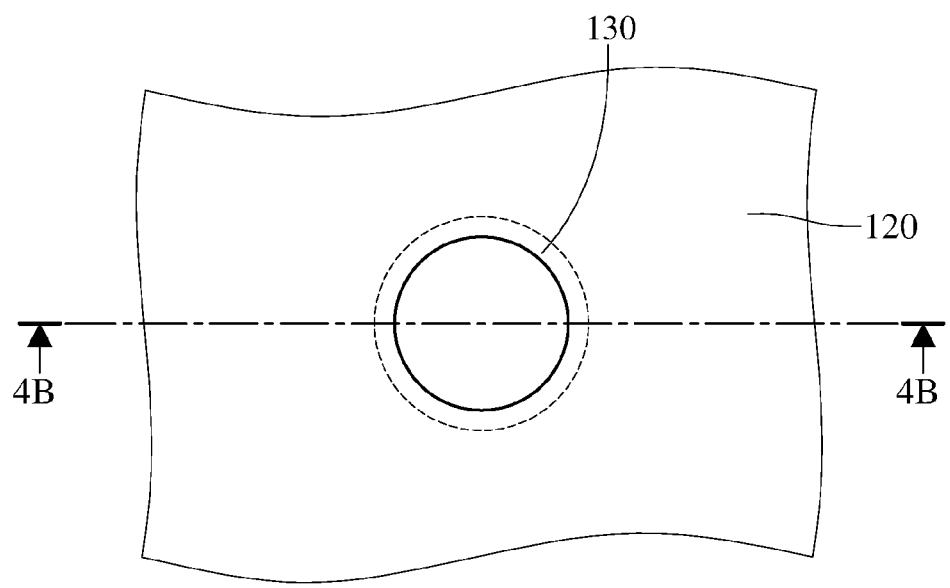
Figure 4B:
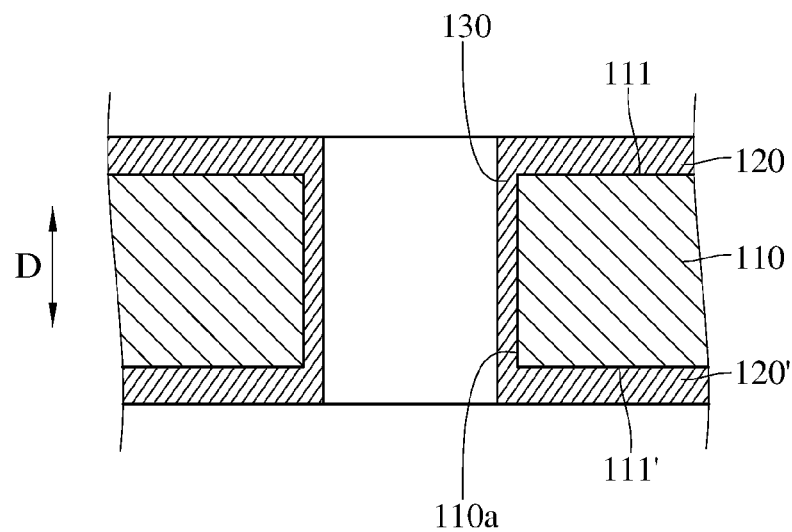

As shown in FIG. 4A and FIG. 4B, an annular conductor 130 on a sidewall of the through hole 110a is formed, and the annular conductor 130 is electrically connected to the top first conductive layer 120 and the bottom first conductive layer 120'. The annular conductor 130 extends along the direction D and penetrates the core substrate 110.

Figure 5A:
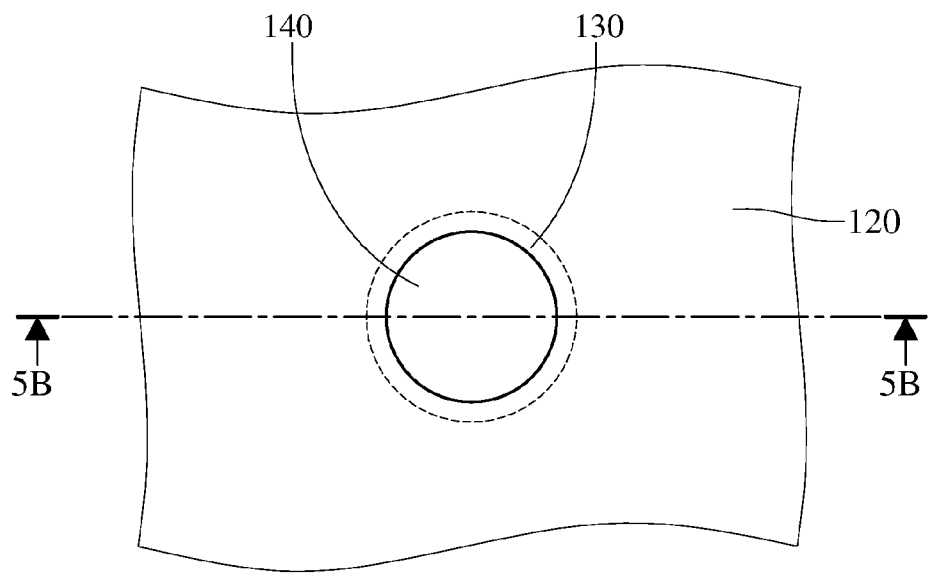
Figure 5B:
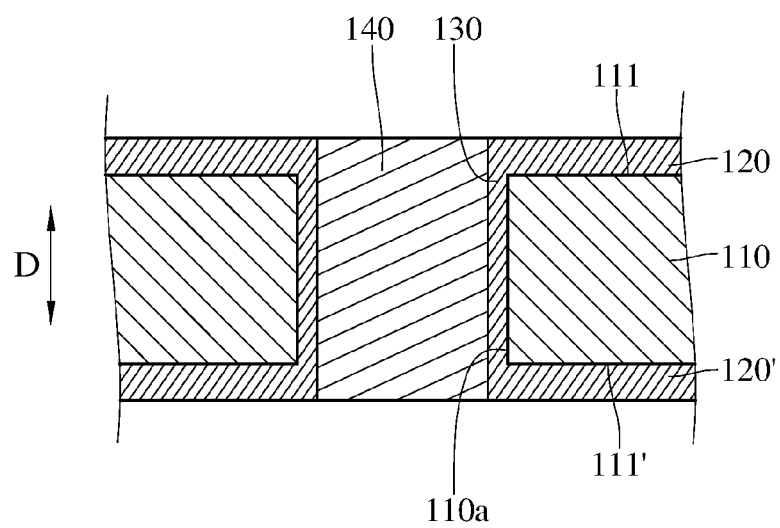

As shown in FIG. 5A and FIG. 5B, a dielectric element 140 in the annular conductor 130 is formed. The dielectric element 140 extends along the direction D.

Figure 6A:
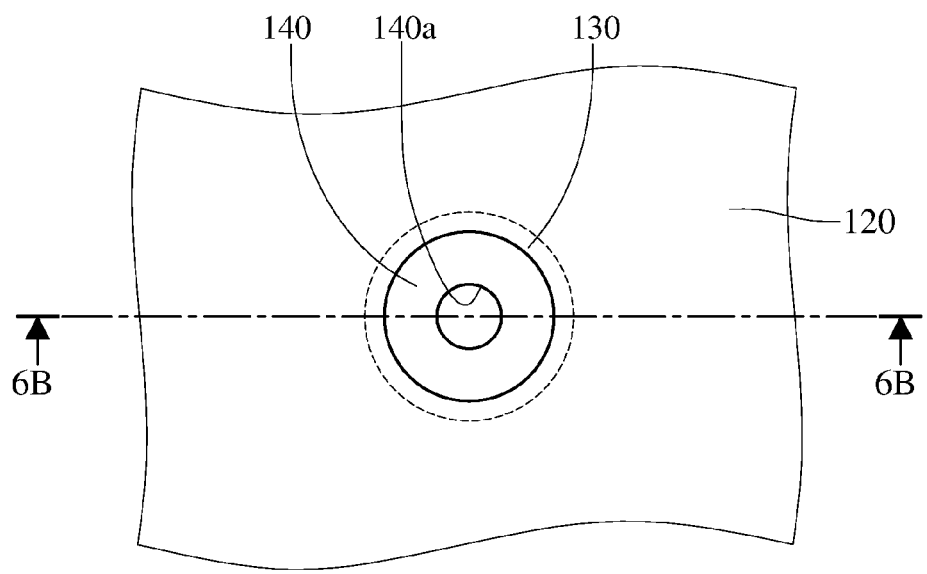
Figure 6B:
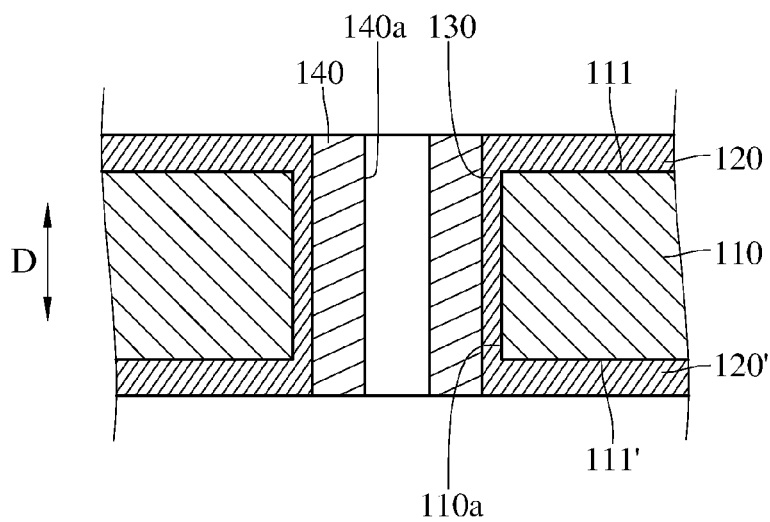

As shown in FIG. 6A and FIG. 6B, a through hole 140a penetrating through the dielectric element 140 is formed. The through hole 140a extends along the direction D.

Figure 7A:
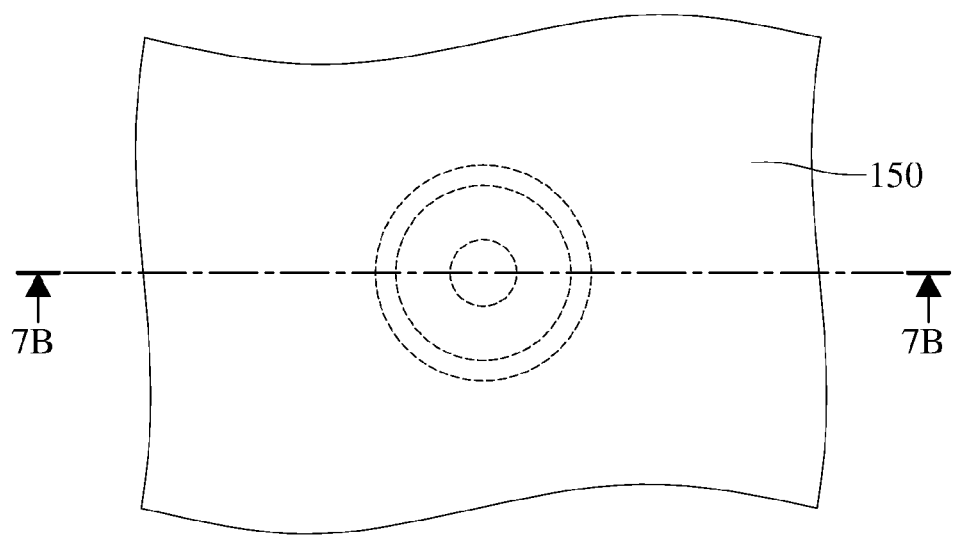
Figure 7B:
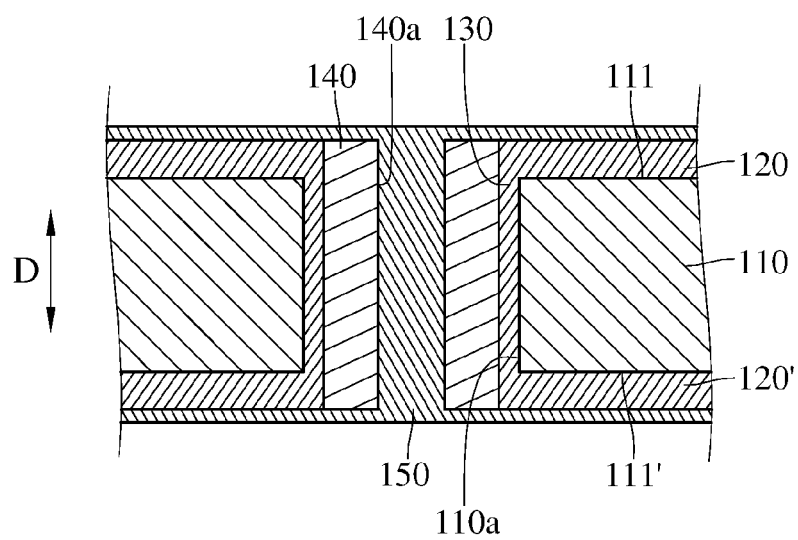
Figure 8A:
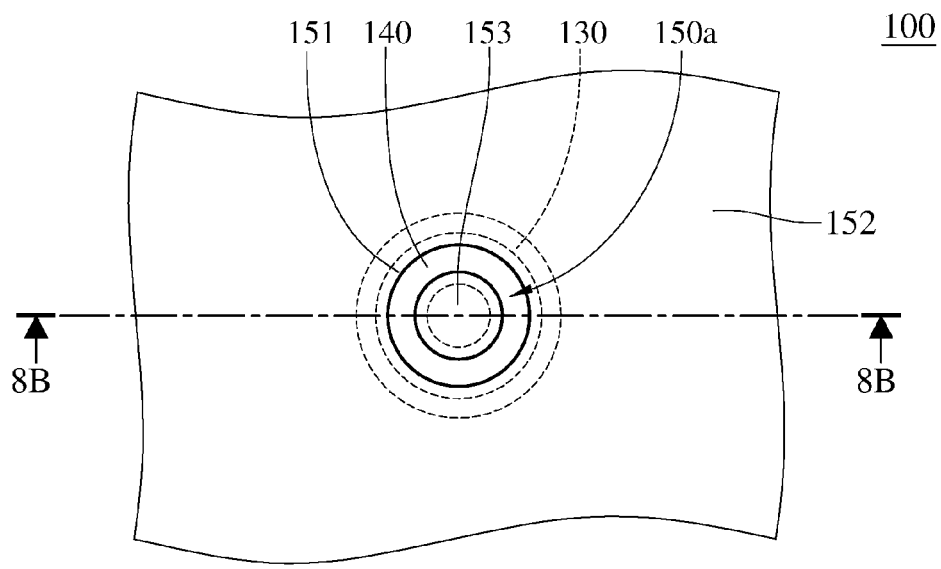
Figure 8B:
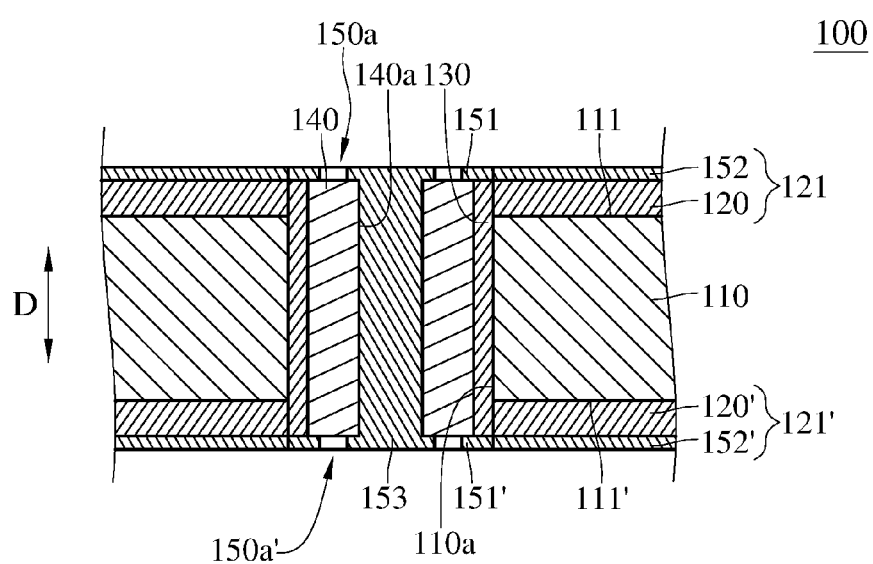

As shown in FIG. 7A and FIG. 7B, a conductive material 150 on a sidewall of the through hole 140a, the dielectric element 140, the top first conductive layer 120 and the bottom first conductive layer 120' is formed. As shown in FIG. 8A and FIG. 8B, a top opening 150a and a bottom opening 150a' on the conductive material 150 for exposing the dielectric element 140 is formed, and both of the top opening 150a as well as the bottom opening 150a' surround two opposite ends of the through hole 140a, respectively. After the top opening 150a and the bottom opening 150a' is formed, the conductive material 150 shown in FIG. 7B is divided into a top extension conductor 151, a bottom extension conductor 151', a top second conductive layer 152, a bottom second conductive layer 152' and a conductive via 153. Moreover, the conductive via 153 is electrically insulated from the top extension conductor 151 as well as the top second conductive layer 152 by the top opening 150a, and the conductive via 153 is also electrically insulated from the bottom extension conductor 151' as well as the bottom second conductive layer 152' by the bottom opening 150a'. Most part of the conductive via 153 is located in the through hole 140a, and the through hole 140a extends along the direction D; therefore the conductive via 153 extends along the direction D.

Figure 9:
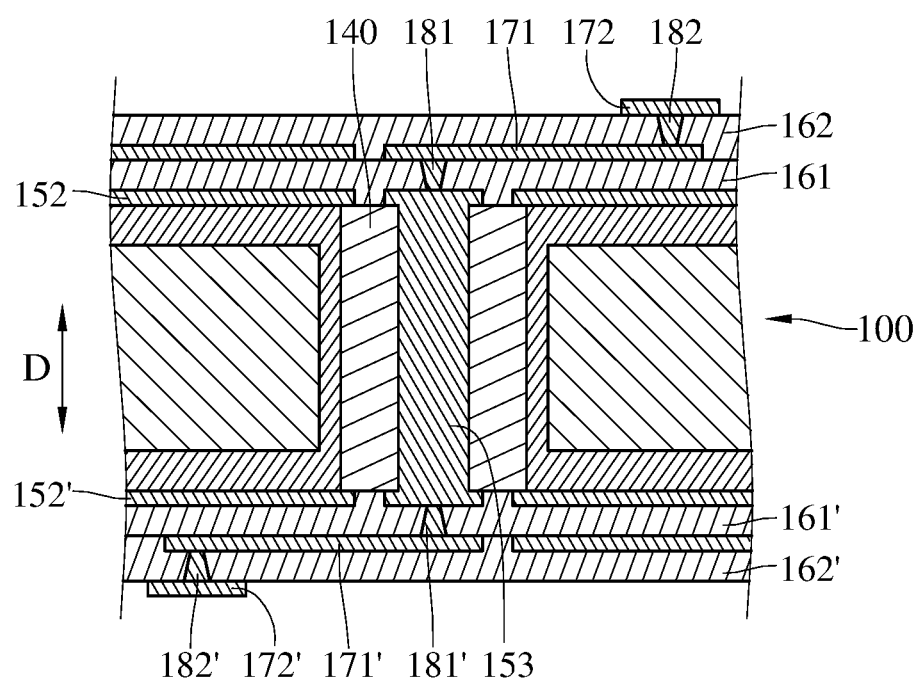
FIG. 9 is a cross-sectional view of an application of the circuit structure in FIG. 1B.

Please refer to FIG. 9. FIG. 9 is a cross-sectional view of an application of the circuit structure in FIG. 1B. In practical application, the circuit structure 100 can include a top first insulating layer 161 disposed on the top second conductive layer 152 and a top first conductive line 171 disposed on the top first insulating layer 161. The top first conductive line 171 is electrically connected to the conductive via 153 by a top first conducting hole 181. A top second insulating layer 162 is disposed on the top first conductive line 171, and a top second conductive line 172 is disposed on the top second insulating layer 162. The top second conductive line 172 is electrically connected to the top first conductive line 171 by a top second conducting hole 182. The dielectric element 140, for example, is made of thermal decomposable material. When the conductive via 153 is electrically connected to the top first conducting hole 181, a bottom first conducting hole 181', the top first conductive line 171 and a bottom first conductive line 171, the dielectric element 140 which is made of thermal decomposable material is vaporized. Then a space occupied by the dielectric element 140 in solid state is occupied by the dielectric element 140 in gas state, other gas or even vacuum. Both of the top first insulating layer 161 and the top second insulating layer 162, for example, are electrical insulation material.

Furthermore, the circuit structure 100 can include a bottom first insulating layer 161' disposed under a bottom second conductive layer 152' and a bottom first conductive line 171' disposed under a bottom first insulating layer 161'. The bottom first conductive line 171' is electrically connected to the conductive via 153 by a bottom first conducting hole 181'. A bottom second insulating layer 162' is disposed under the bottom first conductive line 171', and a bottom second conductive line 172' is disposed under the bottom second insulating layer 162'. The bottom second conductive line 172' is electrically connected to the bottom first conductive line 171' by a bottom second conducting hole 182'. Both of the bottom first insulating layer 161' and the bottom second insulating layer 162', for example, are electrical insulation material.

Figure 10A:
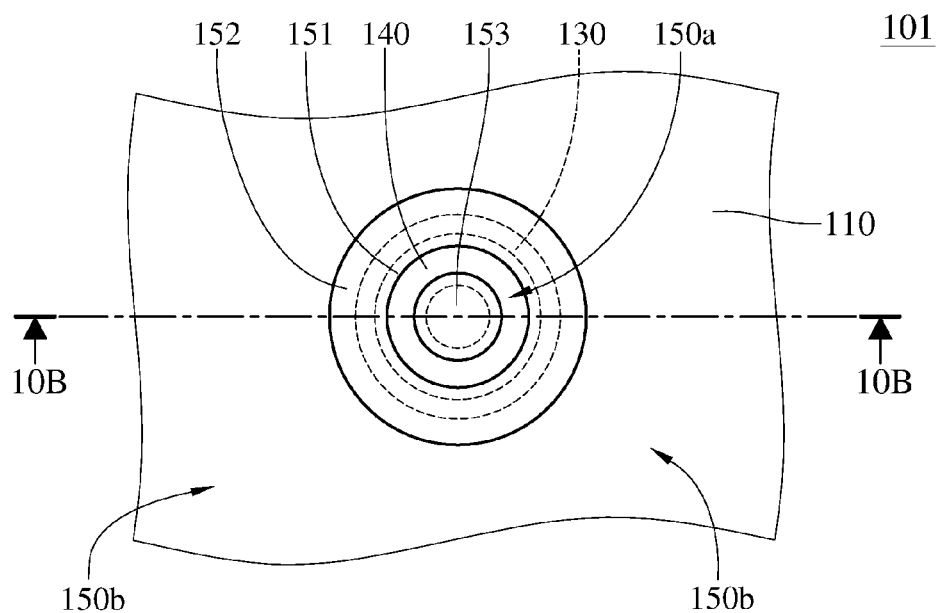
FIG. 10A is a top view of a circuit structure according to a second embodiment of the disclosure.
Figure 10B:
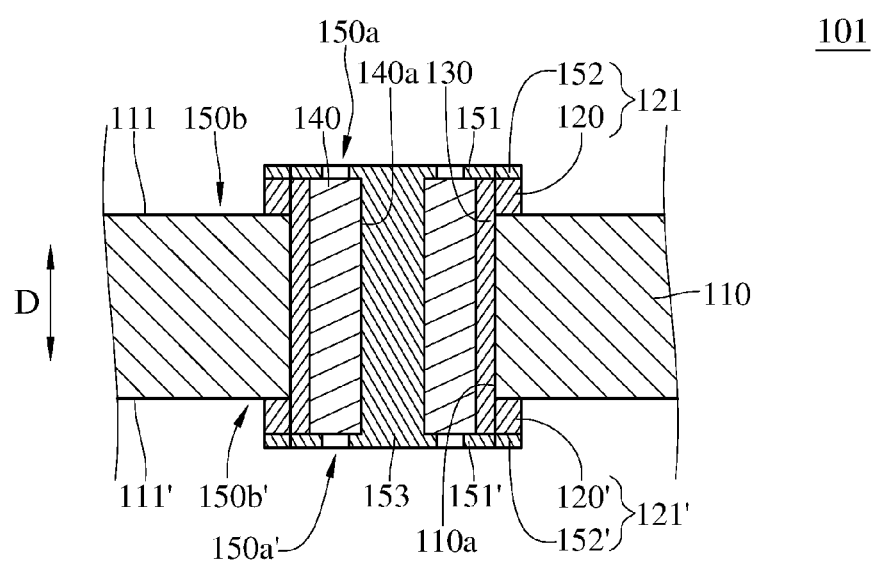
FIG. 10B is a cross-sectional view of the circuit structure along a line 10B-10B in FIG. 10A.

Please refer to FIG. 10A and FIG. 10B. FIG. 10A is a top view of a circuit structure according to a second embodiment of the disclosure. FIG. 10B is a cross-sectional view of the circuit structure along a line 10B-10B in FIG. 10A. In the second embodiment of the present disclosure, a circuit structure 101 is similar to the circuit structure 100 in the first embodiment, and each of the similar components is given the same sign, respectively. Manufacturing steps of the circuit structure 101 are also similar to the manufacturing steps of the circuit structure 100 in FIG. 2A to FIG. 7A and FIG. 2B to FIG. 7B so that the manufacturing steps of the circuit structure 101 are not repeated hereafter.

In this embodiment, the circuit structure 101, except for the top opening 150a and the bottom opening 150a' are formed to expose the dielectric element 140, further has a top opening 150b and a bottom opening 150b' formed to expose the core substrate 110. The top opening 150b is suitable for patterning the top conductive layer 121 or removing most of the top conductive layer 121 so that at least a part of the top surface 111 of the core substrate 110 is exposed. The bottom opening 150b' is suitable for patterning the bottom conductive layer 121' or removing most of the bottom conductive layer 121' so that at least a part of the bottom surface 111' of the core substrate 110 is exposed. In other embodiments of the present disclosure, the top opening can be used for removing entire of the top conductive layer, and the bottom opening can be used for removing entire of the bottom conductive layer.

Figure 11A:
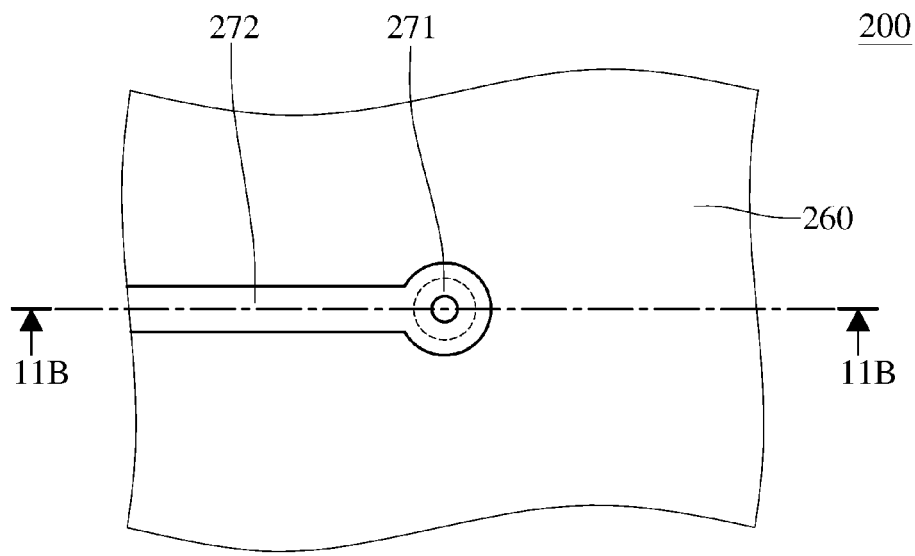
FIG. 11A is a top view of a circuit structure according to a third embodiment of the disclosure.
Figure 11B:
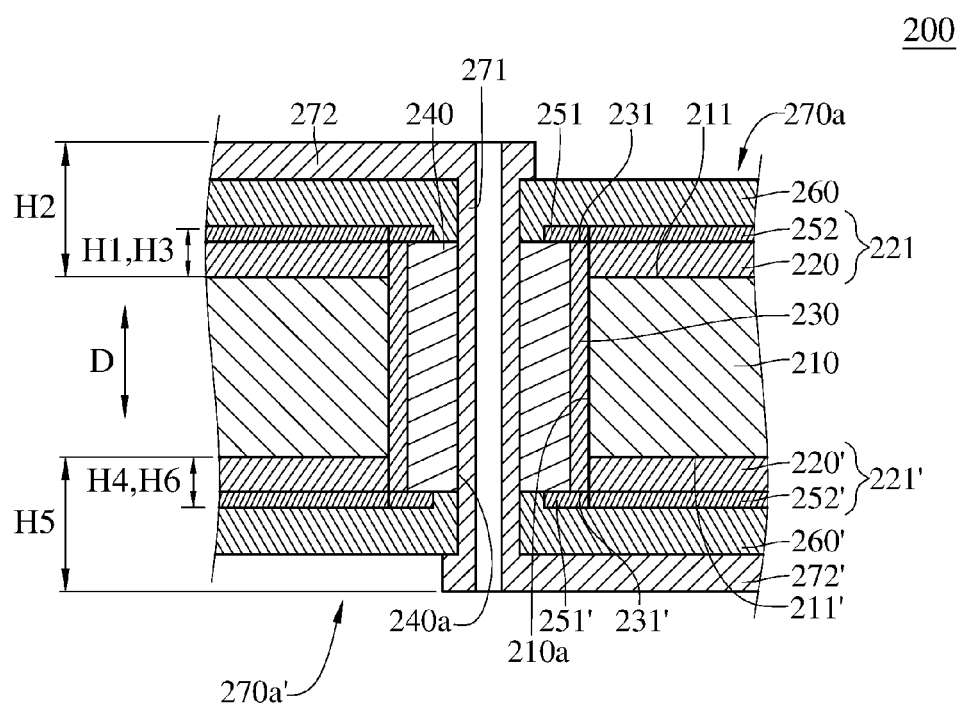
FIG. 11B is a cross-sectional view of the circuit structure along a line 11B-11B in FIG. 11A.
Figure 12A:
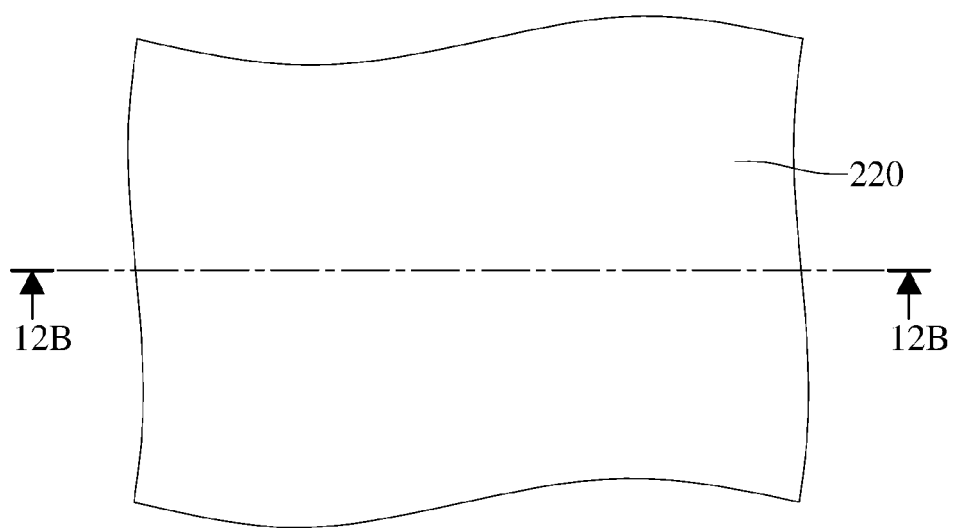
FIG. 12A, FIG. 13A, FIG. 14A, FIG. 15A, FIG. 16A, FIG. 17A, FIG. 18A, FIG. 19A and FIG. 20A are top views of the circuit structure in FIG. 11A at different manufacturing steps.
Figure 12B:
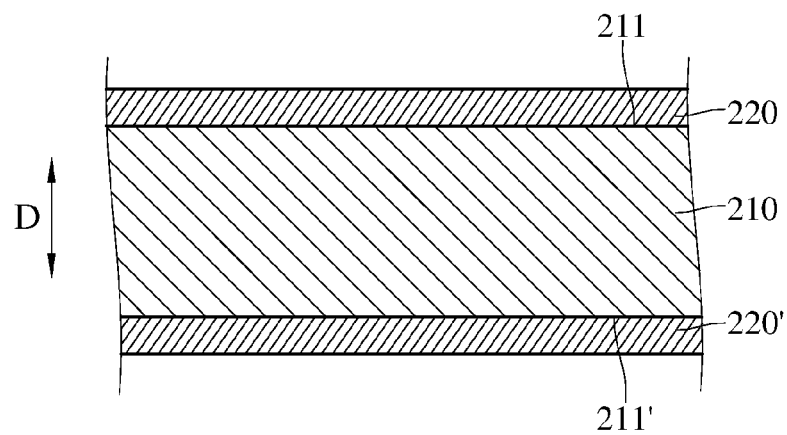
FIG. 12B, FIG. 13B, FIG. 14B, FIG. 15B, FIG. 16B, FIG. 17B, FIG. 18B, FIG. 19B and FIG. 20B are cross-sectional views of the circuit structure in FIG. 11B at different manufacturing steps.
Figure 13A:
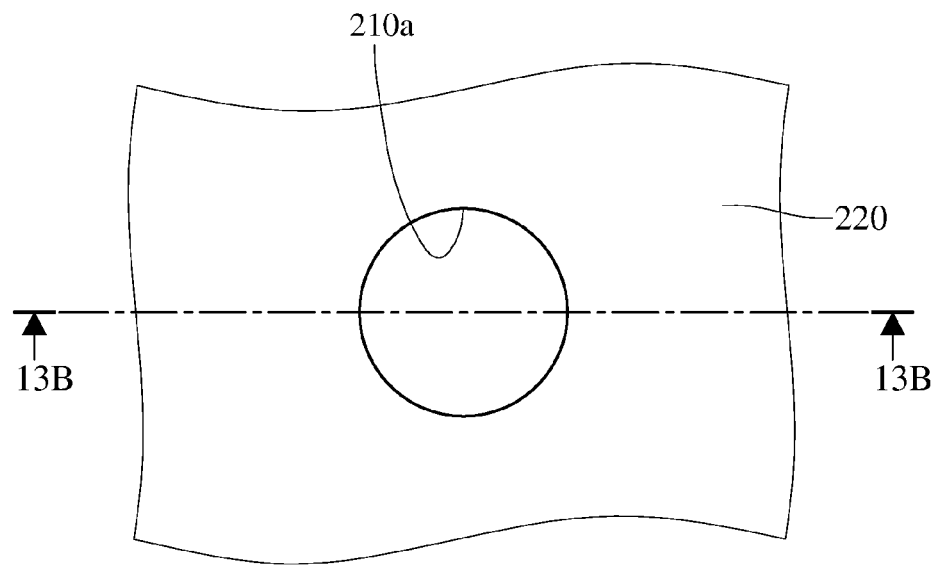
Figure 13B:
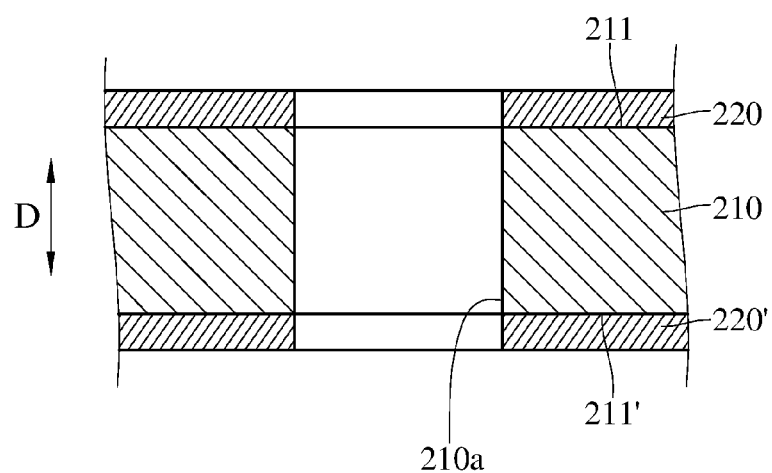
Figure 14A:
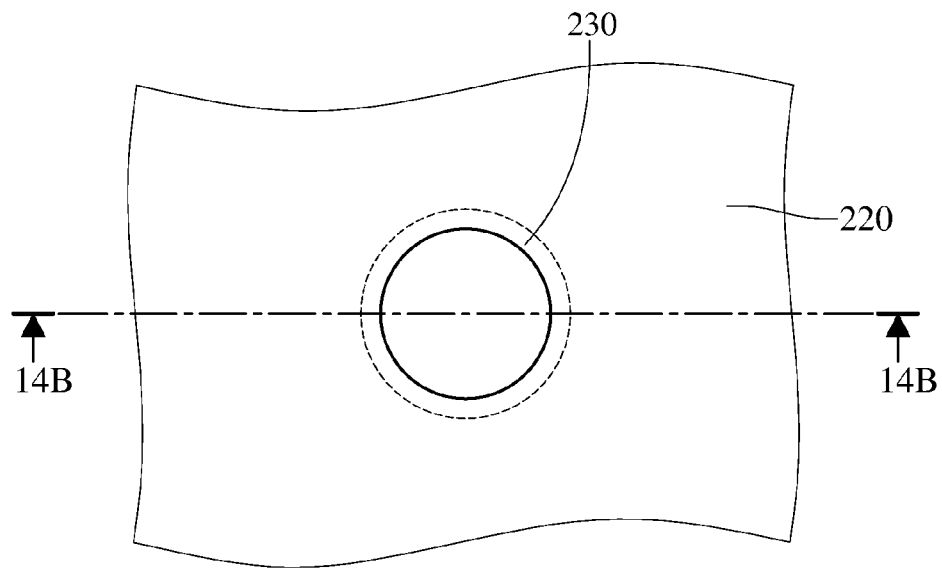
Figure 14B:
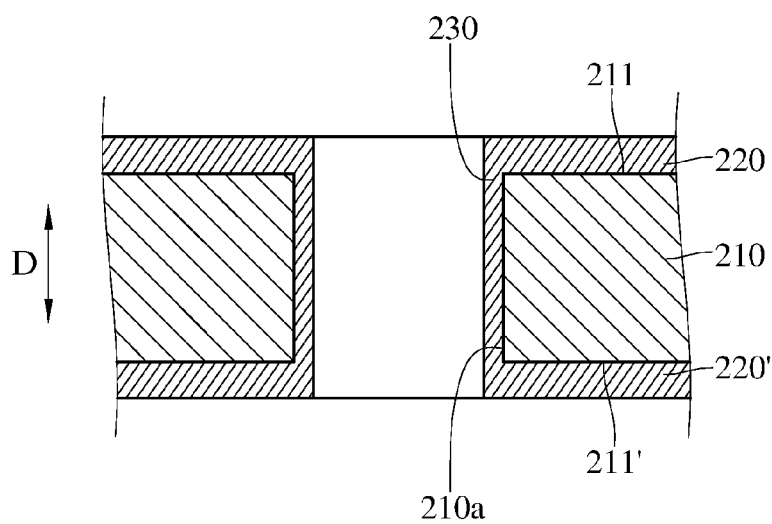
Figure 15A:
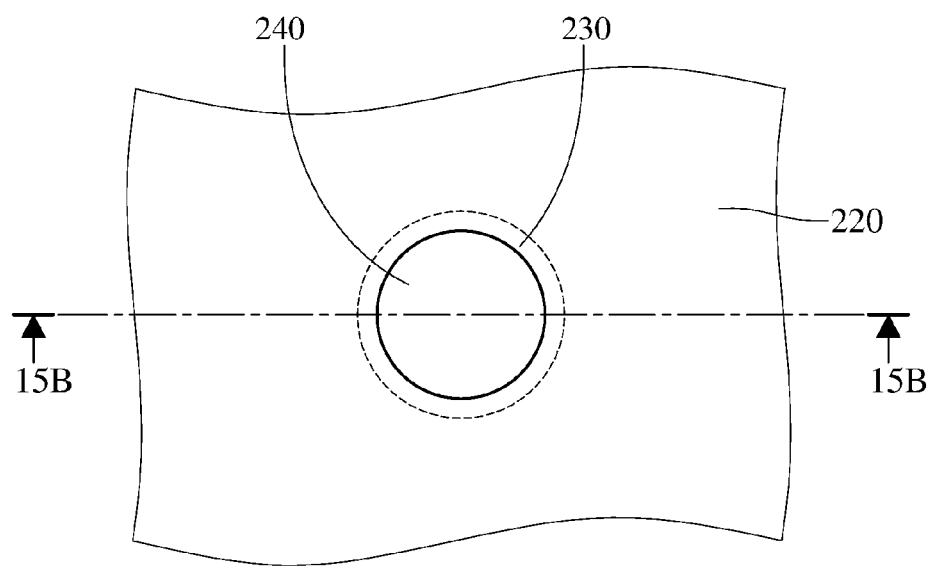
Figure 15B:
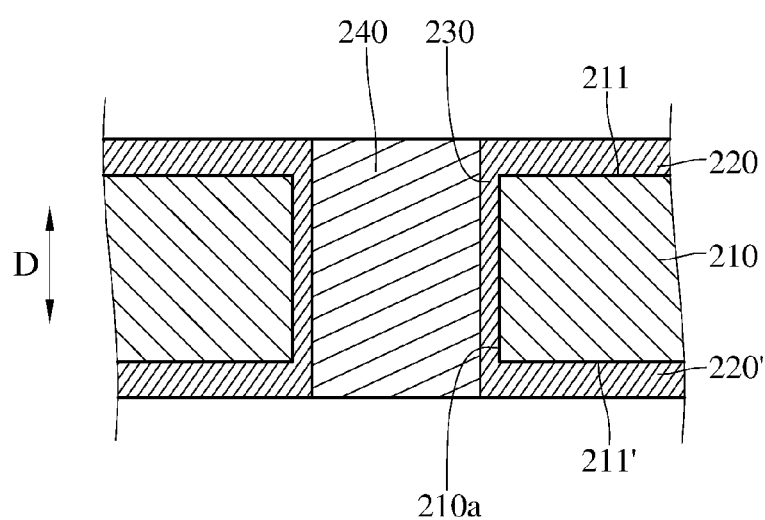

Please refer to FIG. 11A and FIG. 11B. FIG. 11A is a top view of a circuit structure according to a third embodiment of the disclosure. FIG. 11B is a cross-sectional view of the circuit structure along a line 11B-11B in FIG. 11A. In the third embodiment of the present disclosure, the circuit structure 200 includes a core substrate 210, a top conductive layer 221, a bottom conductive layer 221', an annular conductor 230, a dielectric element 240, a top extension conductor 251, a bottom extension conductor 251', a top insulating layer 260, a bottom insulating layer 260', a conductive via 271, a top conductive line 272 and a bottom conductive line 272'.

The circuit structure 200 in the third embodiment is similar to the circuit structure 100 in the first embodiment. The core substrate 210 includes a top surface 211, a bottom surface 211' and a through hole 210a extending along a direction D. The annular conductor 230 is disposed on a sidewall of the through hole 210a. The conductive via 271 is located in the annular conductor 230 and extends along the direction D. Furthermore, the conductive via 271 is disposed on a sidewall of the through hole 240a. The dielectric element 240 is located between the conductive via 271 and the annular conductor 230. The top extension conductor 251 is electrically connected to a top end 231 of the annular conductor 230 and extends toward the conductive via 271. The top extension conductor 251 is electrically insulated from the conductive via 271. The bottom extension conductor 251' is electrically connected to a bottom end 231' of the annular conductor 230 and extends toward the conductive via 271. The bottom extension conductor 251' is electrically insulated from the conductive via 271. The top conductive layer 221 can be a stacking structure including a top first conductive layer 220 and a top second conductive layer 252 stacking on the top first conductive layer 120. The top first conductive layer 220 is covered by the top second conductive layer 252. The bottom conductive layer 221' can be a stacking structure including a bottom first conductive layer 220' and a bottom second conductive layer 252' stacking on the bottom first conductive layer 220'. The bottom first conductive layer 220' is covered by the bottom second conductive layer 252'. Taking the top surface 211 of the core substrate 210 as a reference plane, a height H1 of the top extension conductor 251 is equal to a height H3 of the top conductive layer 221. Moreover, taking the bottom surface 211' of the core substrate 210 as a reference plane, a height H4 of the bottom extension conductor 251' is equal to a height H6 of the bottom conductive layer 221'.

However, in the third embodiment of the present disclosure, the top insulating layer 260 is disposed on the top surface 211 of the core substrate 210, and the top conductive layer 221 is covered by the top insulating layer 260. The bottom insulating layer 260' is disposed under the bottom surface 211' of the core substrate 210, and the bottom conductive layer 221' is covered by the bottom insulating layer 260'. The top conductive line 272 is disposed on a surface of the top insulating layer 260 and electrically connected to a top edge of the conductive via 271. Moreover, the top conductive line 272 is electrically insulated from the annular conductor 230. The bottom conductive line 272' is disposed under a surface of the bottom insulating layer 260' and electrically connected to a bottom edge of the conductive via 271. Moreover, the bottom conductive line 272' is electrically insulated from the annular conductor 230. A top opening 270a is suitable for patterning the top conductive line 272, and the bottom opening 270a' is suitable for patterning the bottom conductive line 272'.

Taking the top surface 211 of the core substrate 210 as a reference plane, a height H1 of the top extension conductor 251 is less than a height H2 of a top end of the conductive via 271. Taking the bottom surface 211' of the core substrate 210 as a reference plane, a height H4 of the bottom extension conductor 251' is less than a height H5 of a bottom end of the conductive via 271.

The following describes a manufacturing process of the circuit structure 200; please refer to FIG. 12A to FIG. 20B. FIG. 12A, FIG. 13A, FIG. 14A, FIG. 15A, FIG. 16A, FIG. 17A, FIG. 18A, FIG. 19A and FIG. 20A are top views of the circuit structure in FIG. 11A at different manufacturing steps. FIG. 12B, FIG. 13B, FIG. 14B, FIG. 15B, FIG. 16B, FIG. 17B, FIG. 18B, FIG. 19B and FIG. 20B are cross-sectional views of the circuit structure in FIG. 11B at different manufacturing steps. The manufacturing steps of the circuit structure 200 in FIG. 12A to FIG. 15A and FIG. 12B to FIG. 15B are similar to the manufacturing steps of the circuit structure 100 in FIG. 2A to FIG. 5A and FIG. 2B to FIG. 5B so that the manufacturing steps of the circuit structure 200 in FIG. 12A to FIG. 15A and FIG. 12B to FIG. 15B are not repeated hereafter.

Figure 16A:
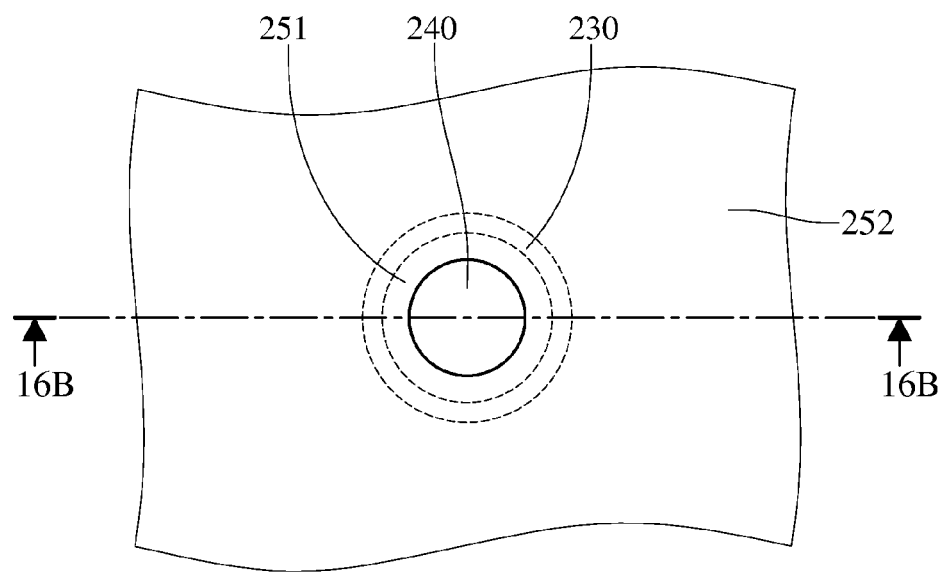
Figure 16B:
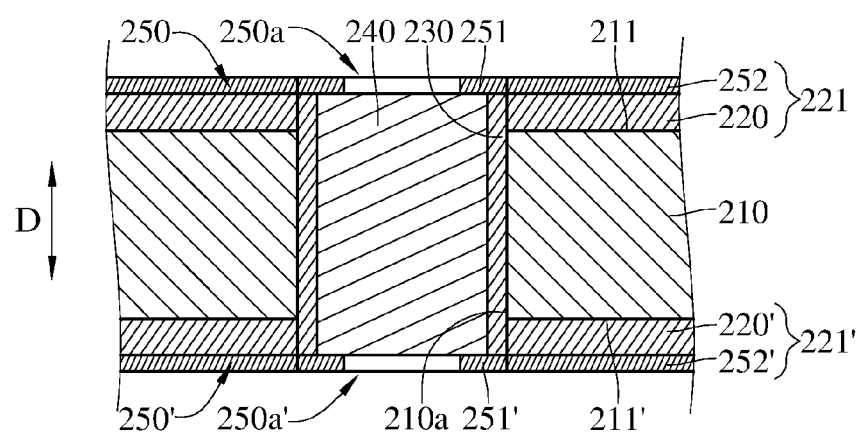

As shown in FIG. 16A and FIG. 16B, a top conductive material 250 is formed on a top surface of the top first conductive layer 220 and a top surface of the dielectric element 240, and a bottom conductive material 250' is formed under a bottom surface of the bottom first conductive layer 220' and a bottom surface of the dielectric element 240. A top opening 250a is formed on the top conductive material 250, and the bottom opening 250a' is formed under the bottom conductive material 250'; therefore, a part of a top surface and a part of a bottom surface of the dielectric element 240 are exposed. In addition, the top conductive material 250 includes a top extension conductor 251 and a top second conductive layer 252. The top extension conductor 251 extends from the annular conductor 230 toward an interior of the annular conductor 230, and the top second conductive layer 252 extends from the annular conductor 230 toward an exterior of the annular conductor 230. The bottom conductive material 250' includes a bottom extension conductor 251' and a bottom second conductive layer 252'. The bottom extension conductor 251' extends from the annular conductor 230 toward the interior of the annular conductor 230, and the bottom second conductive layer 252' extends from the annular conductor 230 toward the exterior of the annular conductor 230.

Figure 17A:
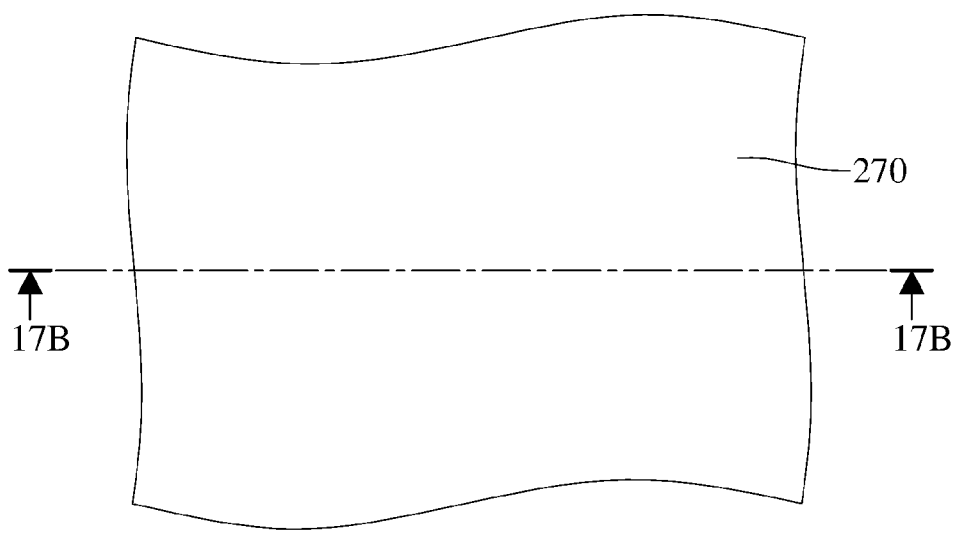
Figure 17B:
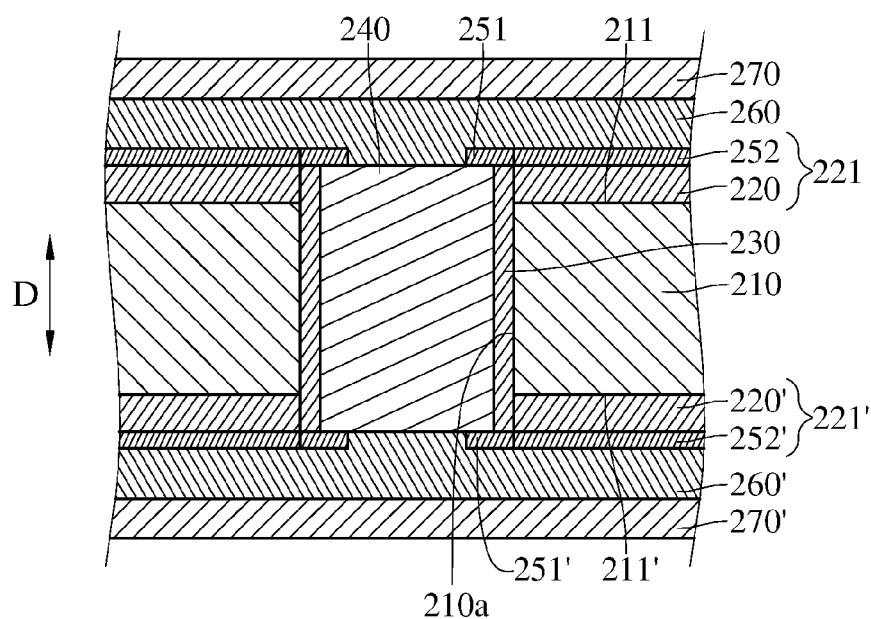

As shown in FIG. 17A and FIG. 17B, a top insulating layer 260 covering the top extension conductor 251, the top second conductive layer 252 and the dielectric element 240 is formed, and a top conductive line material 270 is formed on a surface of the top insulating layer 260. A bottom insulating layer 260' covering the bottom extension conductor 251', the bottom second conductive layer 252' and the dielectric element 240 is formed, and a bottom conductive line material 270' is formed under a surface of the bottom insulating layer 260'.

Figure 18A:
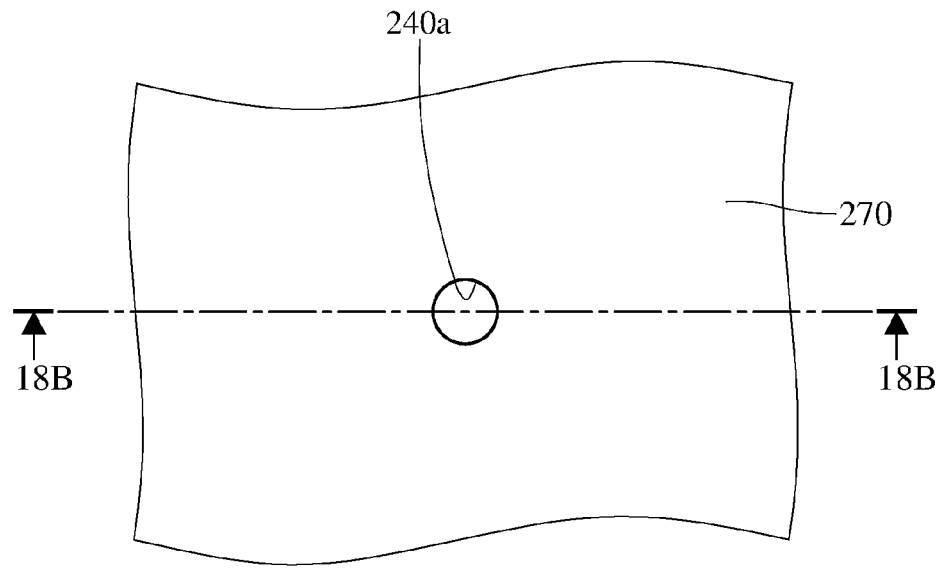
Figure 18B:
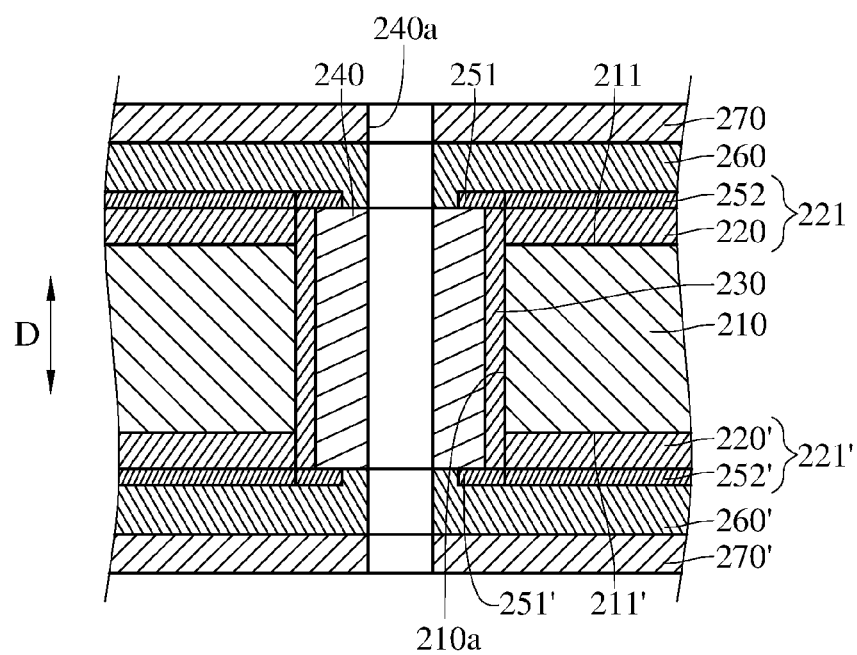

As shown in FIG. 18A and FIG. 18B, a through hole 240a penetrating through the top conductive line material 270, the top insulating layer 260, the dielectric element 240, the bottom insulating layer 260' and the bottom conductive line material 270' is formed. The through hole 240a extends along a direction D and is spaced apart from the top extension conductor 251 and the bottom extension conductor 251'.

Figure 19A:
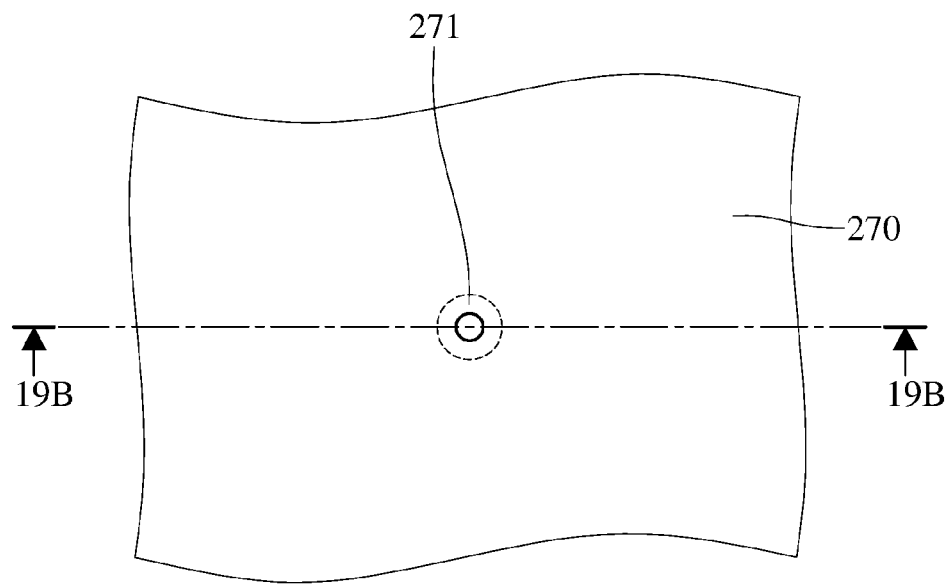
Figure 19B:
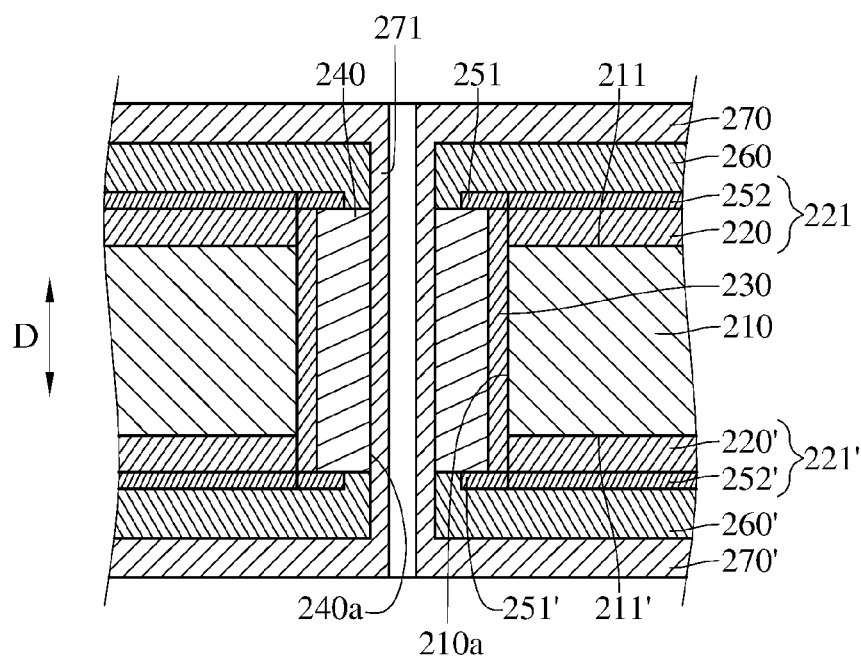

As shown in FIG. 19A and FIG. 19B, a conductive via 271 is formed in the through hole 240a. The conductive via 271 is electrically connected to the top conductive line material 270 and the bottom conductive line material 270'. As the through hole 240a extends along the direction D, the conductive via 271 also extends along the direction D.

Figure 20A:
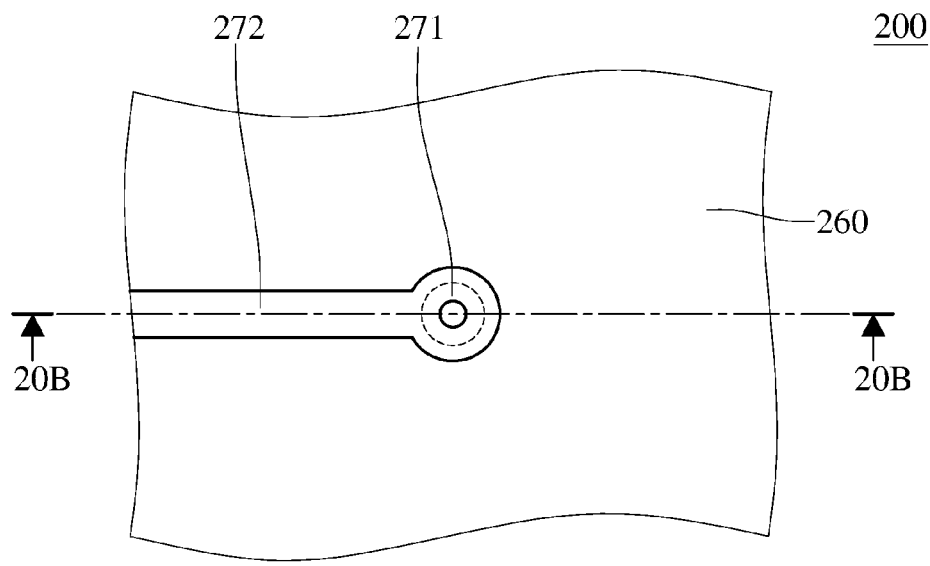
Figure 20B:
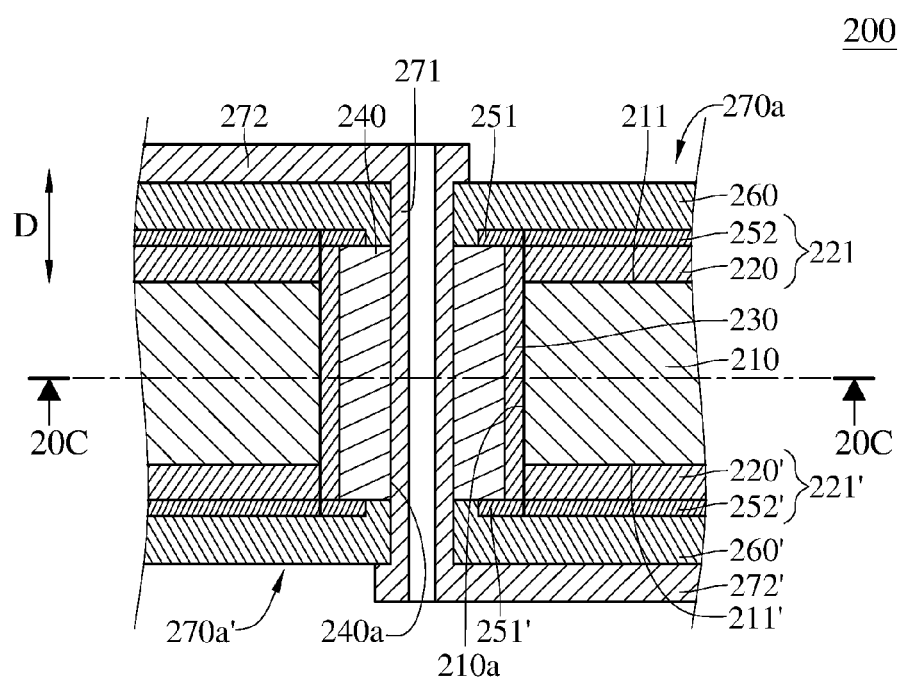

As shown in FIG. 20A and FIG. 20B, the top conductive line material 270 in FIG. 19B is patterned by the top opening 270a to form a top conductive line 272. The bottom conductive line material 270' in FIG. 19B is patterned by the bottom opening 270a' to form a bottom conductive line 272'.

Figure 20C:
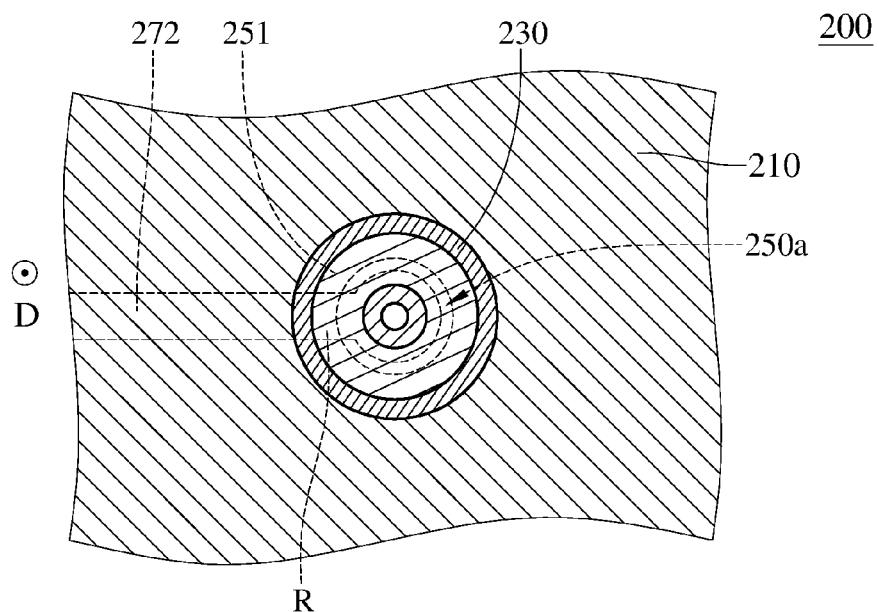
FIG. 20C is a cross-sectional view of the circuit structure along a line 20C-20C in FIG. 20B.

Please refer to FIG. 20C. FIG. 20C is a cross-sectional view of the circuit structure along a line 20C-20C in FIG. 20B. The shape of the top extension conductor 251 is a ring. At least a part of an orthogonal projection of the top extension conductor 251 and at least a part of an orthogonal projection of the top conductive line 272 on the core substrate 210 are overlapped with each other to form an overlapped area R.

Figure 21:
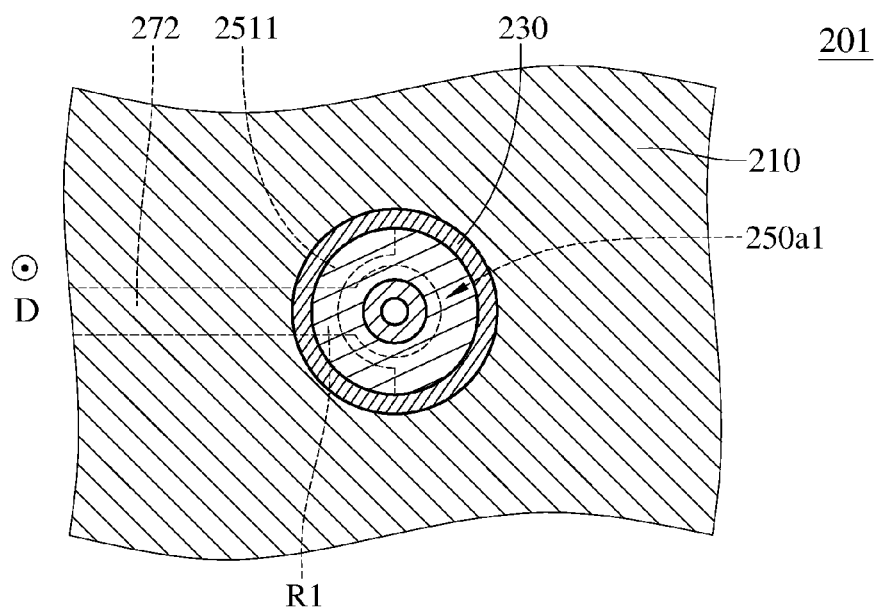
FIG. 21 is a cross-sectional view of a circuit structure according to a fourth embodiment of the disclosure.

Please refer to FIG. 21. FIG. 21 is a cross-sectional view of a circuit structure according to a fourth embodiment of the disclosure. The circuit structure 201 in the fourth embodiment is similar to the circuit structure 200 in the third embodiment. The differences between the circuit structure 201 and the circuit structure 200 are that the shape and the size of a top opening 250a1 in the circuit structure 201 are different from the shape and the size of the top opening 250a in the circuit structure 200, and therefore, the shape and the size of a top extension conductor 2511 in the circuit structure 201 are different from the shape and the size of the top extension conductor 251 in the circuit structure 200. In this embodiment, the top opening 250a1 in the circuit structure 201 is greater than the top opening 250a in the circuit structure 200 so that the shape of the top extension conductor 2511 is a fan having a 180 degrees included angle. At least a part of an orthogonal projection of the top extension conductor 2511 and at least a part of an orthogonal projection of the top conductive line 272 on the core substrate 210 are overlapped with each other to form an overlapped area R1. The overlapped area R1 is located at a central part of the top extension conductor 2511.

Figure 22:
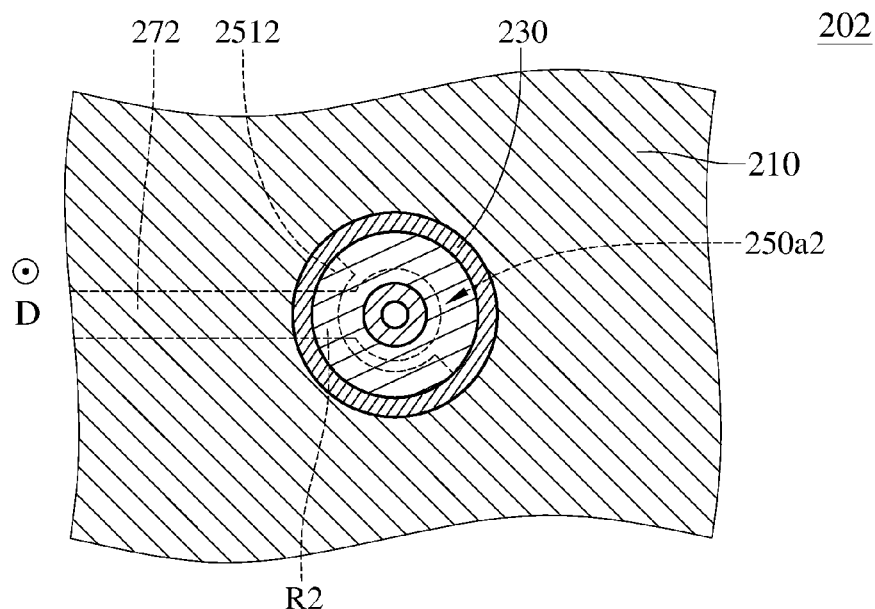
FIG. 22 is a cross-sectional view of a circuit structure according to a fifth embodiment of the disclosure.

Please refer to FIG. 22. FIG. 22 is a cross-sectional view of a circuit structure according to a fifth embodiment of the disclosure. The circuit structure 202 in the fifth embodiment is similar to the circuit structure 201 in the fourth embodiment. The difference between the circuit structure 202 and the circuit structure 201 is that the location of a top opening 250a2 in the circuit structure 202 is different from the location of the top opening 250a1 in the circuit structure 201, and therefore, the location of a top extension conductor 2512 in the circuit structure 202 is different from the location of the top extension conductor 2511 in the circuit structure 201. At least a part of an orthogonal projection of the top extension conductor 2512 and at least a part of an orthogonal projection of the top conductive line 272 on the core substrate 210 are overlapped with each other to form an overlapped area R2. The overlapped area R2 is located at a peripheral part of the top extension conductor 2512.

Figure 23:
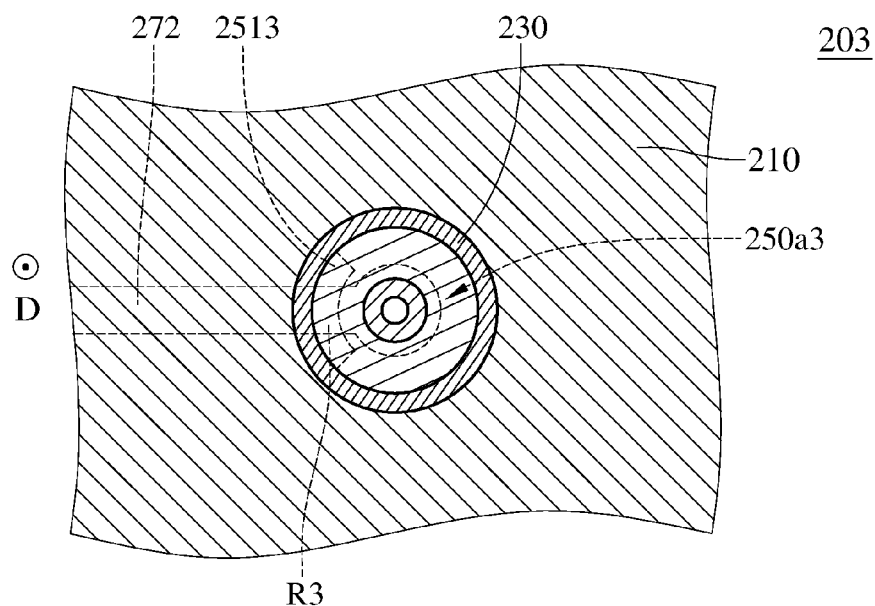
FIG. 23 is a cross-sectional view of a circuit structure according to a sixth embodiment of the disclosure.

Please refer to FIG. 23. FIG. 23 is a cross-sectional view of a circuit structure according to a sixth embodiment of the disclosure. The circuit structure 203 in the sixth embodiment is similar to the circuit structure 201 in the fourth embodiment. The difference between the circuit structure 203 and the circuit structure 201 is that the size of a top opening 250a3 in the circuit structure 203 is different from the size of the top opening 250a1 in the circuit structure 201, and therefore, the size of a top extension conductor 2513 in the circuit structure 203 is different from the size of the top extension conductor 2511 in the circuit structure 201. In this embodiment, the top opening 250a3 in the circuit structure 203 is greater than the top opening 250a1 in the circuit structure 201 so that the shape of the top extension conductor 2513 is a fan having a 90 degrees included angle. At least a part of an orthogonal projection of the top extension conductor 2513 and at least a part of an orthogonal projection of the top conductive line 272 on the core substrate 210 are overlapped with each other to form an overlapped area R3. The overlapped area R3 is located at a central part of the top extension conductor 2513.

Figure 24A:
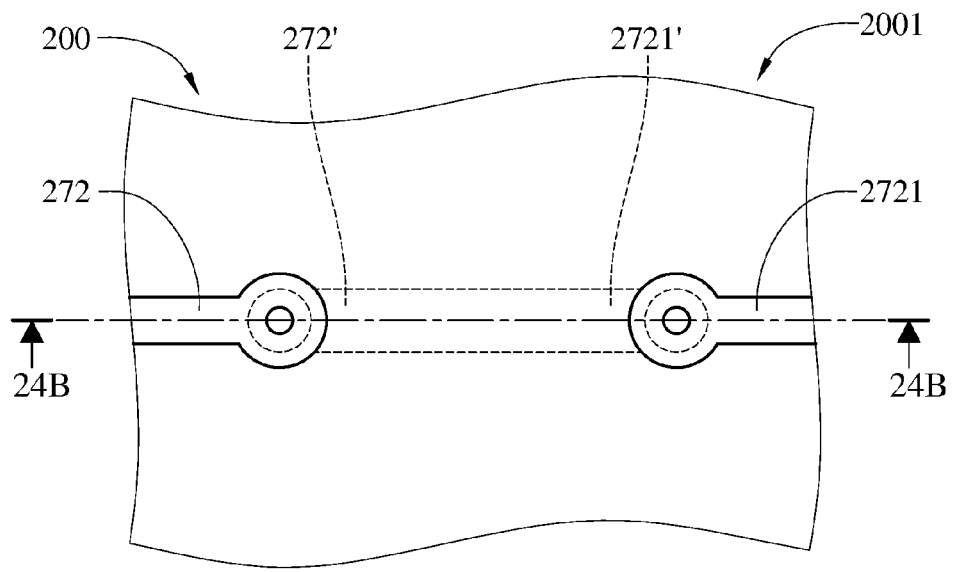
FIG. 24A is a top view of an application of the circuit structure in FIG. 11A.
Figure 24B:
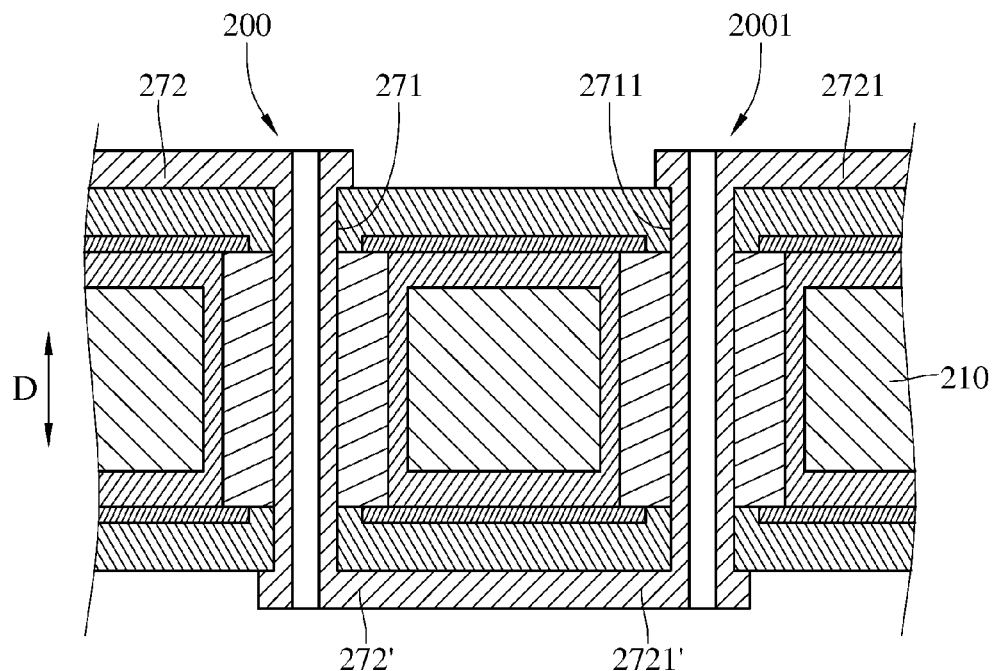
FIG. 24B is a cross-sectional view of the circuit structure along a line 24B-24B in FIG. 24A.

Please refer to FIG. 24A and FIG. 24B. FIG. 24A is a top view of an application of the circuit structure in FIG. 11A. FIG. 24B is a cross-sectional view of the circuit structure along a line 24B-24B in FIG. 24A. When manufacturing the circuit structure 200 on the core substrate 210, a circuit structure 2001 which is similar to the circuit structure 200 is manufactured on the same core substrate 210 at the same time. The differences between the circuit structure 200 and the circuit structure 2001 are that the pattern arrangement of the top conductive line 272, 2721 are different, and the pattern arrangement of the bottom conductive line 272', 2721' are different. Moreover, the bottom conductive line 272' of the circuit structure 200 is electrically connected to the bottom conductive line 2721' of the circuit structure 2001 so that the circuit structure 200 and the circuit structure 2001 are in series connection. Therefore, an electrical signal is transmitted from the top conductive line 272 to the bottom conductive line 272' through the conductive via 271 in the circuit structure 200, and then the electrical signal from the bottom conductive line 272' is transmitted from the bottom conductive line 2721' to the top conductive line 2721 through the conductive via 2711 in the circuit structure 2001, and thereby, the user is free to use the circuit structure 200 in the circuit design.

Figure 25A:
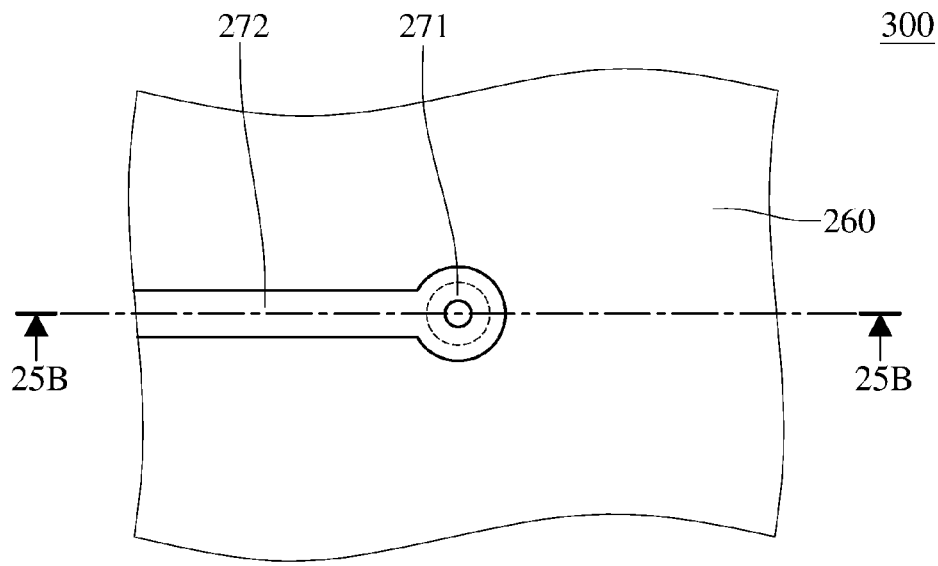
FIG. 25A is a top view of a circuit structure according to a seventh embodiment of the disclosure.
Figure 25B:
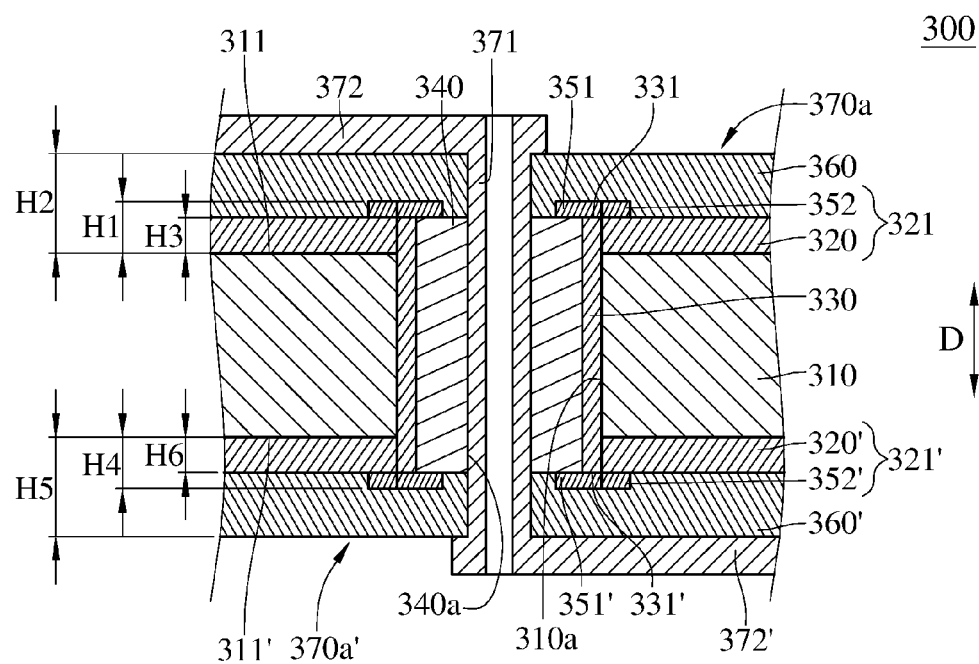
FIG. 25B is a cross-sectional view of the circuit structure along a line 25B-25B in FIG. 25A.
Figure 26A:
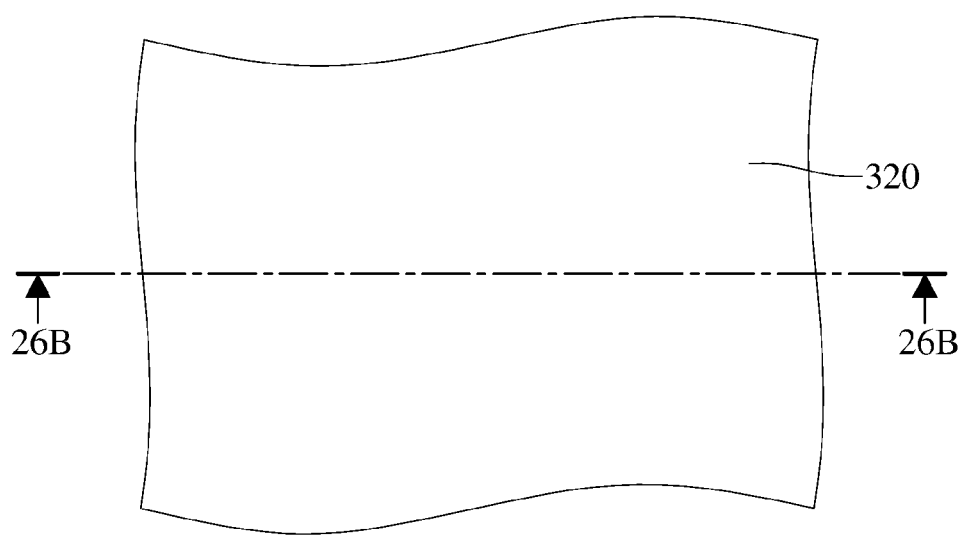
FIG. 26A, FIG. 27A, FIG. 28A, FIG. 29A, FIG. 30A, FIG. 31A, FIG. 32A, FIG. 33A and FIG. 34A are top views of the circuit structure in FIG. 25A at different manufacturing steps.
Figure 26B:
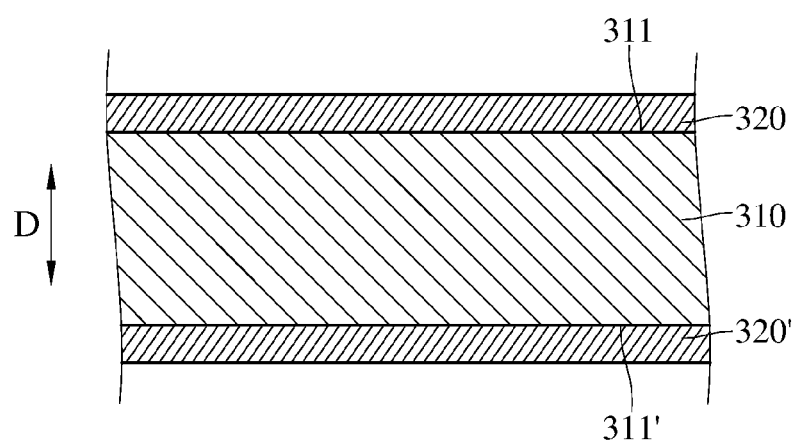
FIG. 26B, FIG. 27B, FIG. 28B, FIG. 29B, FIG. 30B, FIG. 31B, FIG. 32B, FIG. 33B and FIG. 34B are cross-sectional views of the circuit structure in FIG. 25B at different manufacturing steps.
Figure 27A:
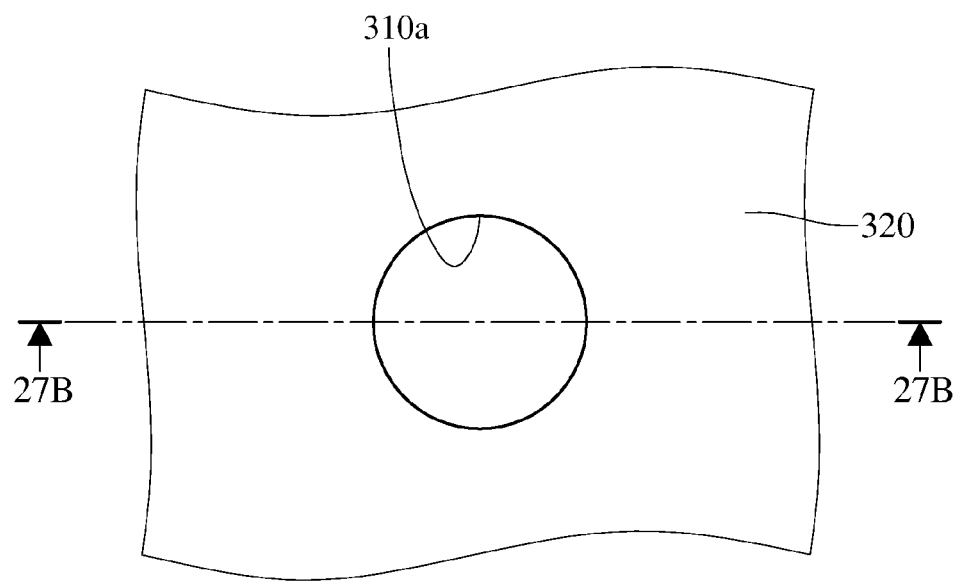
Figure 27B:
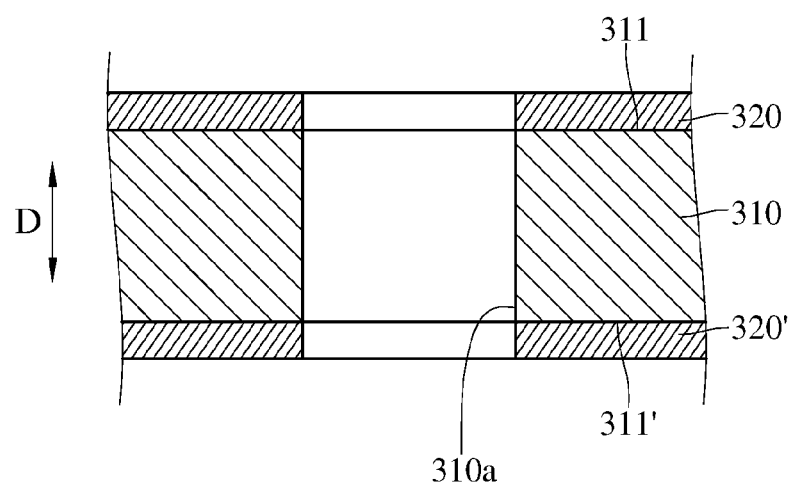
Figure 28A:
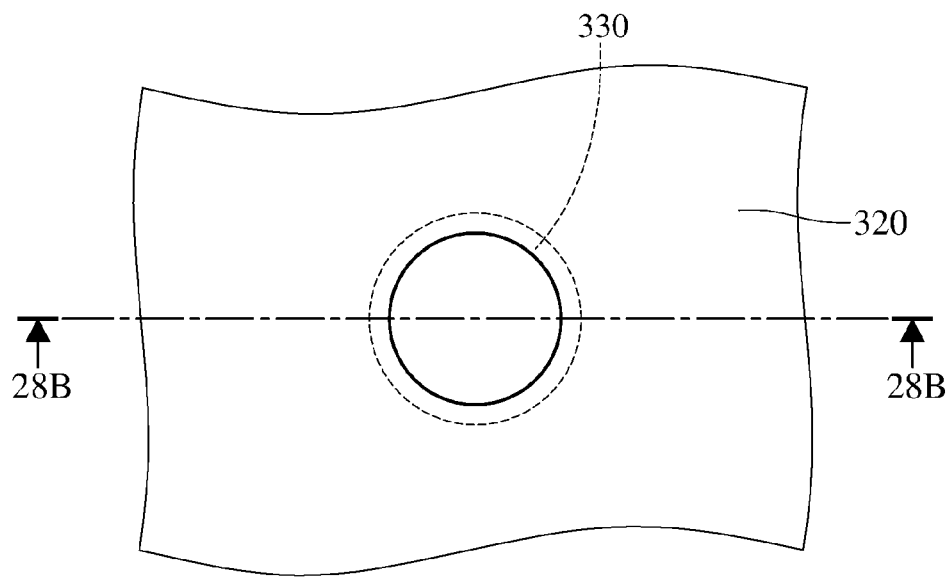
Figure 28B:
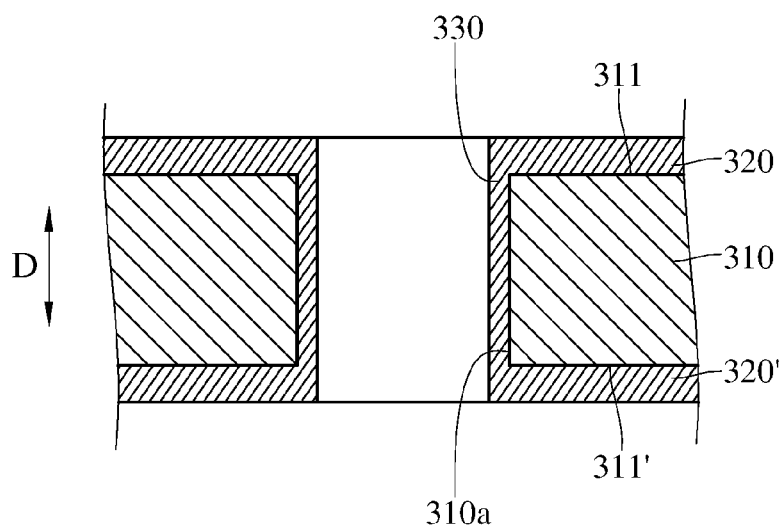
Figure 29A:
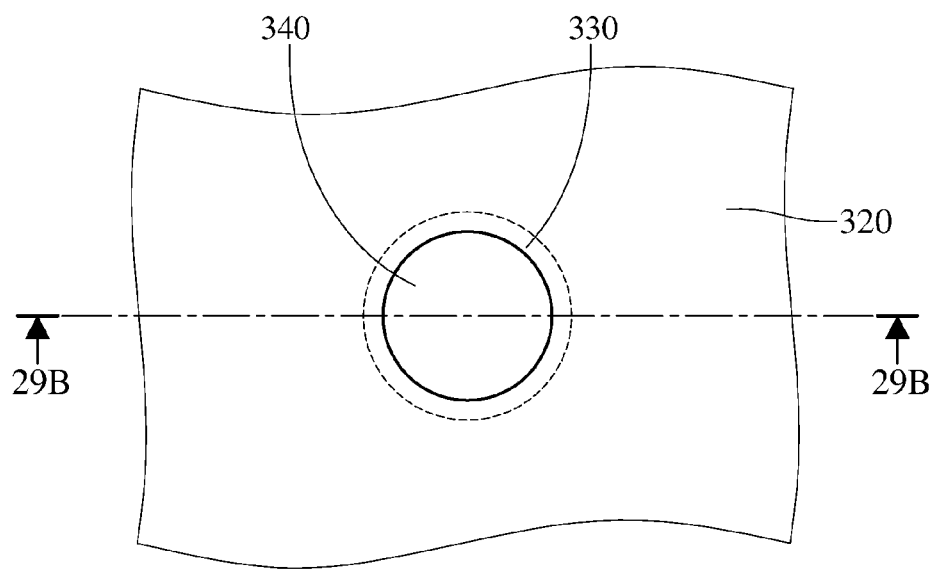
Figure 29B:
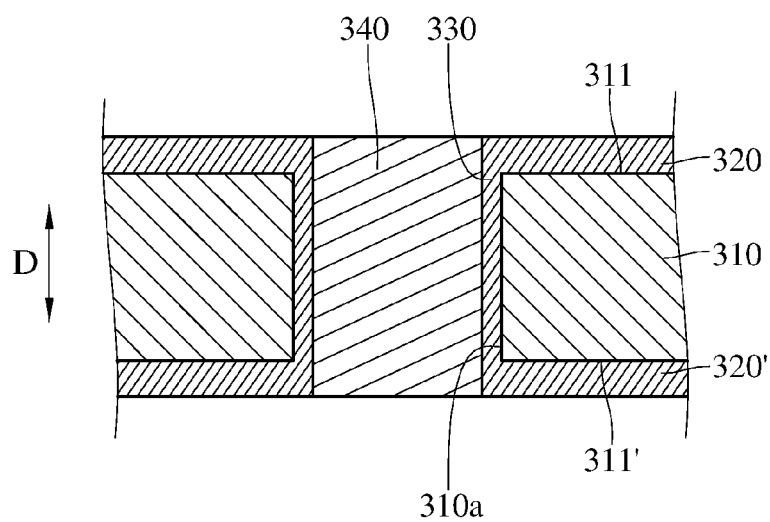

Please refer to FIG. 25A and FIG. 25B. FIG. 25A is a top view of a circuit structure according to a seventh embodiment of the disclosure. FIG. 25B is a cross-sectional view of the circuit structure along a line 25B-25B in FIG. 25A. In the seventh embodiment, the circuit structure 300 includes a core substrate 310, a top conductive layer 321, a bottom conductive layer 321', an annular conductor 330, a dielectric element 340, a top extension conductor 351, a bottom extension conductor 351', a top insulating layer 360, a bottom insulating layer 360', a conductive via 371, a top conductive line 372 and a bottom conductive line 372'.

The circuit structure 300 is similar to the circuit structure 200. The core substrate 310 includes a top surface 311, a bottom surface 311' and a through hole 310a extending along a direction D. The annular conductor 330 is disposed on a sidewall of the through hole 310a. The conductive via 371 extending along the direction D is located in the annular conductor 330 and disposed on a sidewall of the through hole 340a. The dielectric element 340 is disposed between the conductive via 371 and the annular conductor 330. The top extension conductor 351 is electrically connected to a top end 331 of the annular conductor 330 and extends toward the conductive via 371. The top extension conductor 351 is electrically insulated from the conductive via 371. The bottom extension conductor 351' is electrically connected to a bottom end 331' of the annular conductor 330 and extends toward the conductive via 371. The bottom extension conductor 351' is electrically insulated from the conductive via 371. Taking the top surface 311 of the core substrate 310 as a reference plane, a height H1 of the top extension conductor 351 is less than a height H2 of the conductive via 371. Moreover, taking the bottom surface 311' of the core substrate 310 as a reference plane, a height H4 of the bottom extension conductor 351' is less than a height H5 of the conductive via 371.

The top conductive layer 321 can be a stacking structure including a top first conductive layer 320 and a top second conductive layer 352 stacking on the top first conductive layer 320. The top first conductive layer 320 is located on the top surface 311 of the core substrate 310 and electrically connected to the top end 331 of the annular conductor 330. The top second conductive layer 352 is located on the top first conductive layer 320 and electrically connected to the top end 331 of the annular conductor 130 and the top extension conductor 351. The bottom conductive layer 321' van be a stacking structure including a bottom first conductive layer 320' and a bottom second conductive layer 352' stacking on the bottom first conductive layer 120'. The bottom first conductive layer 320' is located under the bottom surface 311' of the core substrate 310 and electrically connected to the bottom end 331' of the annular conductor 330. The bottom second conductive layer 352' is located under the bottom first conductive layer 320' and electrically connected to the bottom end 331' of the annular conductor 330 and the bottom extension conductor 351'. The top insulating layer 360 is disposed on a surface of the top conductive layer 321, and the top conductive layer 321, the top extension conductor 351 and the dielectric element 340 are covered by the top insulating layer 360. The bottom insulating layer 360' is disposed on a surface of the bottom conductive layer 321', and the bottom conductive layer 321', the bottom extension conductor 351' and the dielectric element 340 are covered by the bottom insulating layer 360'. The top conductive line 372 is disposed on a surface of the top insulating layer 360 and electrically connected to the conductive via 371. The bottom conductive line 372' is disposed under a surface of the bottom insulating layer 360' and electrically connected to the conductive via 371. A top opening 370a is suitable for patterning the top conductive line 372, and a bottom opening 370a' is suitable for patterning the bottom conductive line 372'.

However, in the seventh embodiment, an area of the top second conductive layer 352 is less or even much less than an area of the top first conductive layer 320, and an area of the bottom second conductive layer 352' is less or even much less than an area of the bottom first conductive layer 320'. Therefore, taking the top surface 311 of the core substrate 310 as a reference plane, a height H3 of a part of a top conductive via 371 is less than a height H1 of the top extension conductor 351. Taking the bottom surface 311' of the core substrate 310 as a reference plane, a height H6 of a part of the bottom conductive layer 321' is less than a height H4 of the bottom extension conductor 351'.

The following describes a manufacturing process of the circuit structure 300; please refer to FIG. 26A to FIG. 34B. FIG. 26A, FIG. 27A, FIG. 28A, FIG. 29A, FIG. 30A, FIG. 31A, FIG. 32A, FIG. 33A and FIG. 34A are top views of the circuit structure in FIG. 25A at different manufacturing steps. FIG. 26B, FIG. 27B, FIG. 28B, FIG. 29B, FIG. 30B, FIG. 31B, FIG. 32B, FIG. 33B and FIG. 34B are cross-sectional views of the circuit structure in FIG. 25B at different manufacturing steps. The manufacturing steps of the circuit structure 300 in FIG. 26A to FIG. 29A and FIG. 26B to FIG. 29B are similar to the manufacturing steps of the circuit structure 100 in FIG. 2A to FIG. 5A and FIG. 2B to FIG. 5B so that the manufacturing steps of the circuit structure 300 in FIG. 26A to FIG. 29A and FIG. 26B to FIG. 29B are not repeated hereafter.

Figure 30A:
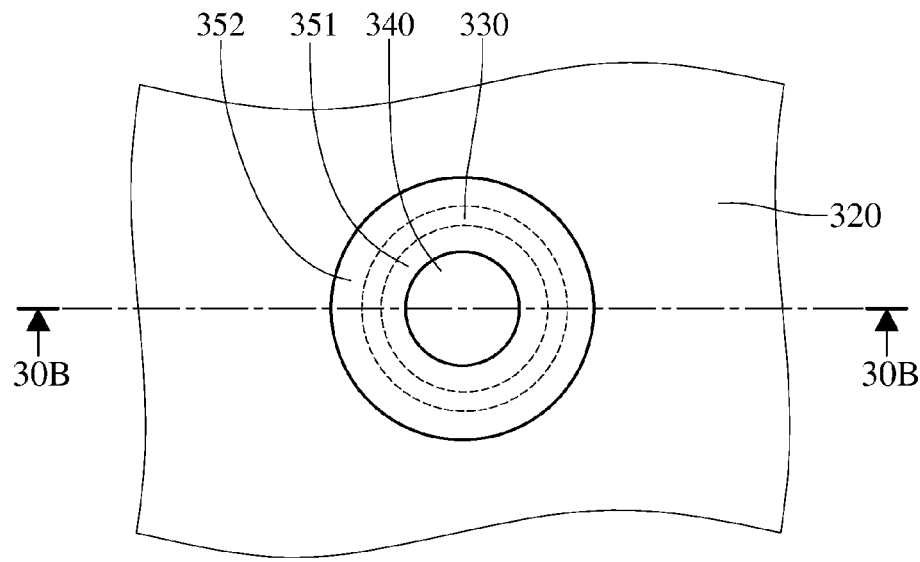
Figure 30B:
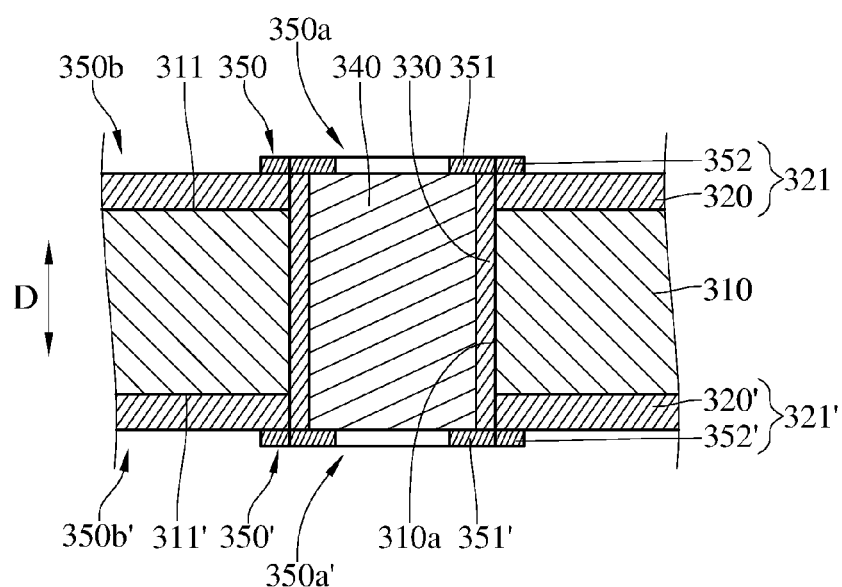

As shown in FIG. 30A and FIG. 30B, a top conductive material 350 on an area of a top first conductive layer 320 around a dielectric element 340 and the dielectric element 340 is formed. A bottom conductive material 350' on an area of a bottom first conductive layer 320' around the dielectric element 340 and the dielectric element 340 is formed. Then, a top opening 350a is formed on the top conductive material 350, and a bottom opening 350a' is formed on the bottom conductive material 350'; and therefore, a part of a top side and a part of a bottom side of the dielectric element 340 are exposed in the top opening 350a and the bottom opening 350a', respectively. In addition, the top first conductive layer 320 is exposed in a top opening 350b on the top conductive material 350, and the bottom first conductive layer 320' is exposed in a bottom opening 350b' on the bottom conductive material 350'. The top conductive material 350 and the bottom conductive material 350', for example, are formed by screen printing, printing or coating. The top conductive material 350 includes a top extension conductor 351 and a top second conductive layer 352 around the top extension conductor 351. The bottom conductive material 350' includes a bottom extension conductor 351' and a bottom second conductive layer 352' around the bottom extension conductor 351'.

Figure 31A:
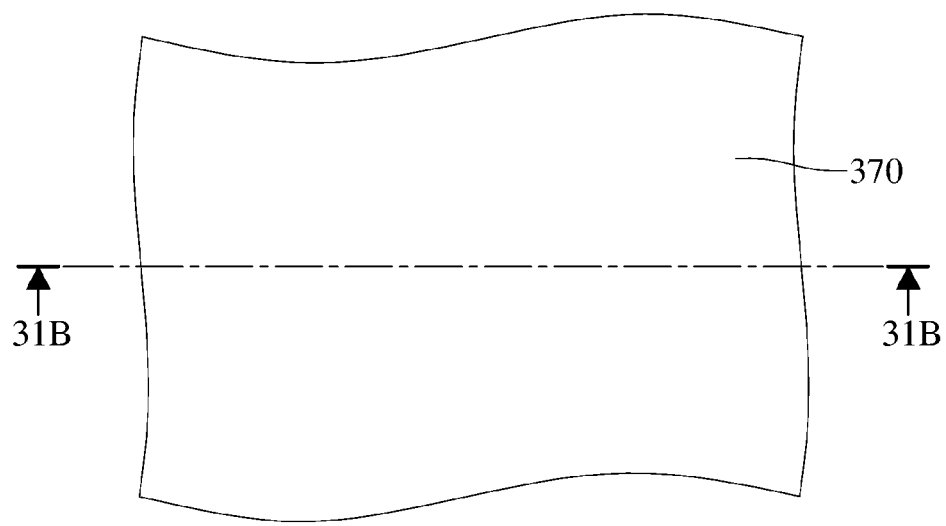
Figure 31B:
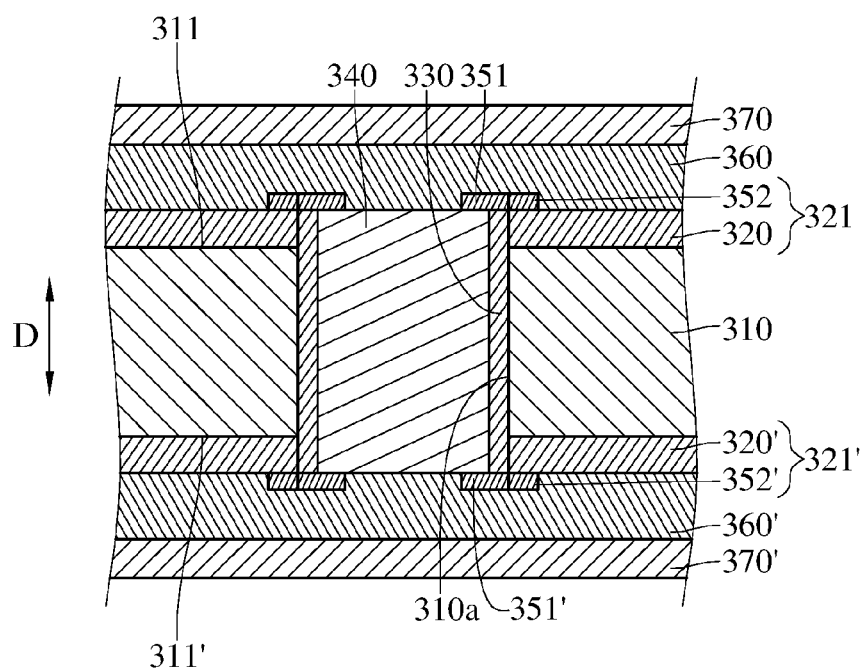

As shown in FIG. 31A and FIG. 31B, a top insulating layer 360 covering the top extension conductor 351, the top second conductive layer 352, the top first conductive layer 320 and the dielectric element 340 is formed, and a top conductive line material 370 is formed on a surface of the top insulating layer 360. A bottom insulating layer 360' covering the bottom extension conductor 351', the bottom second conductive layer 352', the bottom first conductive layer 320' and the dielectric element 340 is formed, and a bottom conductive line material 370' is formed on a surface of the bottom insulating layer 360'.

Figure 32A:
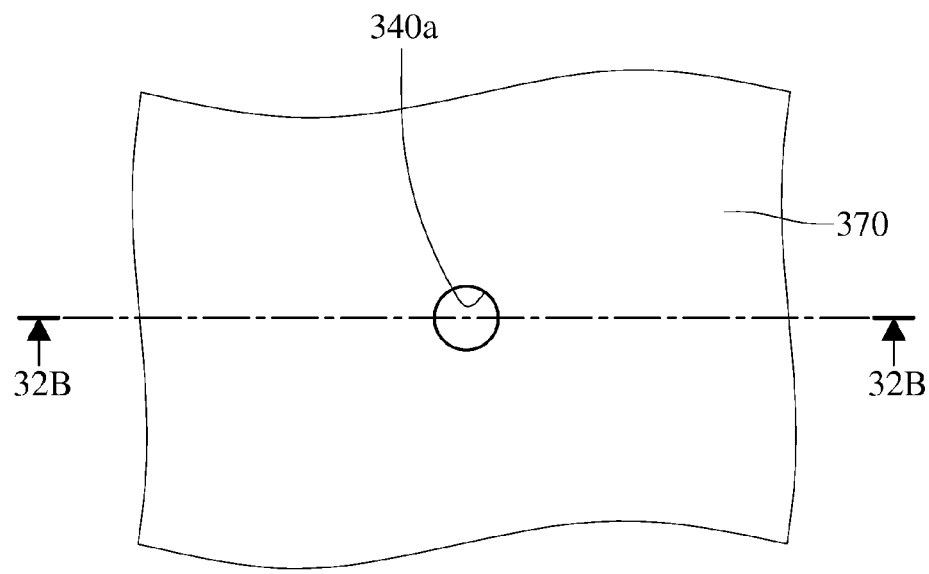
Figure 32B:
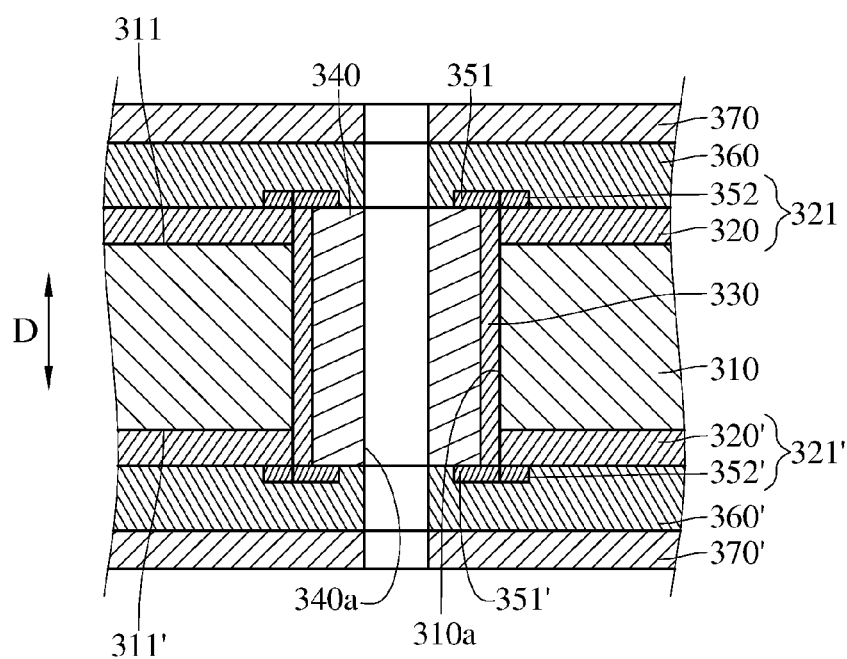

As shown in FIG. 32A and FIG. 32B, a through hole 340a penetrating through the top conductive line material 370, the top insulating layer 360, the dielectric element 340, the bottom insulating layer 360' and the bottom conductive line material 370' is formed. The through hole 340a extends along a direction D and is spaced apart from the top extension conductor 351 and the bottom extension conductor 351'.

Figure 33A:
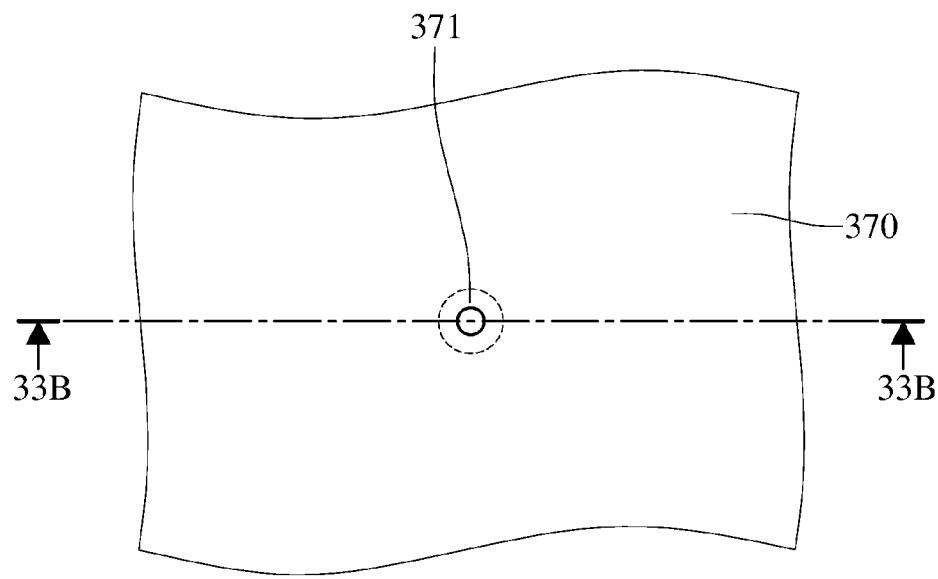
Figure 33B:
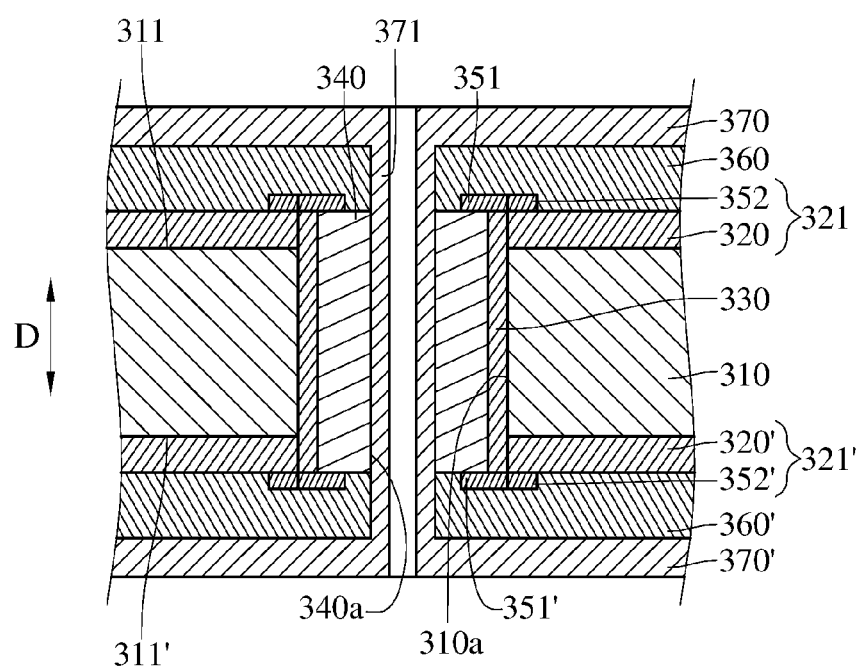

As shown in FIG. 33A and FIG. 33B, a conductive via 371 is formed in the through hole 340a. The conductive via 371 is electrically connected to the top conductive line material 370 and the bottom conductive line material 370'. As the through hole 340a extends along the direction D, the conductive via 371 also extends along the direction D.

Figure 34A:
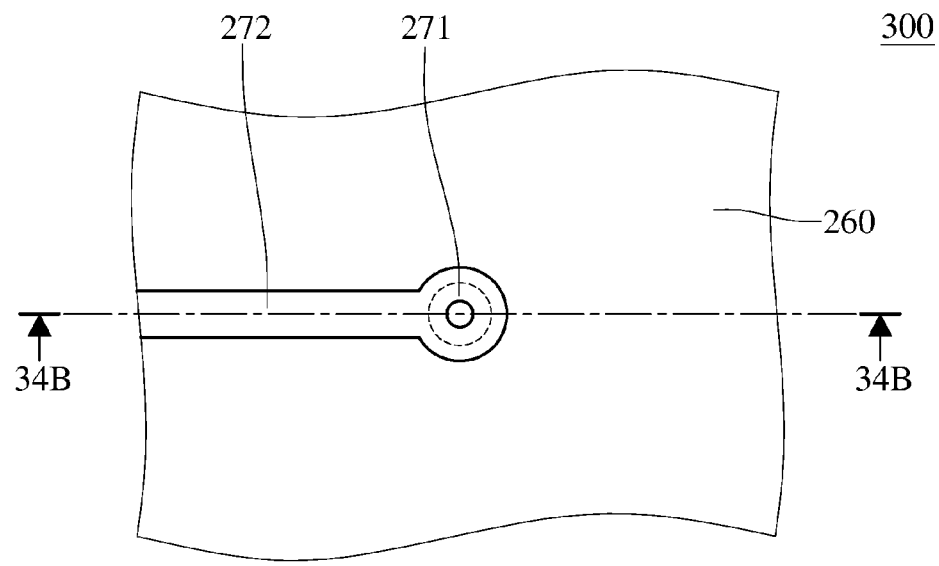
Figure 34B:
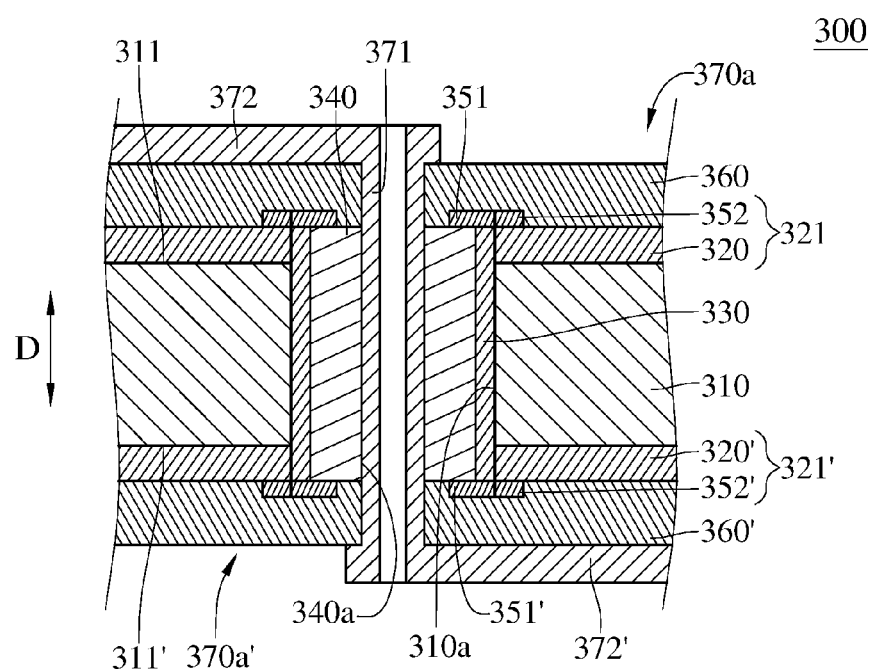

As shown in FIG. 34A and FIG. 34B, the top conductive line material 370 in FIG. 33B is patterned by the top opening 370a to form a top conductive line 372. The bottom conductive line material 370' in FIG. 33B is patterned by the bottom opening 370a' to form a bottom conductive line 372'.

Figure 35:
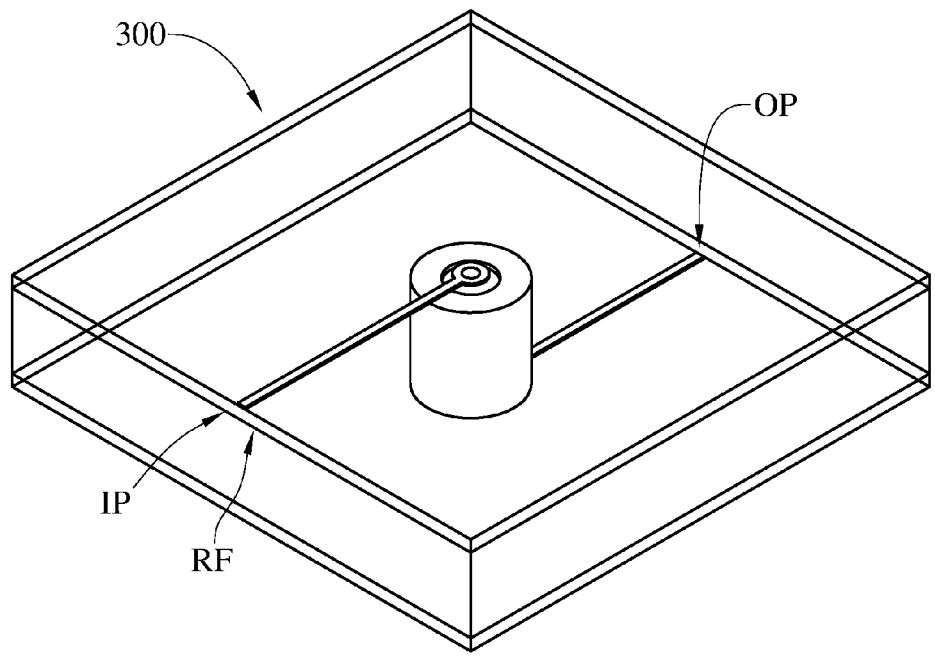
FIG. 35 is a schematic view of a circuit structure for a simulation test.

The following describes a simulation test result of a signal transmitted in the circuit structure 300 in the seventh embodiment of the present disclosure relative to the circuit structure 301, 302. Please refer to FIG. 34B and FIG. 35. FIG. 35 is a schematic view of a circuit structure for a simulation test. The signs of the elements in the following description indicate the signs in FIG. 34B.

An outer diameter of the conductive via 371 at the central region is 304.8 μm, and an outer diameter of regions of the conductive via 371 which are electrically connected to the top conductive line 372 and the bottom conductive line 372' are 508 μm. Inner diameters of the top extension conductor 351 and the bottom extension conductor 351' are both 812.8 μm. An inner diameter of the annular conductor 330 is 1600.2 μm. Lengths of the top conductive line 372 and the bottom conductive line 372' are both 4419.6 μm. A distance between the top conductive layer 321 and the bottom conductive layer 321' is 1727.2 μm. A distance between the top conductive layer 321 and the top conductive line 372 is 71.12 μm. A distance between the bottom conductive layer 321' and the bottom conductive line 372' is 71.12 μm. Impedance of the top conductive line 372 and the bottom conductive line 372' are both 50Ω. A dielectric constant of the dielectric element 340 is 3.94. A reference potential that the top extension conductor 351, the bottom extension conductor 351', the top conductive layer 321, the bottom conductive layer 321' and the annular conductor 330 are electrically connected to is the ground potential.

During the simulation test of a simulated circuit structure, a step wave signal is input from a IP location on the top conductive line 372 in FIG. 35, and an output signal passing through the simulated circuit structure is received from a OP location on the bottom conductive line 372' in FIG. 35, and a reflection signal in the simulated circuit structure is received from a RF location on the top conductive line 372 in FIG. 35. In addition, an impedance which the step wave signal meted during transmitting in the simulated circuit structure is also simulated.

Figure 36:
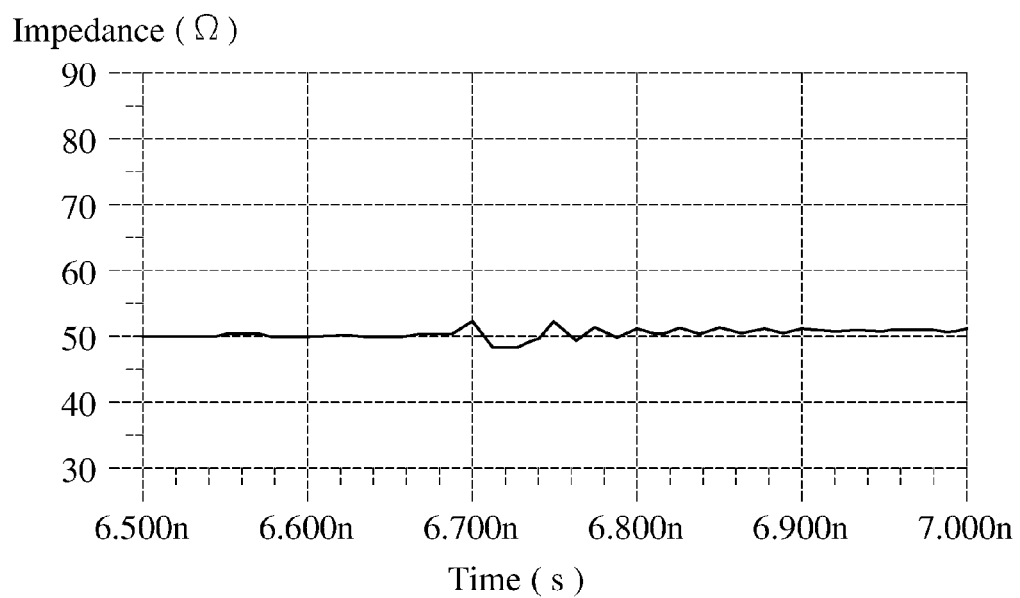
FIG. 36 is a graphical representation of impedance versus time curve of the circuit structure in FIG. 35 as inputting a step wave signal from IP.

Please refer to FIG. 36. FIG. 36 is a graphical representation of impedance versus time curve of the circuit structure in FIG. 35 as inputting a step wave signal from IP. In about 6.680 nanoseconds (nsec) after inputting the step wave signal, the step wave signal passes the top conductive line 372 and is reflected back to the IP location, and the impedance is maintained at about 50Ω with a slight variation range. In about 6.680 nsec to 6.800 nsec after inputting the step wave signal, a reflection signal of the step wave signal passing the conductive via 371 is reflected back to the IP location. Because the top extension conductor 351, the annular conductor 330 and the bottom extension conductor 351' form a uniform electric field, the impedance is maintained between 45Ω and 55Ω as a light variation range, and the variation range is within plus or minus ten percent from 50Ω. An impedance variation derived from a reflection signal received at about 6.700 nsec after inputting the step wave signal is an impedance variation when the step wave signal is at the connecting area of the top conductive line 372 and the conductive via 371, and the impedance is slightly increased to about 55Ω or below 55Ω. An impedance variation derived from a reflection signal received at about 6.750 nsec after inputting the step wave signal is an impedance variation when the step wave signal is at the connecting area of the conductive via 371 and the bottom conductive line 372', and the impedance is slightly increased to about 55Ω or below 55Ω. An impedance variation derived from a reflection signal received at about 6.800 nsec after inputting the step wave signal shows that the step wave signal passes the bottom conductive line, and the impedance is about 50Ω with the impedance variation range reduced.

Figure 37:
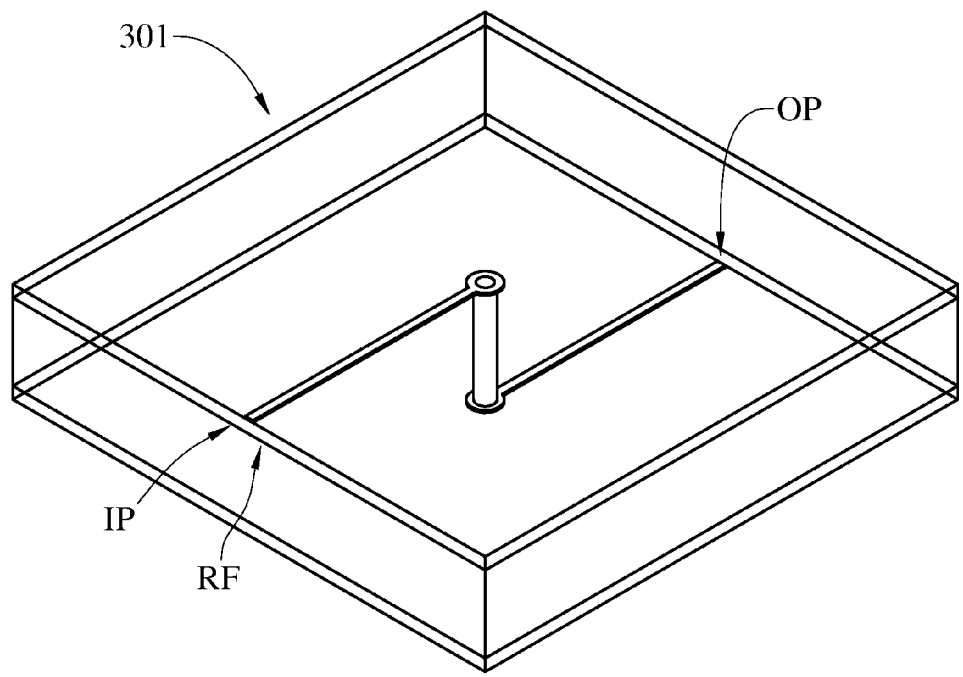
FIG. 37 is a schematic view of a circuit structure for simulation test.

Please refer to FIG. 37. FIG. 37 is a schematic view of a circuit structure for simulation test. The difference between the circuit structure 300 and the circuit structure 301 in FIG. 37 is that the top extension conductor 351, the annular conductor 330 and the bottom extension conductor 351' in FIG. 34B are not in the circuit structure 301.

In FIG. 37, an outer diameter of the conductive via at the central region is 304.8 and an outer diameter of regions of the conductive via which are electrically connected to the top conductive line and the bottom conductive line are 508 μm. Lengths of the top conductive line and the bottom conductive line are both 4419.6 μm. A distance between the top conductive layer and the bottom conductive layer is 1727.2 μm. A distance between the top conductive layer and the top conductive line is 71.12 μm. A distance between the bottom conductive layer and the bottom conductive line is 71.12 μm. Impedance of the top conductive line and the bottom conductive line are both 50Ω. A dielectric constant of the dielectric element is 3.94. A reference potential that the top conductive layer and the bottom conductive layer are electrically connected to is the ground potential.

During the simulation test of a simulated circuit structure, a step wave signal is input from a IP location on the top conductive line in FIG. 37, and an output signal passing through the simulated circuit structure is received from a OP location on the bottom conductive line in FIG. 37, and a reflection signal in the simulated circuit structure is received from a RF location, which is the same location as the IP location, on the top conductive line in FIG. 37. In addition, an impedance which the step wave signal meted during transmitting in the simulated circuit structure is also simulated.

Figure 38:
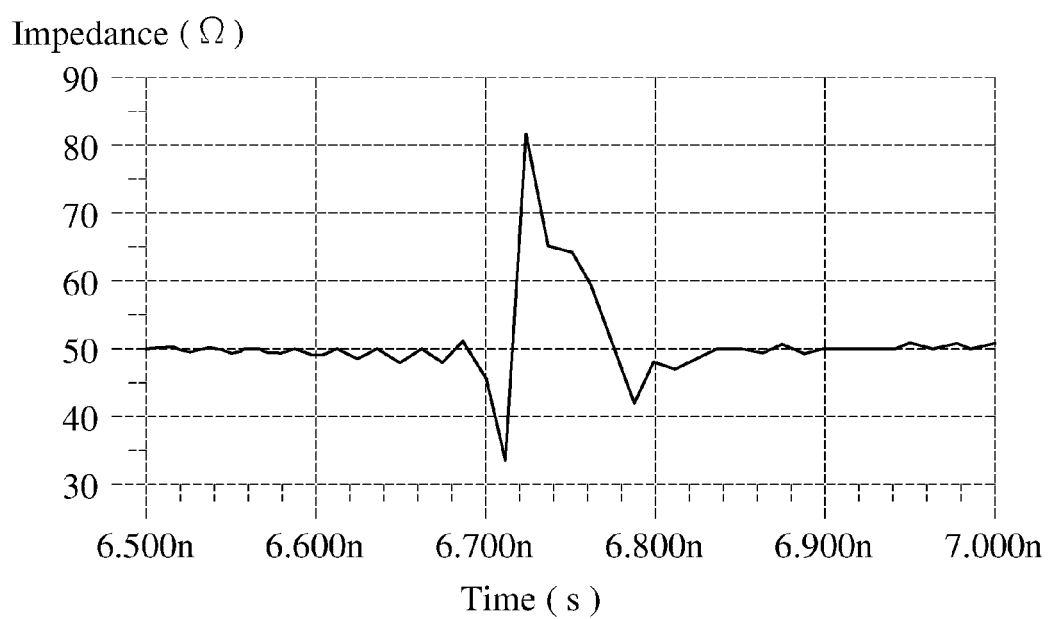
FIG. 38 is a graphical representation of impedance versus time curve of the circuit structure in FIG. 37 as inputting a step wave signal from IP.

Please refer to FIG. 38. FIG. 38 is a graphical representation of impedance versus time curve of the circuit structure in FIG. 37 as inputting a step wave signal from IP. In about 6.680 nanoseconds (nsec) after inputting the step wave signal, the step wave signal passes the top conductive line and is reflected back to the IP location, and the impedance is maintained at about 50Ω with a slight variation range. In about 6.680 nsec to 6.800 nsec after inputting the step wave signal, a reflection signal of the step wave signal passing the conductive via is reflected back to the IP location. Because the electric field which the step wave signal passes is not uniform, the variation range of the impedance is increased, and the impedance is about between 30Ω and 85Ω as a light variation range, and the variation range is within plus seventy percent to minus forty percent from 50Ω. An impedance variation derived from a reflection signal received at about 6.800 nsec after inputting the step wave signal shows that the step wave signal passes the bottom conductive line, and the impedance is about 50Ω with the variation range reduced.

Figure 39:
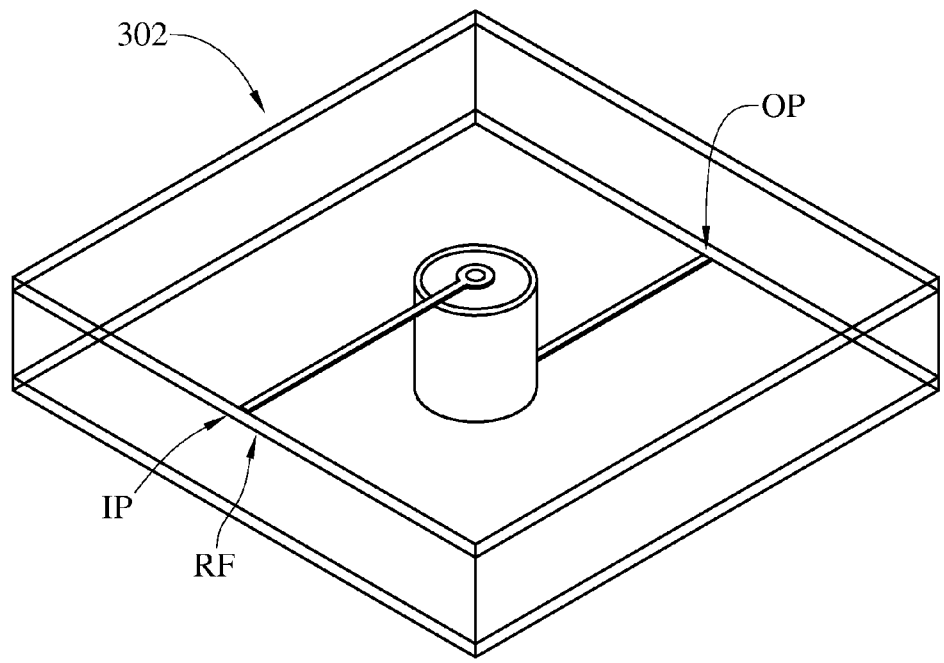
FIG. 39 is a schematic view of a circuit structure for simulation test.

Please refer to FIG. 39. FIG. 39 is a schematic view of a circuit structure for simulation test. The difference between the circuit structure 300 and the circuit structure 302 in FIG. 39 is that the top extension conductor 351 and the bottom extension conductor 351' in FIG. 34B are not in the circuit structure 302.

In FIG. 39, an outer diameter of the conductive via at the central region is 304.8 µm, and an outer diameter of regions of the conductive via which are electrically connected to the top conductive line and the bottom conductive line are 508 µm. An inner diameter of the annular conductor is 1600.2 µm. Lengths of the top conductive line and the bottom conductive line are both 4419.6 µm. A distance between the top conductive layer and the bottom conductive layer is 1727.2 µm. A distance between the top conductive layer and the top conductive line is 71.12 µm. A distance between the bottom conductive layer and the bottom conductive line is 71.12 µm. Impedance of the top conductive line and the bottom conductive line are both 50Ω. A dielectric constant of the dielectric element is 3.94. A reference potential that the top conductive layer, the bottom conductive layer and the annular conductor are electrically connected to is the ground potential.

During the simulation test of a simulated circuit structure, a step wave signal is input from a IP location on the top conductive line in FIG. 39, and an output signal passing through the simulated circuit structure is received from a OP location on the bottom conductive line in FIG. 39, and a reflection signal in the simulated circuit structure is received from a RF location, which is the same location as the IP location, on the top conductive line in FIG. 39. In addition, an impedance which the step wave signal meted during transmitting in the simulated circuit structure is also simulated.

Figure 40:
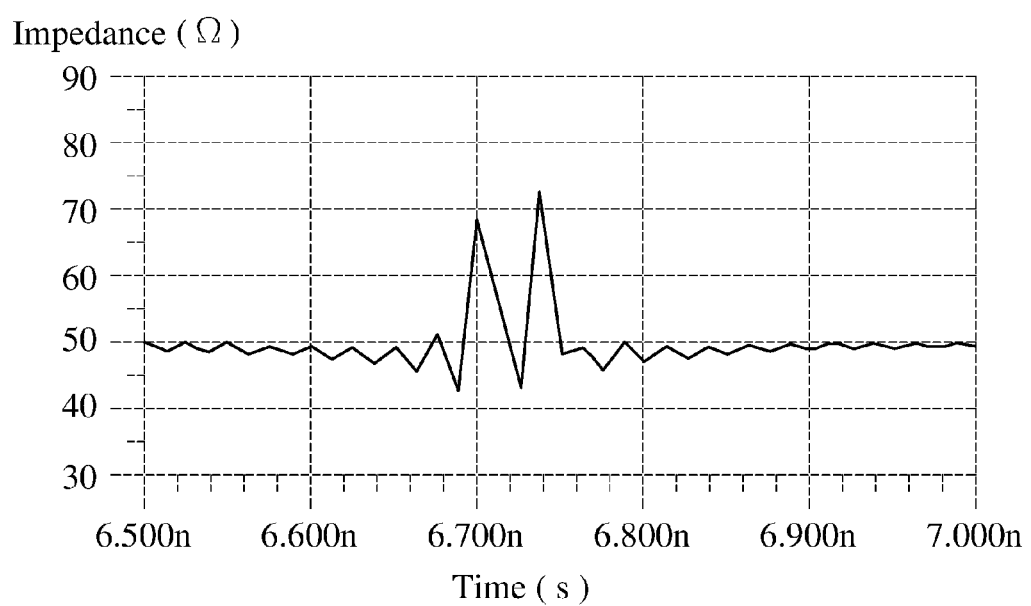
FIG. 40 is a graphical representation of impedance versus time curve of the circuit structure in FIG. 39 as inputting a step wave signal from IP.

Please refer to FIG. 40. FIG. 40 is a graphical representation of impedance versus time curve of the circuit structure in FIG. 39 as inputting a step wave signal from IP. In about 6.680 nanoseconds (nsec) after inputting the step wave signal, the step wave signal passes the top conductive line and is reflected back to the IP location, and the impedance is maintained at about 50Ω. In about 6.680 nsec to 6.780 nsec after inputting the step wave signal, a reflection signal of the step wave signal passing the conductive via is reflected back to the IP location. Because the electric field generated by the annular conductor, the impedance variation is between about 40Ω and 75Ω, and the variation range is within plus fifty percent to minus twenty percent from 50Ω. An impedance variation derived from a reflection signal received at about 6.700 nsec after inputting the step wave signal shows that the step wave signal passes the bottom conductive line, and the impedance is increased to about 70Ω or below 70Ω. An impedance variation derived from a reflection signal received at about 6.740 nsec after inputting the step wave signal is an impedance variation when the step wave signal is at the connecting area of the conductive via and the bottom conductive line, and the impedance is increased to about 75Ω or below 75Ω. An impedance variation derived from a reflection signal received at about 6.800 nsec after inputting the step wave signal shows that the step wave signal passes the bottom conductive line, and the impedance is about 50Ω with the impedance variation reduced.

Figure 41:
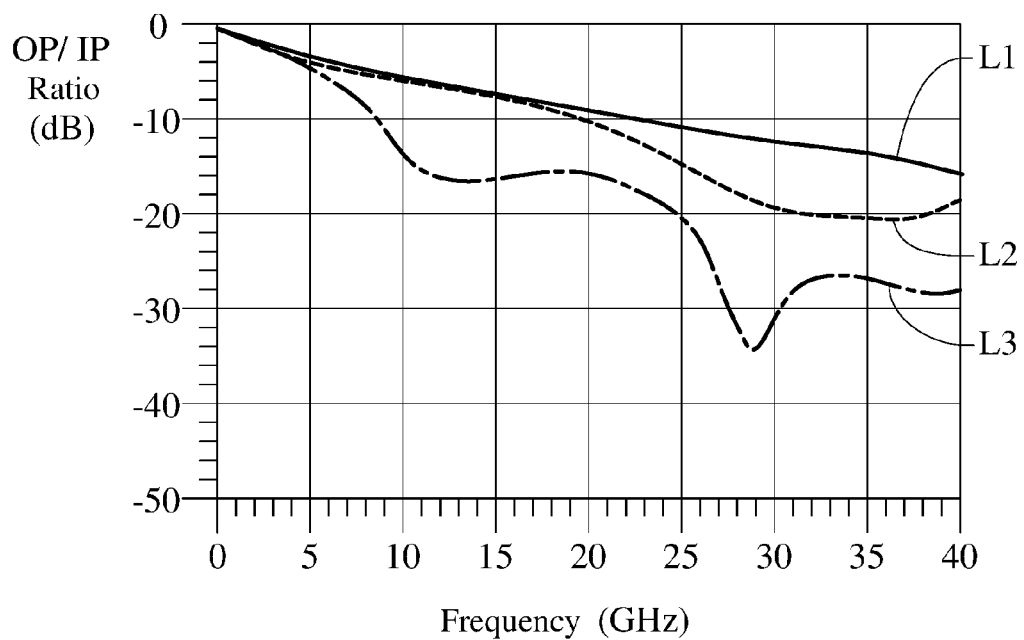
FIG. 41 is a graphical representation of OP/IP ratio versus frequency curves of the circuit structures in FIGS. 35, 37 and 39.

Please refer to FIG. 41. FIG. 41 is a graphical representation of OP/IP ratio versus frequency curves of the circuit structures in FIGS. 35, 37 and 39. When a strength of the output signal is more close to a strength of the input signal, an insertion loss is more close to zero dB. The more the strength of the output signal declined, the more the insertion loss increased. In FIG. 41, the more the insertion loss increased, the more the curve closed to the negative infinity.

In FIG. 41, line L1 represents the insertion loss of the circuit structure 300 in FIG. 35, and line L2 represents the insertion loss of the circuit structure 302 in FIG. 39, and line L3 represents the insertion loss of the circuit structure 301 in FIG. 37. As shown in FIG. 41, when the frequency is increased, the insertion losses of the three circuit structures are increased. However, the circuit structure 300 in FIG. 35 has the smallest insertion loss among the three circuit structures, which means the circuit structure 300 has the best performance among the three circuit structures. The circuit structure 302 in FIG. 39 has the medium insertion loss among the three circuit structures. The circuit structure 301 in FIG. 37 has the highest insertion loss among the three circuit structures, which means the circuit structure 301 has the most serious insertion loss problem among the three circuit structures.

Figure 42:
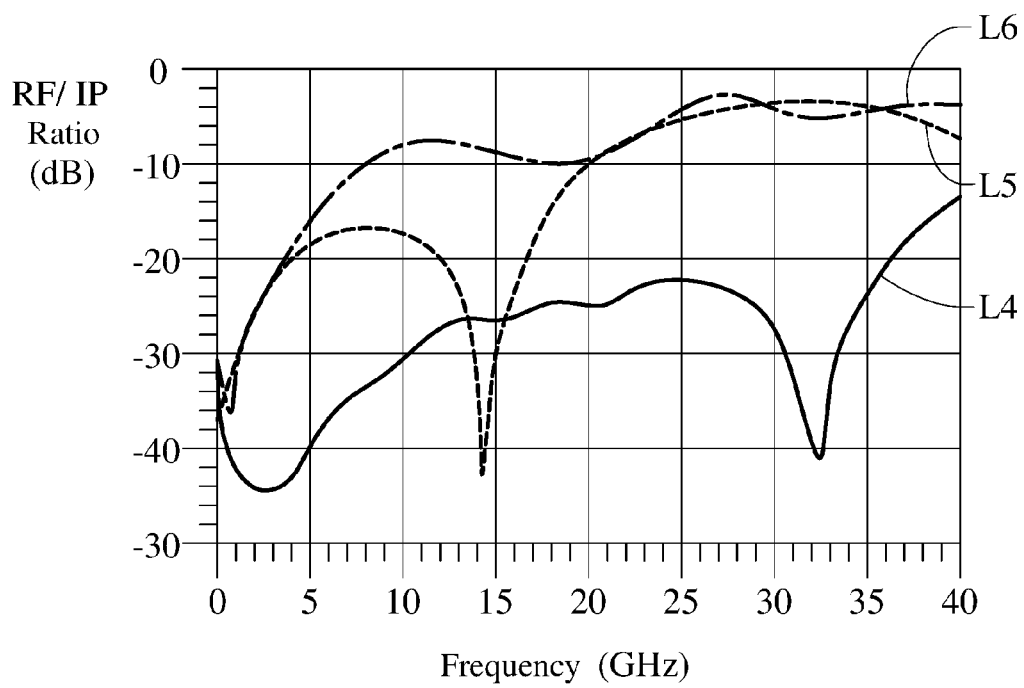
FIG. 42 is a graphical representation of RF/IP ratio versus frequency curves of the circuit structures in FIGS. 35, 37 and 39.

Please refer to FIG. 42. FIG. 42 is a graphical representation of RF/IP ratio versus frequency curves of the circuit structures in FIGS. 35, 37 and 39. When a strength of the reflection signal is more close to a strength of the input signal, an reflection loss is more close to zero dB, which means the fewer signals can pass this circuit structure. In FIG. 42, the more the reflection loss increased, the more the curve closed to the negative infinity.

In FIG. 42, line L1 represents the reflection loss of the circuit structure 300 in FIG. 35, and line L2 represents the reflection loss of the circuit structure 302 in FIG. 39, and line L3 represents the reflection loss of the circuit structure 301 in FIG. 37. As shown in FIG. 42, except some specific frequency which the resonance happens at, the reflection losses of the three circuit structures are increased when the frequency is increased. When the resonance happens, the reflection losses are decreased. However, the frequency ranges which the resonance happens at are usually narrow.

As shown in FIG. 42, the circuit structure 300 in FIG. 35 has the best reflection loss performance among the three circuit structures, and the reflection loss is lower than −12 dB at every frequency. The circuit structure 302 in FIG. 39 has the medium reflection loss performance among the three circuit structures. When the frequency is less than 20 GHz, the reflection loss is lower than −10 dB. However, when the frequency is over 20 GHz, the reflection loss increase significantly and is higher than −10 dB. The circuit structure 301 in FIG. 37 has the highest reflection loss among the three circuit structures, which means the amount of signals which can pass the circuit structure 301 is the fewest among the three circuit structures.

Figure 43:
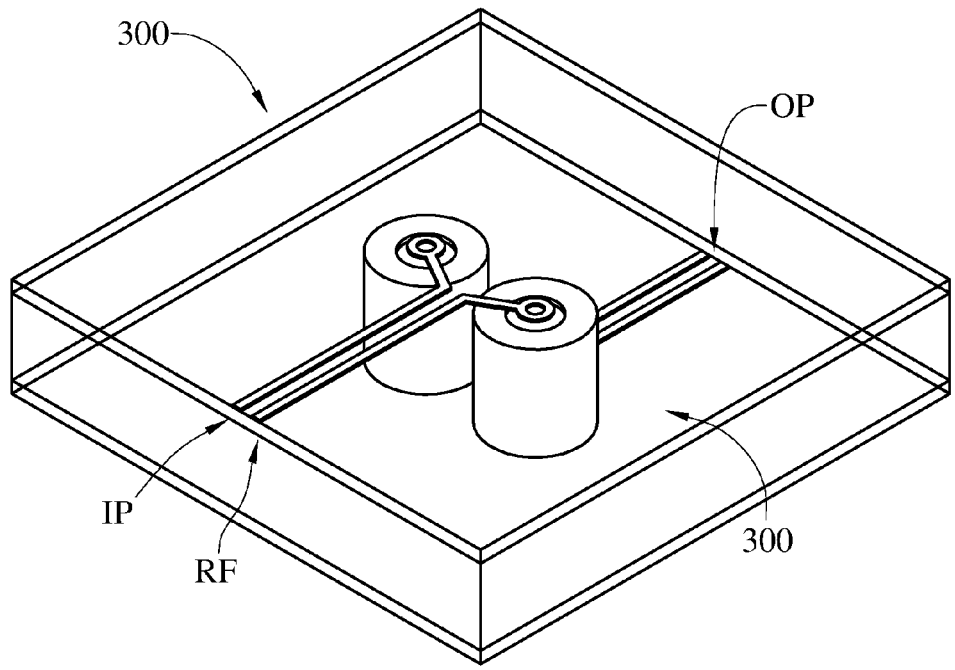
FIG. 43 is a schematic view of two circuit structures in FIG. 35 for simulation test.
Figure 44:
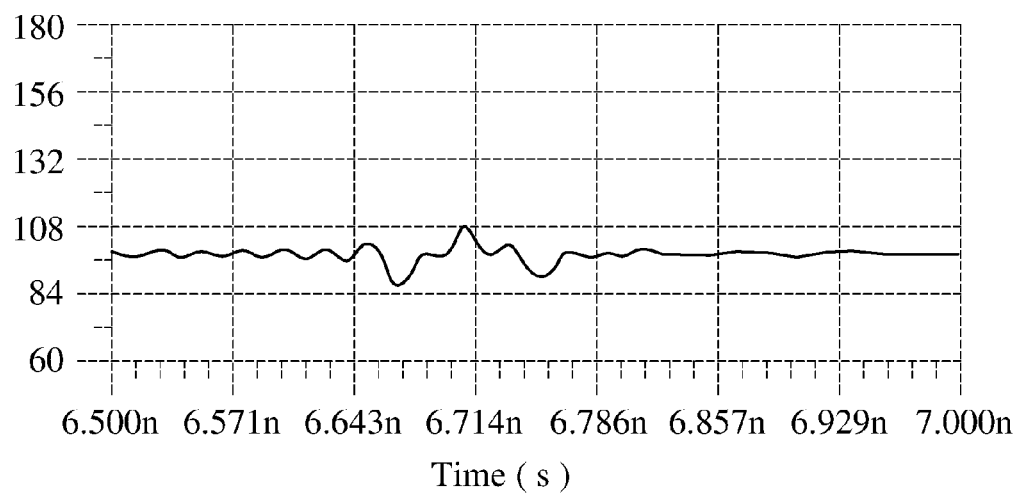
FIG. 44 is a graphical representation of impedance versus time curve of the circuit structure in FIG. 43 as inputting a step wave signal from IP.

Please refer to FIG. 43. FIG. 43 is a schematic view of two circuit structures in FIG. 35 for simulation test. Excepts having the same test condition as in FIG. 35, a distance between two centers of the two conductive vias 371 in FIG. 34B is 1955.8 µm, and a distance between the two top conductive lines 372 in FIG. 34B is 304.8 µm, and a distance between the two bottom conductive lines 372' in FIG. 34B is 304.8 µm. Please refer to FIG. 44. FIG. 44 is a graphical representation of impedance versus time curve of the circuit structure in FIG. 43 as inputting a step wave signal from IP. In about 6.643 nanoseconds (nsec) after inputting the step wave signal, the step wave signal passes the top conductive line 372 and is reflected back to the IP location, and the impedance is maintained at about 100Ω as the sum of two 50Ω. In about 6.643 nsec to 6.786 nsec after inputting the step wave signal, a reflection signal of the step wave signal passing the conductive via is reflected back to the IP location. Because the top extension conductor 351, the annular conductor 330 and the bottom extension conductor 351' form a uniform electric field, the impedance is maintained between 84Ω and 108Ω as a light variation range, and the variation range is within plus eight percent and minus sixteen percent from 100Ω. An impedance variation derived from a reflection signal received at about 6.780 nsec after inputting the step wave signal shows that the step wave signal passes the bottom conductive line, and the impedance is about 100Ω with the variation range reduced.

Figure 45:
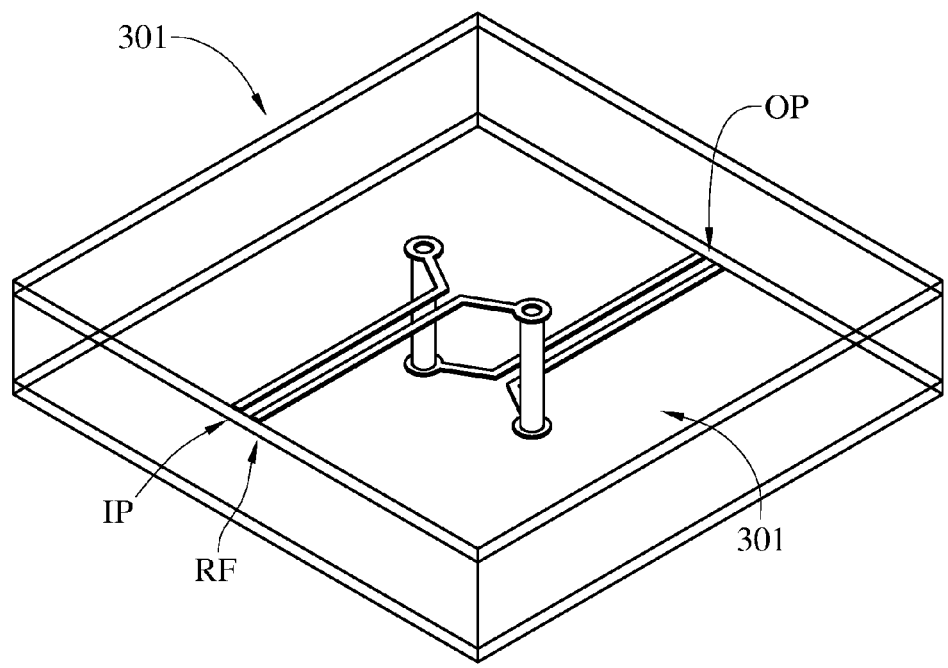
FIG. 45 is a schematic view of two circuit structures in FIG. 37 for simulation test.

Please refer to FIG. 45. FIG. 45 is a schematic view of two circuit structures in FIG. 37 for simulation test. Excepts having the same test condition as in FIG. 37, a distance between two centers of two conductive vias is 1955.8 μm, and a distance between two top conductive lines is 304.8 μm, and a distance between two bottom conductive lines 372' is 304.8 μm.

Figure 46:
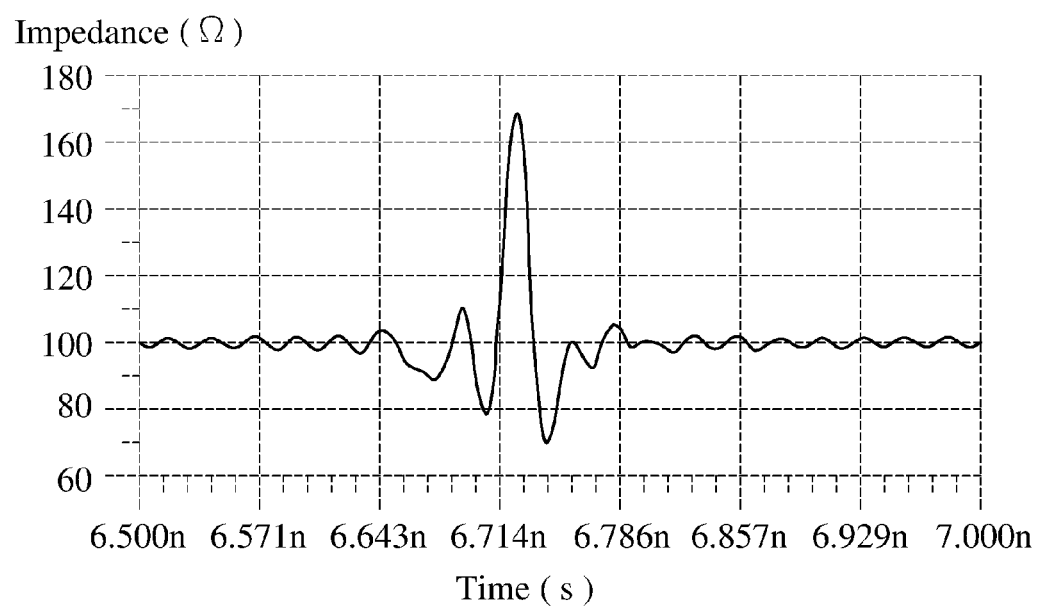
FIG. 46 is a graphical representation of impedance versus time curve of the circuit structure in FIG. 45 as inputting a step wave signal from IP.

Please refer to FIG. 46. FIG. 46 is a graphical representation of impedance versus time curve of the circuit structure in FIG. 45 as inputting a step wave signal from IP. In about 6.643 nanoseconds (nsec) after inputting the step wave signal, the step wave signal passes the top conductive line and is reflected back to the IP location, and the impedance is maintained at about 100Ω with a light variation range. In about 6.643 nsec to 6.786 nsec after inputting the step wave signal, a reflection signal of the step wave signal passing the conductive via is reflected back to the IP location. Because the electric field which the step wave signal passes is not uniform, the variation range of the impedance is increased, and the impedance is about between 70Ω and 170Ω, and the variation range is within plus seventy percent to minus thirty percent from 100Ω. An impedance variation derived from a reflection signal received at about 6.786 nsec after inputting the step wave signal shows that the step wave signal passes the bottom conductive line, and the impedance is about 100Ω with the variation range reduced.

Figure 47:
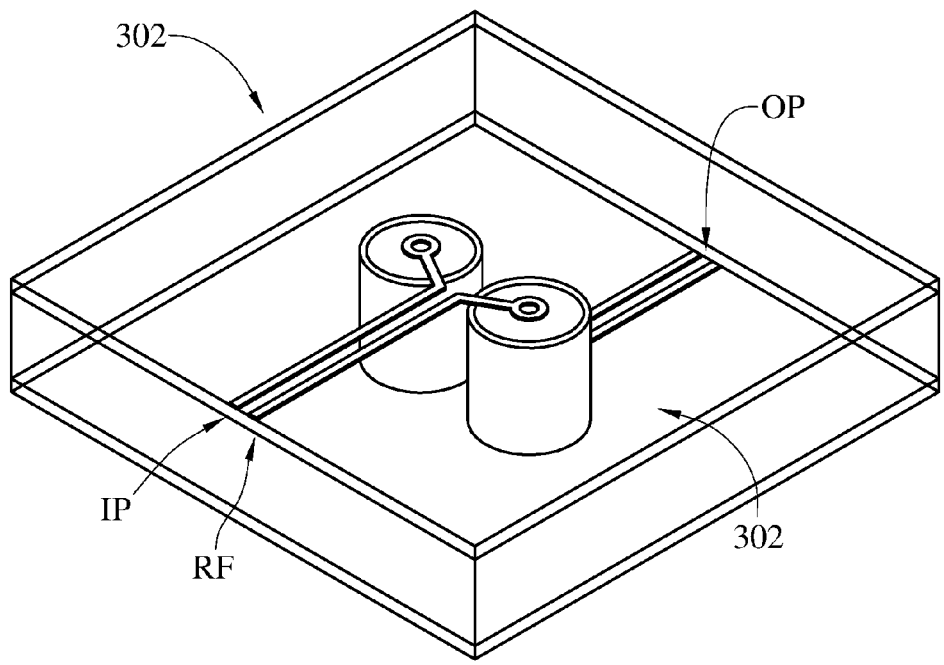
FIG. 47 is a schematic view of two circuit structures in FIG. 39 for simulation test.

Please refer to FIG. 47. FIG. 47 is a schematic view of two circuit structures in FIG. 39 for simulation test. Excepts having the same test condition as in FIG. 39, a distance between two centers of two conductive vias is 1955.8 μm, and a distance between two top conductive lines is 304.8 μm, and a distance between two bottom conductive lines 372' is 304.8 μm.

Figure 48:
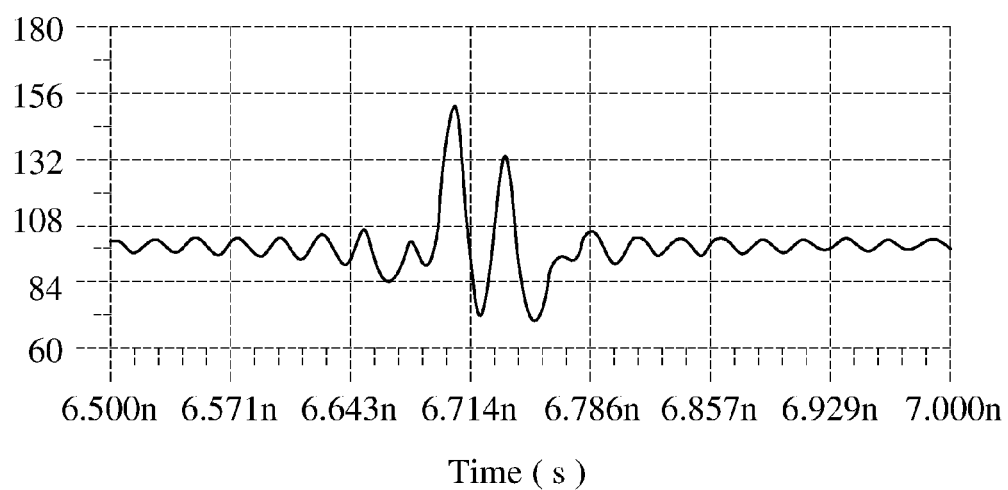
FIG. 48 is a graphical representation of impedance versus time curve of the circuit structure in FIG. 47 as inputting a step wave signal from IP.

Please refer to FIG. 48. FIG. 48 is a graphical representation of impedance versus time curve of the circuit structure in FIG. 47 as inputting a step wave signal from IP. In about 6.643 nanoseconds (nsec) after inputting the step wave signal, the step wave signal passes the top conductive line and is reflected back to the IP location, and the impedance is maintained at about 100Ω with a light variation range. In about 6.643 nsec to 6.786 nsec after inputting the step wave signal, a reflection signal of the step wave signal passing the conductive via is reflected back to the IP location, and the impedance variation is about between 70Ω and 156Ω, and the variation range is within plus fifty-six percent to minus thirty percent from 100Ω. An impedance variation derived from a reflection signal received at about 6.786 nsec after inputting the step wave signal shows that the step wave signal passes the bottom conductive line, and the impedance is about 100Ω with the variation range reduced.

Figure 49:
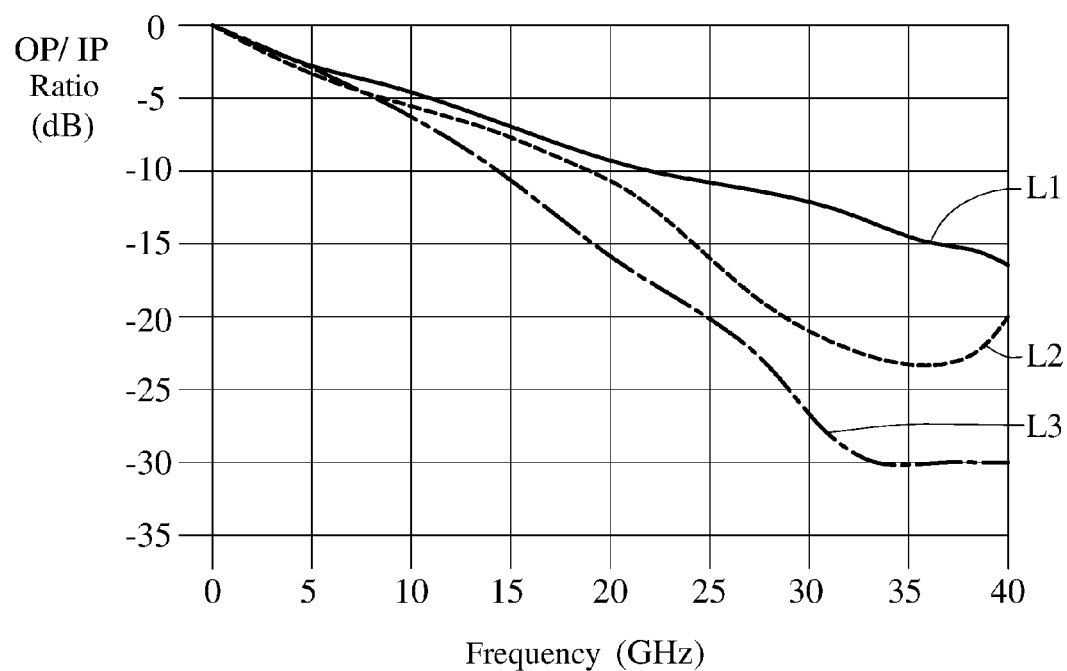
FIG. 49 is a graphical representation of OP/IP ratio versus frequency curves of the circuit structures in FIGS. 43, 45 and 47.

Please refer to FIG. 49. FIG. 49 is a graphical representation of OP/IP ratio versus frequency curves of the circuit structures in FIGS. 43, 45 and 47. In FIG. 49, line L1 represents the insertion loss of the circuit structure 300 in FIG. 43, and line L2 represents the insertion loss of the circuit structure 302 in FIG. 45, and line L3 represents the insertion loss of the circuit structure 301 in FIG. 47. As shown in FIG. 41, when the frequency is increased, the insertion losses of the three circuit structures are increased. However, the circuit structure 300 in FIG. 43 has the smallest insertion loss among the three circuit structures, which means the circuit structure 300 has the best performance among the three circuit structures. The circuit structure 302 in FIG. 45 has the medium insertion loss among the three circuit structures. The circuit structure 301 in FIG. 47 has the highest insertion loss among the three circuit structures, which means the circuit structure 301 has the most serious insertion loss problem among the three circuit structures.

Figure 50:
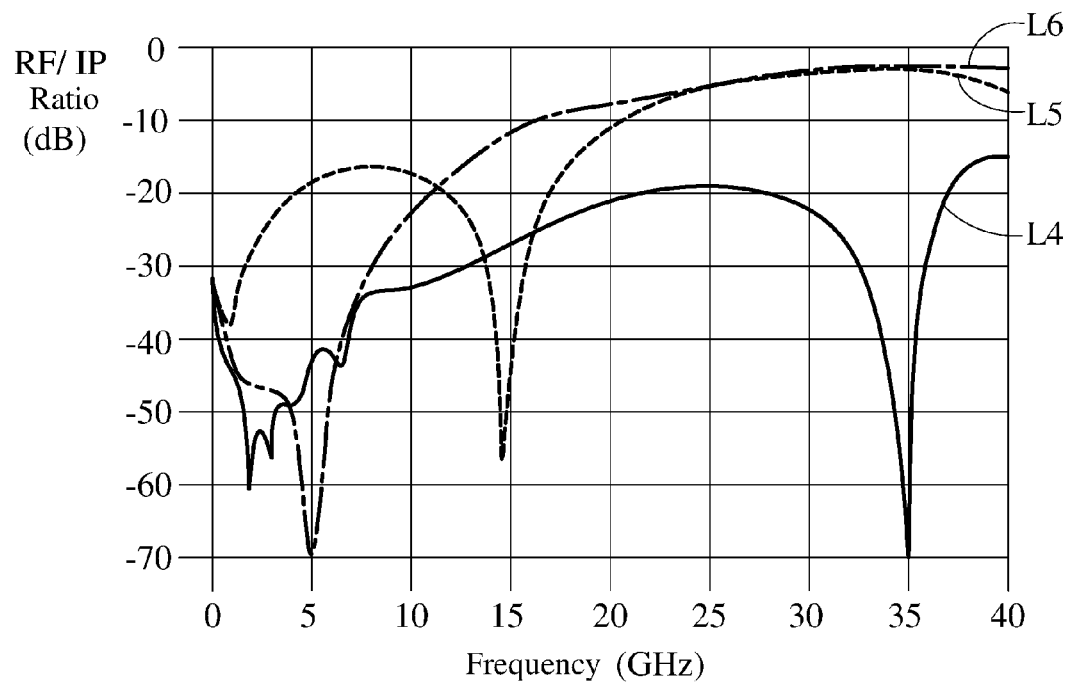
FIG. 50 is a graphical representation of RF/IP ratio versus frequency curves of the circuit structures in FIGS. 43, 45 and 47.

Please refer to FIG. 50. FIG. 50 is a graphical representation of RF/IP ratio versus frequency curves of the circuit structures in FIGS. 43, 45 and 47. In FIG. 50, line L4 represents the reflection loss of the circuit structure 300 in FIG. 43, and line L5 represents the reflection loss of the circuit structure 302 in FIG. 47, and line L6 represents the reflection loss of the circuit structure 301 in FIG. 49. As shown in FIG. 50, except some specific frequency which the resonance happens at, the reflection losses of the three circuit structures are increased when the frequency is increased. When the resonance happens, the reflection losses are decreased. However, the frequency ranges which the resonance happens at are usually narrow.

As shown in FIG. 50, the circuit structure 300 in FIG. 43 has the best reflection loss performance among the three circuit structures, and the reflection loss is lower than −15 dB at every frequency. The circuit structure 302 in FIG. 47 has the medium reflection loss performance among the three circuit structures. When the frequency is less than 20 GHz, the reflection loss is lower than −10 dB. However, when the frequency is over 20 GHz, the reflection loss increase significantly and is higher than −10 dB. When the frequency is less than 15 GHz, the reflection loss of the circuit structure 301 in FIG. 45 is lower than −10 dB. However, the reflection loss of the circuit structure 301 in FIG. 45 increases significantly when the frequency is over 15 GHz.

Figure 51A:
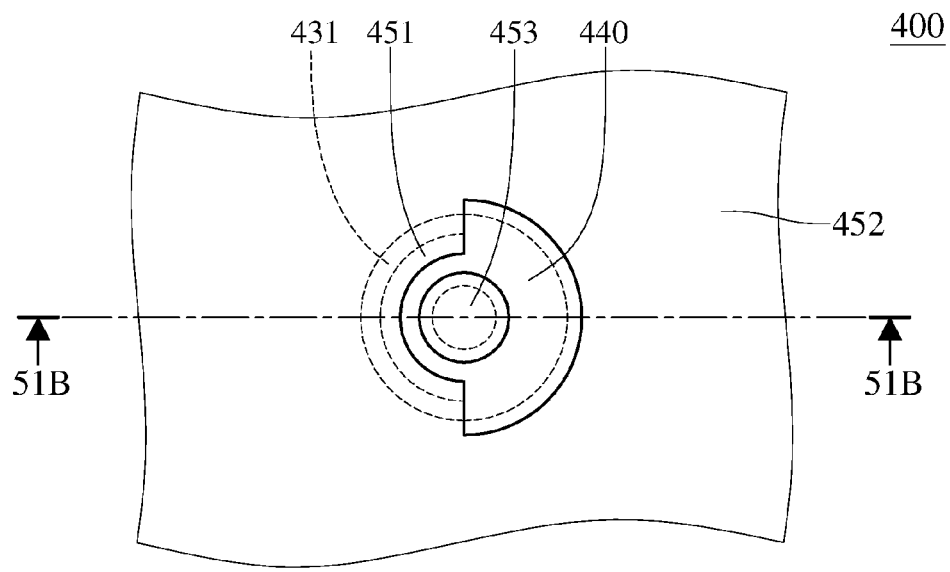
FIG. 51A is a top view of a circuit structure according to an eighth embodiment of the disclosure.
Figure 51B:
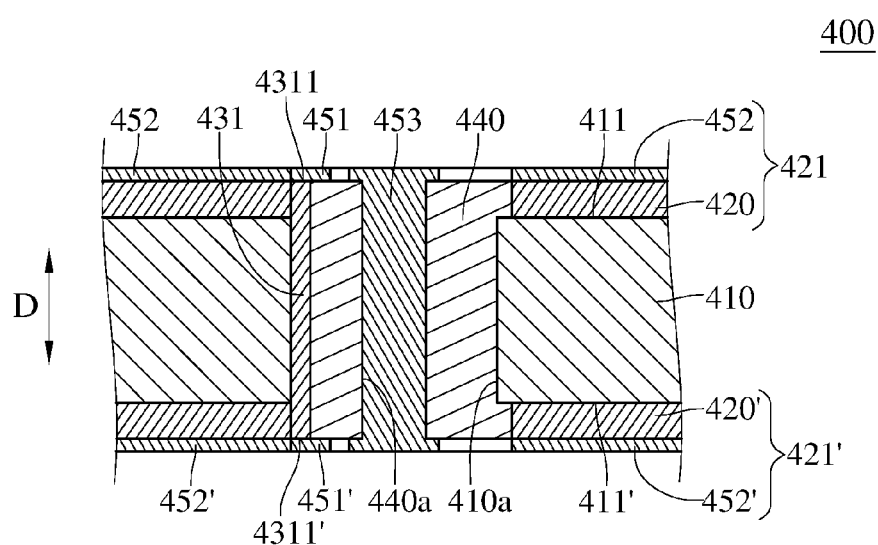
FIG. 51B is a cross-sectional view of the circuit structure along a line 51B-51B in FIG. 51A.
Figure 52A:
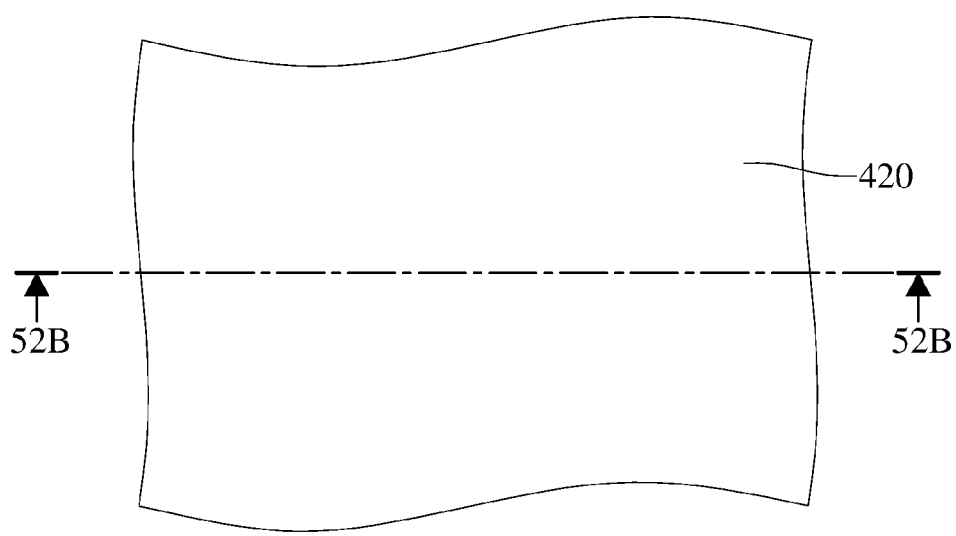
FIG. 52A, FIG. 53A, FIG. 54A, FIG. 55A, FIG. 56A, FIG. 57A, FIG. 58A, FIG. 59A, FIG. 60A, FIG. 61A and FIG. 62A are top views of the circuit structure in FIG. 51A at different manufacturing steps.
Figure 52B:
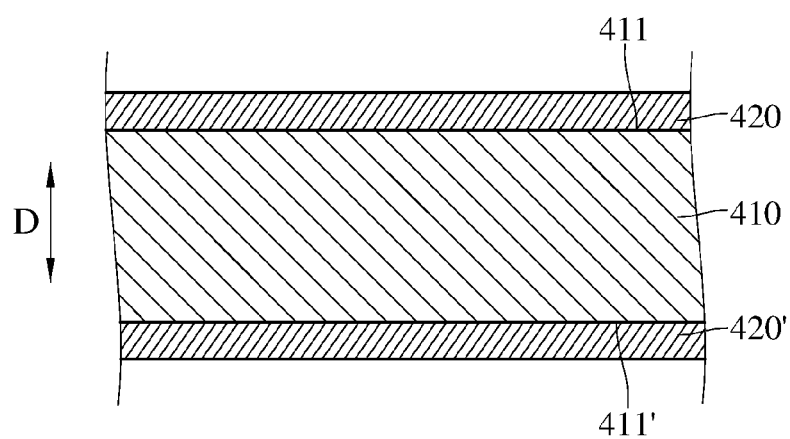
FIG. 52B, FIG. 53B, FIG. 54B, FIG. 55B, FIG. 56B, FIG. 57B, FIG. 58B, FIG. 59B, FIG. 60B, FIG. 61B and FIG. 62B are cross-sectional views of the circuit structure in FIG. 51B at different manufacturing steps.
Figure 53A:
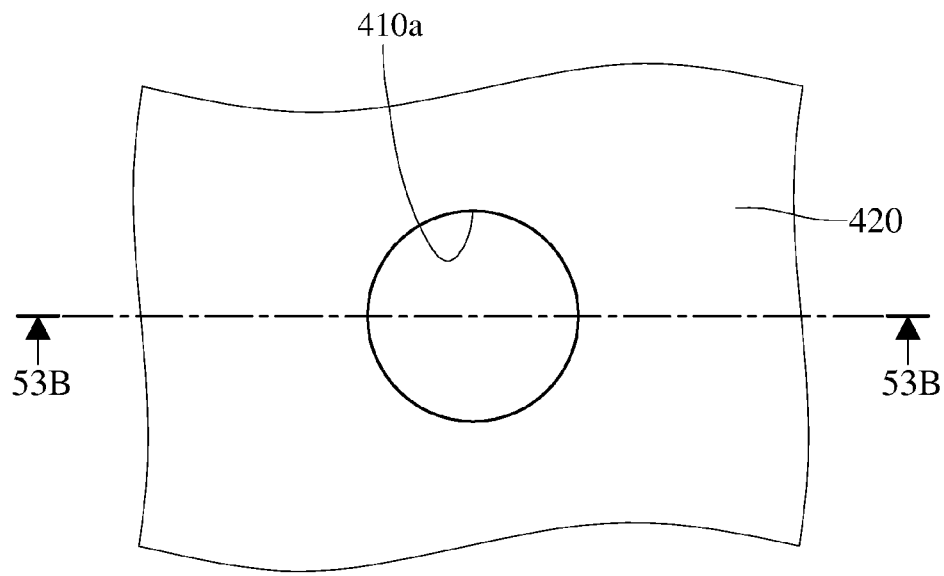
Figure 53B:
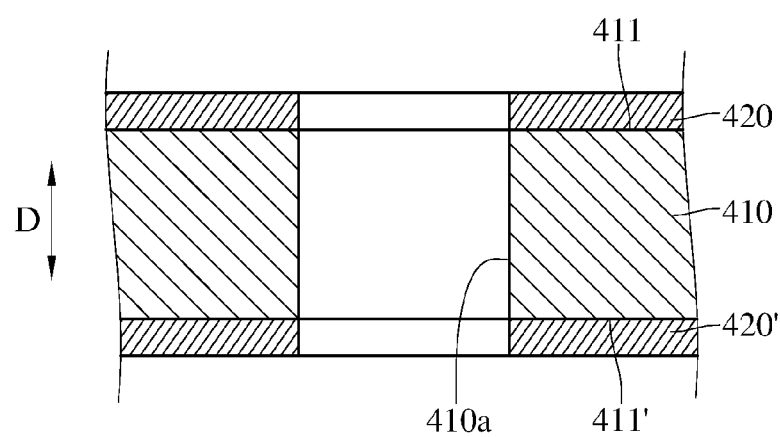

Please refer to FIG. 51A and FIG. 51B. FIG. 51A is a top view of a circuit structure according to an eighth embodiment of the disclosure. FIG. 51B is a cross-sectional view of the circuit structure along a line 51B-51B in FIG. 51A. In the eighth embodiment of the present disclosure, the circuit structure 400 includes a core substrate 410, a top conductive layer 421, a bottom conductive layer 421', an arcuate conductor 431, a dielectric element 440, a top extension conductor 451, a bottom extension conductor 451' and a conductive via 453.

The circuit structure 400 in the eighth embodiment is similar to the circuit structure 100 in the first embodiment. The core substrate 410 includes a top surface 411, a bottom surface 411' and a through hole 410a extending along a direction D. The dielectric element 440 is disposed in the through hole 410a, and the dielectric element 440 is penetrated by a through hole 440a extending along the direction D. An outer diameter of the through hole 440a is less than an outer diameter of the through hole 410a. The conductive via 453 extending along the direction D is disposed on a sidewall of the through hole 440a. The top conductive layer 421 can be a stacking structure including a top first conductive layer 420 and a top second conductive layer 452 stacking on the top first conductive layer 420. The bottom conductive layer 421' can be a stacking structure including a bottom first conductive layer 420' and a bottom second conductive layer 352' stacking on the bottom first conductive layer 320'.

The arcuate conductor 431 is disposed on a sidewall of the through hole 410a, and the core substrate 410 is penetrated by the arcuate conductor 431. The arcuate conductor 431 is located at a side of the conductive via 453, and a concave surface of the arcuate conductor 431 faces the conductive via 453. The arcuate conductor 431 is electrically insulated from the conductive via 453. The conductive via 453 is surrounded by the dielectric element 440. A part of the dielectric element 440 is located between the conductive via 453 and the arcuate conductor 431, and a part of the dielectric element 440 is located between the conductive via 453 and the sidewall of the through hole 410a. The top extension conductor 451 is electrically connected to the top end 4311 of the arcuate conductor 431 and extends toward the conductive via 453. The top extension conductor 451 is electrically connected to the conductive via 453. The bottom extension conductor 451' is electrically connected to the bottom end 4311' of the arcuate conductor 431 and extends toward the conductive via 453. The bottom extension conductor 451' is electrically connected to the conductive via 453.

In the eighth embodiment of the present disclosure, taking the top surface 411 of the core substrate 410 as a reference plane, a height of the top extension conductor 451 is equal to a height of a top end of the conductive via 453, but the disclosure is not limited thereto. In other embodiments of the present disclosure, the height of the top extension conductor is less than a height of a top end of the conductive via.

In addition, in other embodiments of the present disclosure, the circuit structure can further include at least one insulating layer and at least one conductive line. The insulating layer can be disposed on the core substrate and can be made of electrical insulation material. The conductive line can be disposed on the insulating layer. The conductive line is electrically connected to at least one end of the conductive via and electrically insulated from the arcuate conductor. A part of an orthogonal projection of the extension conductor on a surface of the core substrate and a part of an orthogonal projection of the conductive line on the surface of the core substrate are overlapped with each other. Furthermore, in other embodiments of the present disclosure, the top extension conductor or the bottom extension conductor can extend toward and be electrically connected to the conductive via according the demand of the circuit design.

Please refer to FIG. 52A to FIG. 62B. FIG. 52A, FIG. 53A, FIG. 54A, FIG. 55A, FIG. 56A, FIG. 57A, FIG. 58A, FIG. 59A, FIG. 60A, FIG. 61A and FIG. 62A are top views of the circuit structure in FIG. 51A at different manufacturing steps. FIG. 52B, FIG. 53B, FIG. 54B, FIG. 55B, FIG. 56B, FIG. 57B, FIG. 58B, FIG. 59B, FIG. 60B, FIG. 61B and FIG. 62B are cross-sectional views of the circuit structure in FIG. 51B at different manufacturing steps. Wherein, the manufacturing process of the circuit structure 400 in FIG. 52A to FIG. 53A and FIG. 52B to FIG. 53B is similar to the manufacturing process of the circuit structure 100 in FIG. 2A to FIG. 3A and FIG. 2B to FIG. 3B so that the manufacturing steps of the circuit structure 400 in FIG. 52A to FIG. 53A and FIG. 52B to FIG. 53B are not repeated hereafter.

Figure 54A:
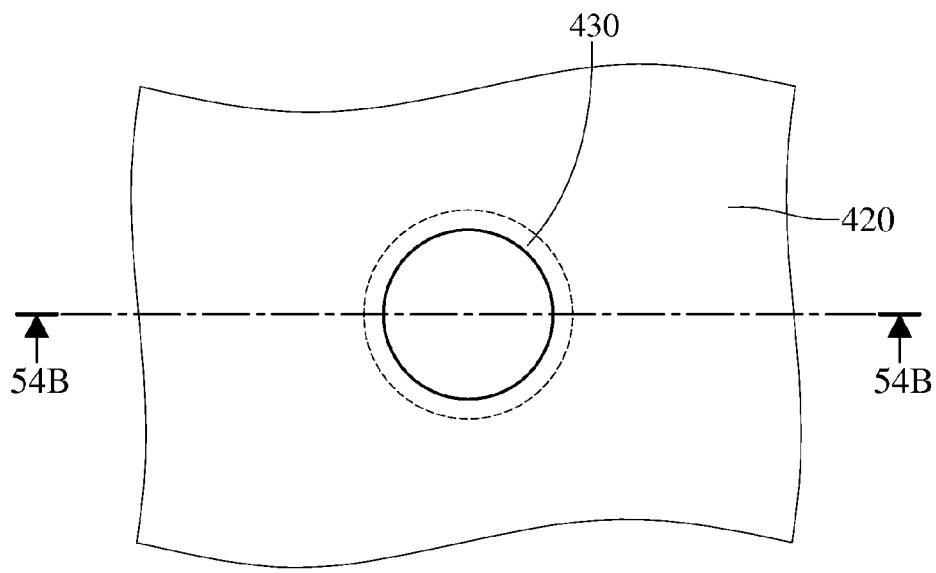
Figure 54B:
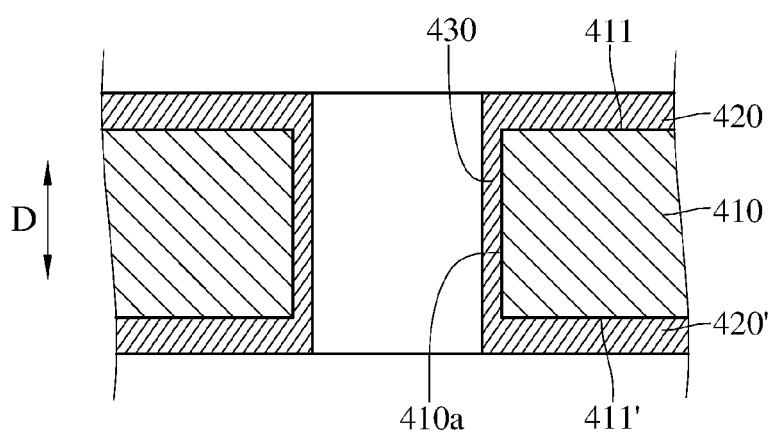

As shown in FIG. 54A and FIG. 54B, an annular conductive material 430 on a sidewall of the through hole 410a is formed. The annular conductive material 430 is electrically connected to the top first conductive layer 420 and the bottom first conductive layer 420'. The annular conductive material 430 extends along a direction D and penetrates the core substrate 410.

Figure 55A:
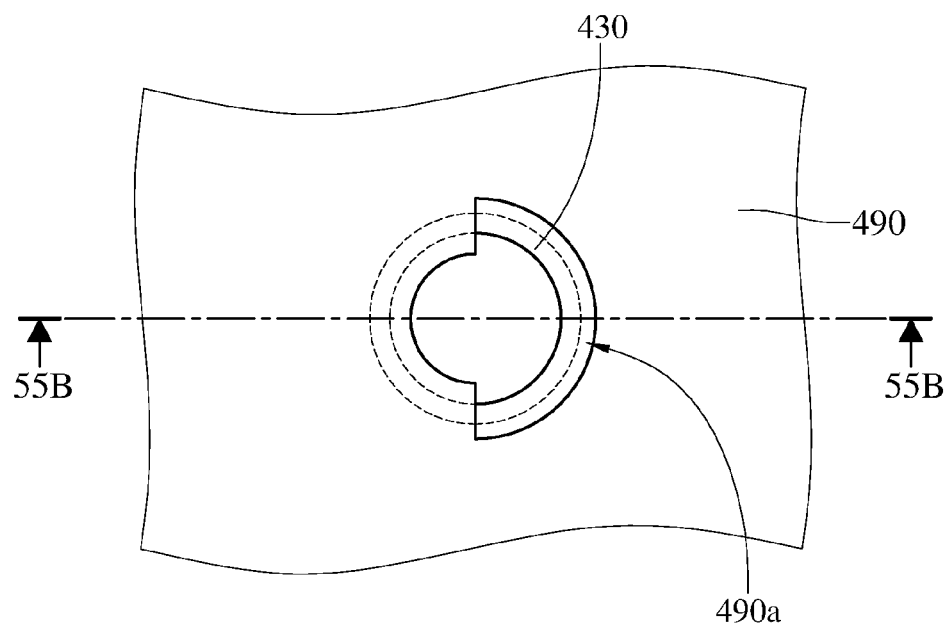
Figure 55B:
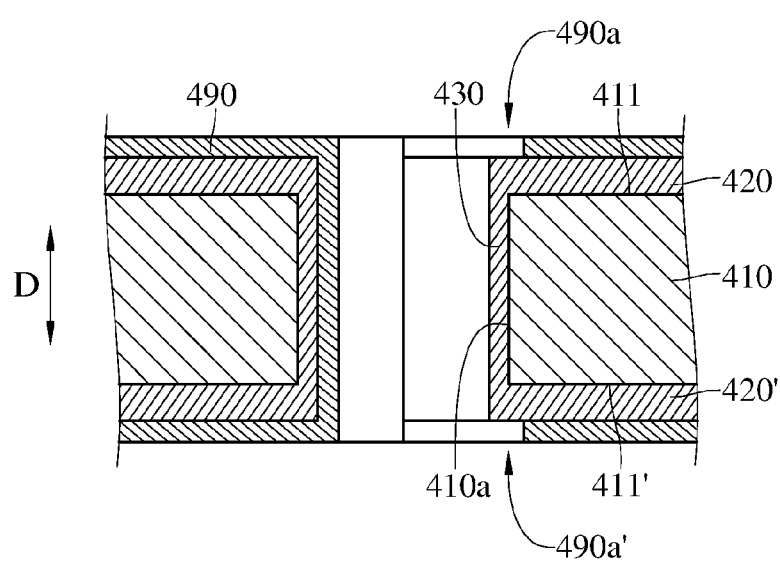

As shown in FIG. 55A and FIG. 55B, the top first conductive layer 420, the bottom first conductive layer 420' and the annular conductive material 430 are covered by a photoresist mask 490. The photoresist mask 490 includes a top opening 490a and a bottom opening 490a', and a part of the annular conductive material 430 is exposed in the top opening 490a and the bottom opening 490a'. In the eighth embodiment of the disclosure, a part of the top first conductive layer 420 which is adjacent to the exposed part of the annular conductive material 430 is exposed in the top opening 490a of the photoresist mask 490. A part of the bottom first conductive layer 420' which is adjacent to the exposed part of the annular conductive material 430 is exposed in the bottom opening 490a' of the photoresist mask 490.

Figure 56A:
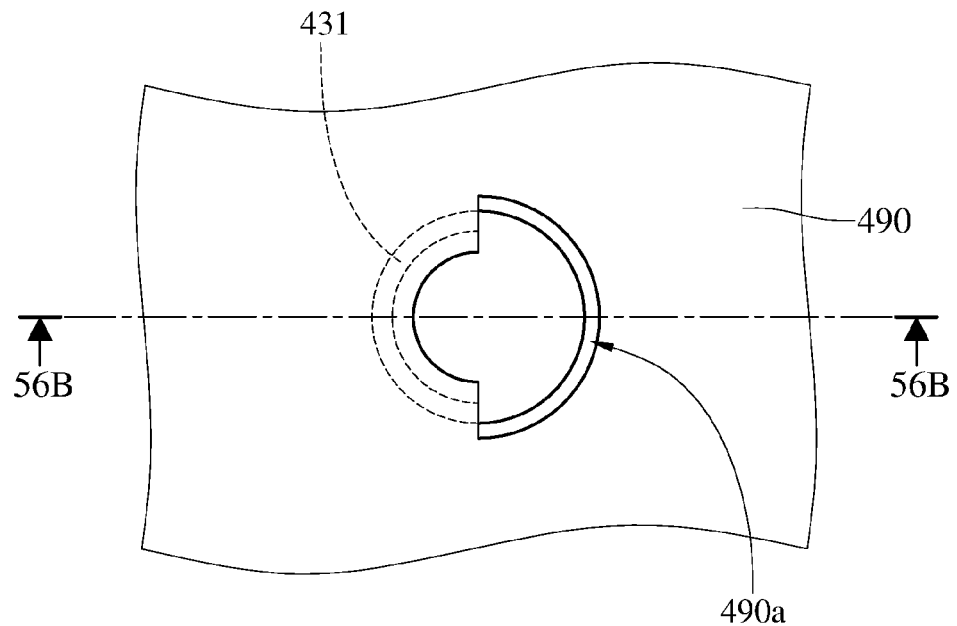
Figure 56B:
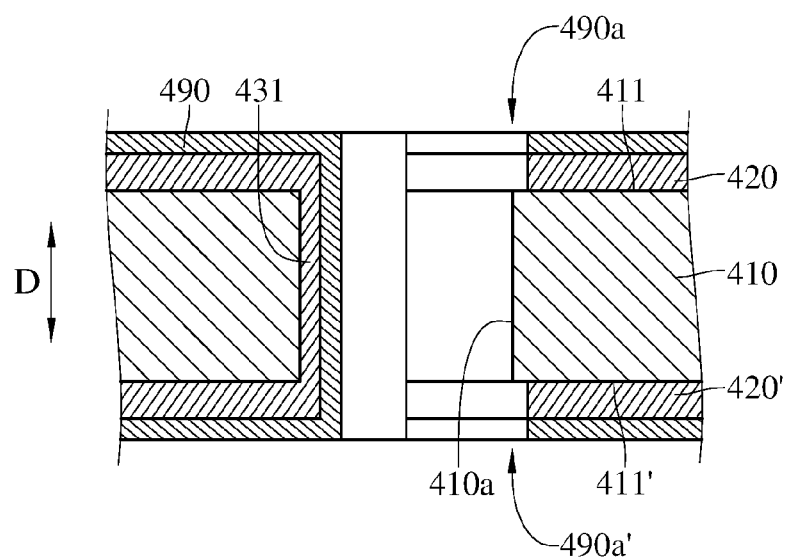

As shown in FIG. 56A and FIG. 56B, the annular conductive material 430, the top first conductive layer 420 and the bottom first conductive layer 420' exposed in the top opening 490a and the bottom opening 490a' of the photoresist mask 490 in FIG. 55B is etched. A part of the annular conductive material 430 in FIG. 55B which is covered by the photoresist mask 490 is left, and thereby forming the arcuate conductor 431.

Figure 57A:
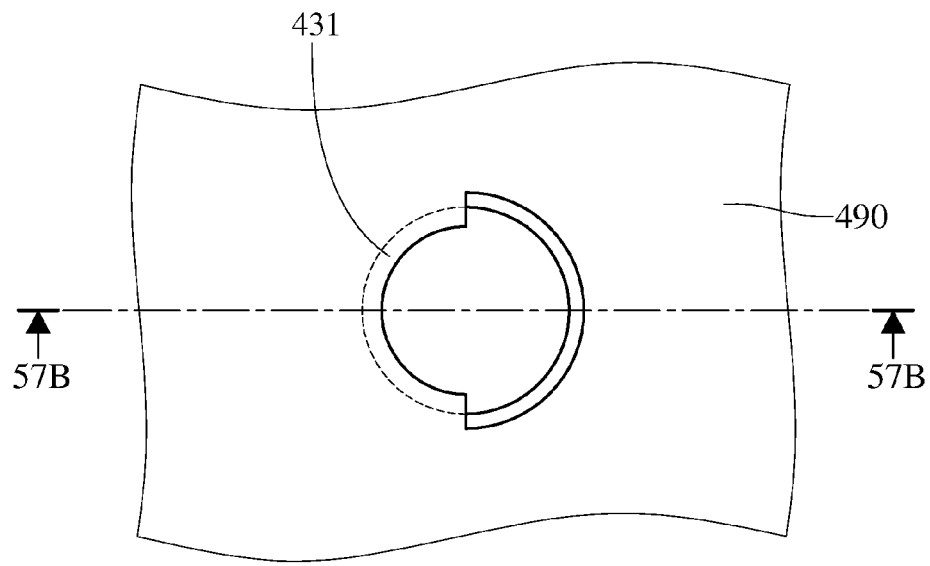
Figure 57B:
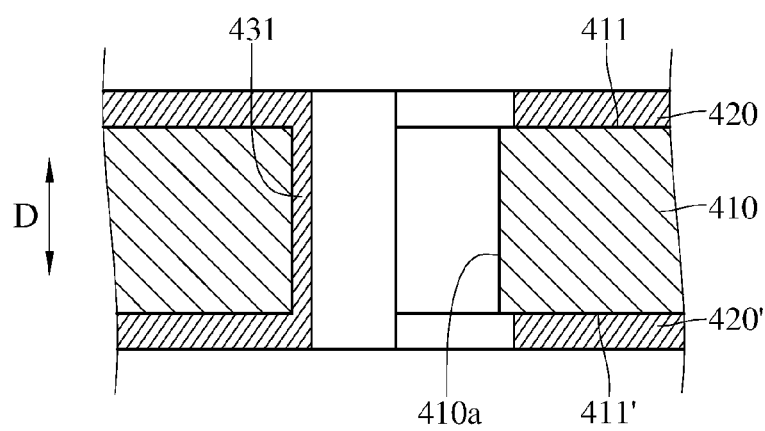
Figure 58A:
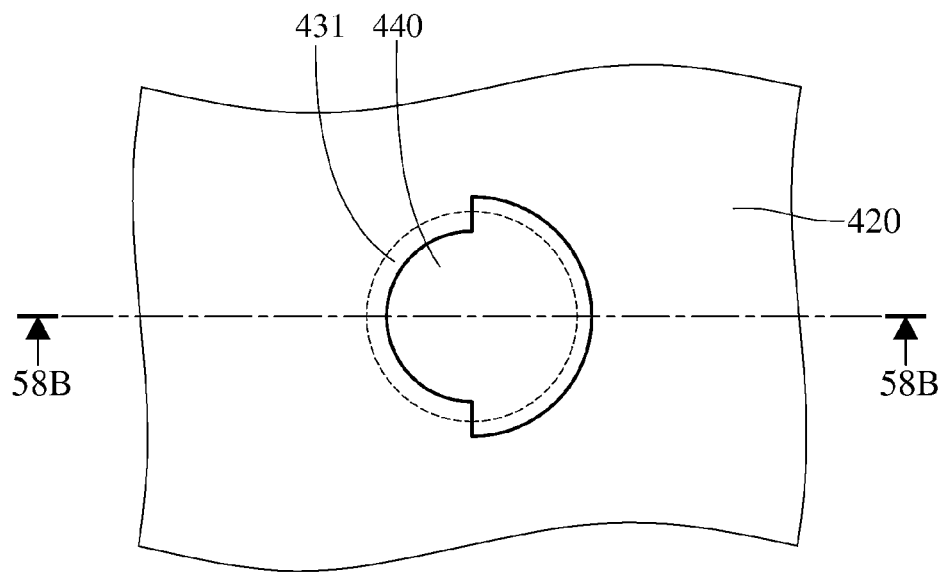
Figure 58B:
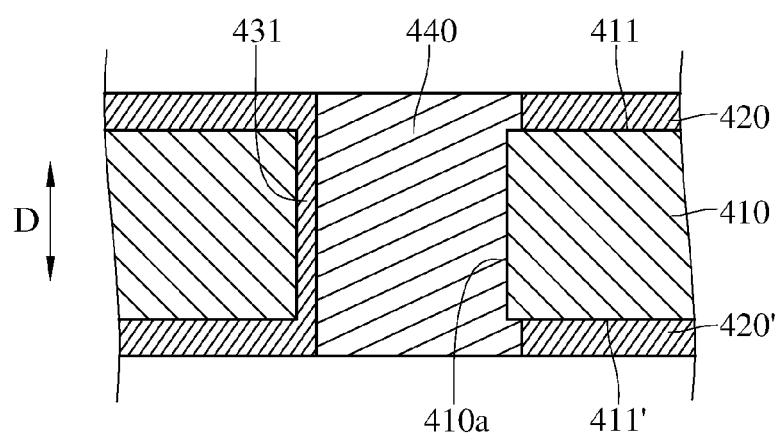

As shown in FIG. 57A and FIG. 57B, the photoresist mask 490 in FIG. 56A and FIG. 56B is removed. As shown in FIG. 58A and FIG. 58B, a dielectric element 440 is formed in the through hole 410a. The dielectric element 440 is in contact with the core substrate 410, the top first conductive layer 420, the bottom first conductive layer 420' and the arcuate conductor 431.

Figure 59A:
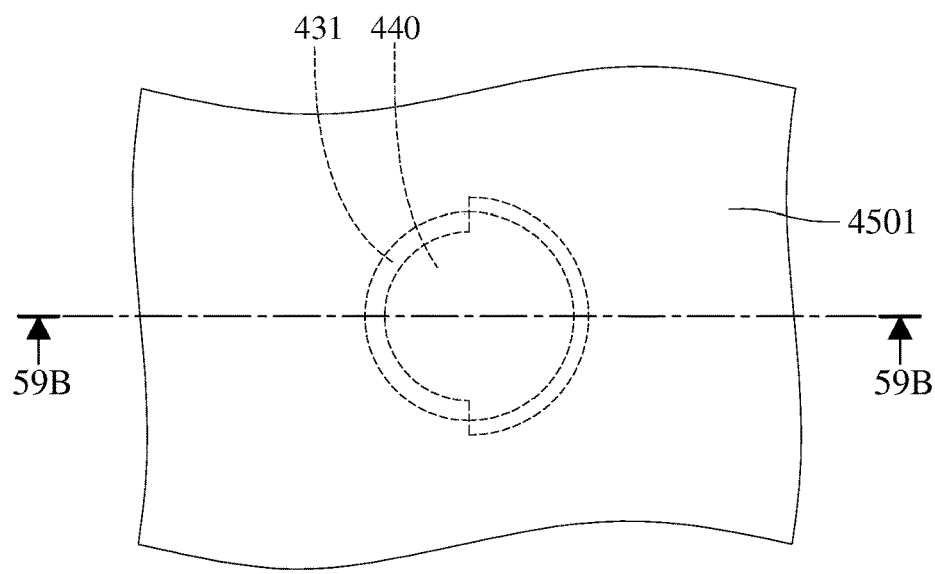
Figure 59B:
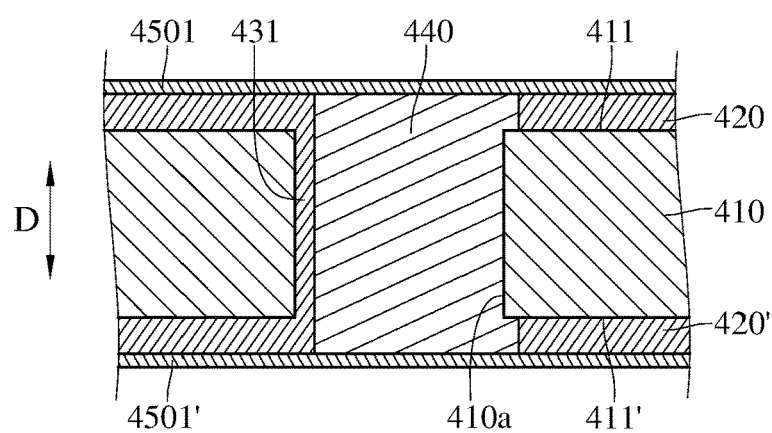

As shown in FIG. 59A and FIG. 59B, a top first conductive material 4501 is formed on top surfaces of the top first conductive layer 420 and the dielectric element 440. Moreover, bottom first conductive material 4501 under bottom surfaces of the bottom first conductive layer 420' and the dielectric element 440.

Figure 60A:
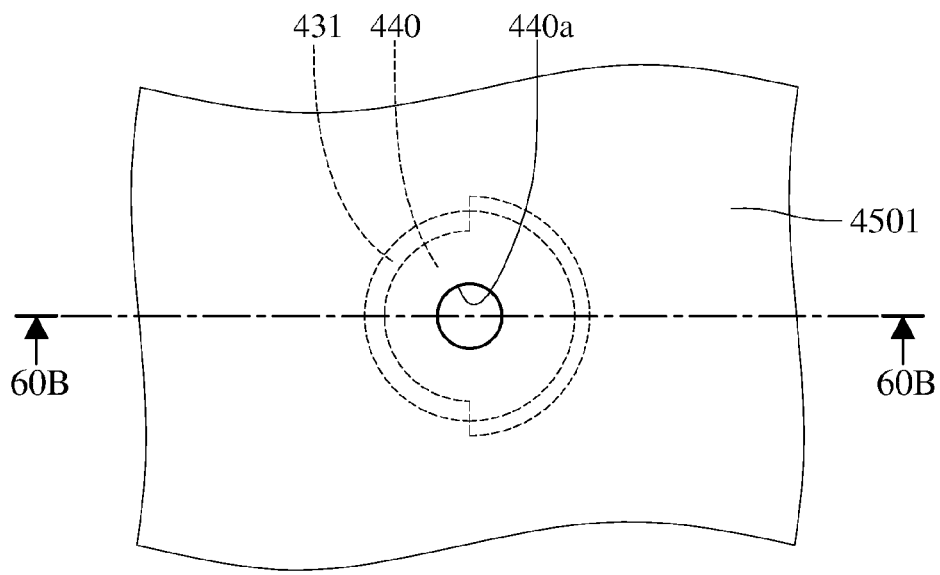
Figure 60B:
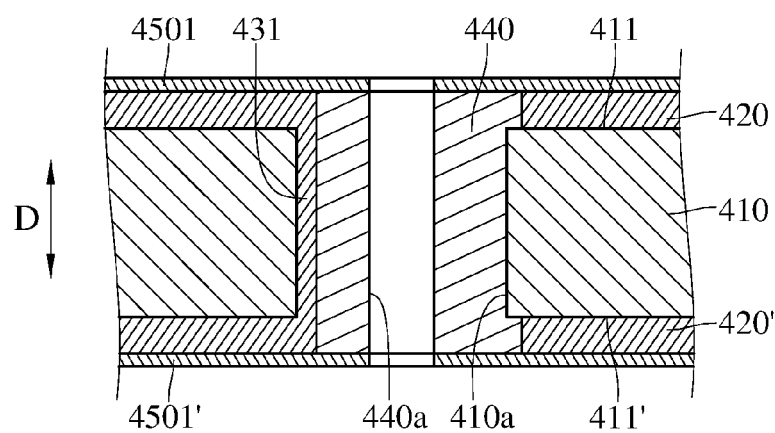
Figure 61A:
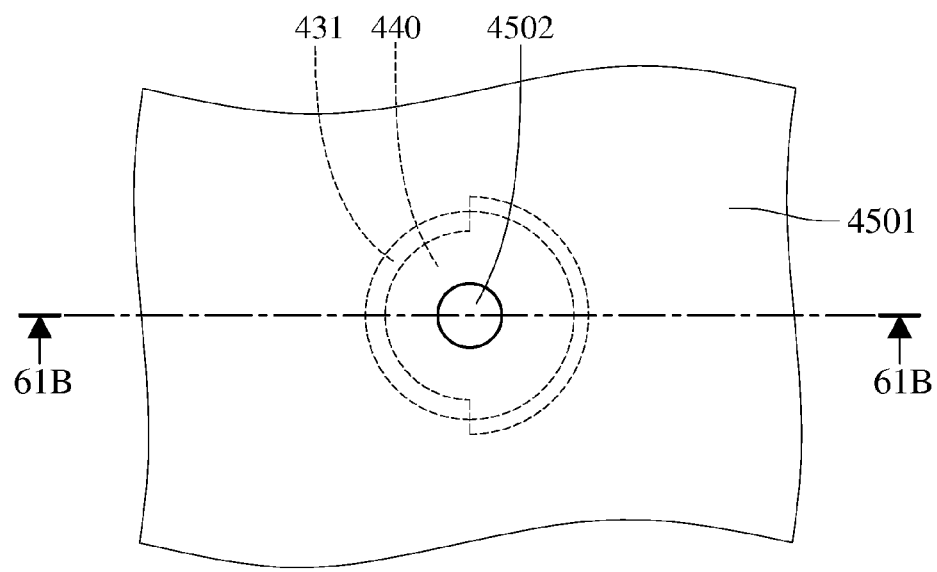
Figure 61B:
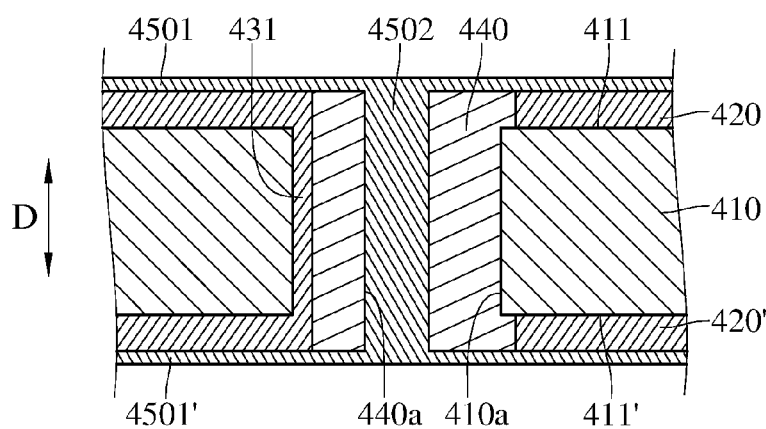

As shown in FIG. 60A and FIG. 60B, a through hole 440a penetrating the top first conductive material 4501, the dielectric element 440 and the bottom first conductive material 4501' is formed. As shown in FIG. 61A and FIG. 61B, a second conductive material 4502 is formed in the through hole 440a. The second conductive material 4502 is electrically connected to the top first conductive material 4501 and the bottom first conductive material 4501'.

Figure 62A:
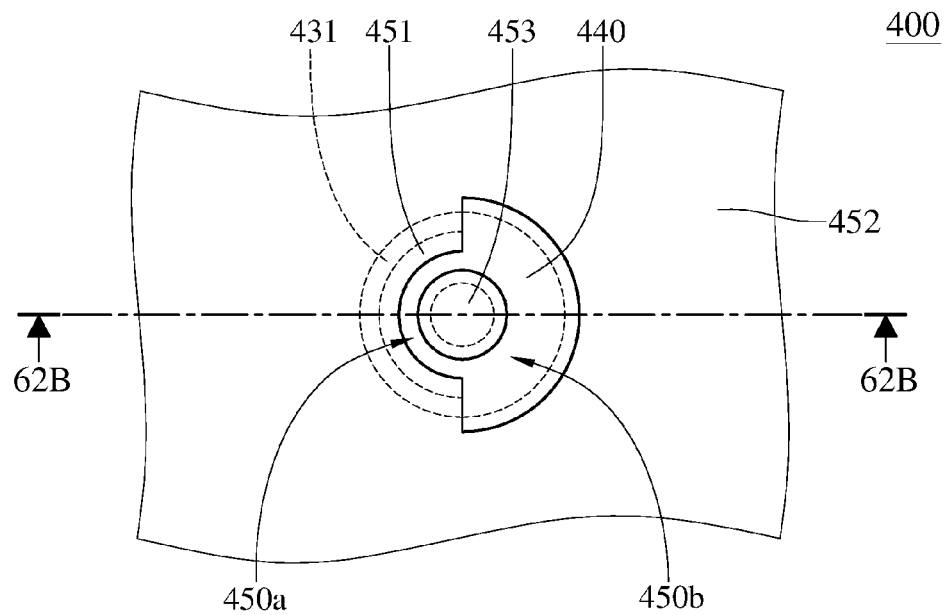
Figure 62B:
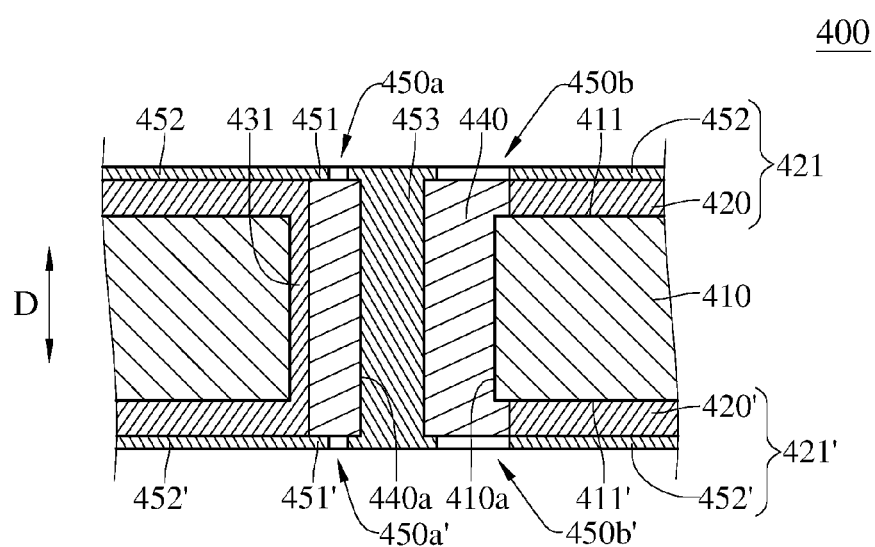

As shown in FIG. 62A and FIG. 62B, a top opening 450a and a top opening 450b are formed on the top first conductive material 4501, and a bottom opening 450a' and a bottom opening 450b' is formed on the bottom first conductive material 4501'. As shown in FIG. 61B, the top first conductive material 4501 and the second conductive material 4502 are divided into a top extension conductor 451, a top second conductive layer 452 and a conductive via 453, and the bottom first conductive material 4501' and the second conductive material 4502 is divided into a bottom extension conductor 451', a bottom second conductive layer 452' and the conductive via 453. The top opening 450a is located between the top extension conductor 451 and the conductive via 453, and the bottom opening 450a' is located between the bottom extension conductor 451' and the conductive via 453. The top opening 450b is located between the top second conductive layer 452 and the conductive via 453, and the bottom opening 450b' is located between the bottom second conductive layer 452' and the conductive via 453. The conductive via 453 is electrically insulated from the top extension conductor 451, the bottom extension conductor 451', the top second conductive layer 452 and the bottom second conductive layer 452' by the top opening 450a, the bottom opening 450a', the top opening 450b and the bottom opening 450b'.

Figure 63A:
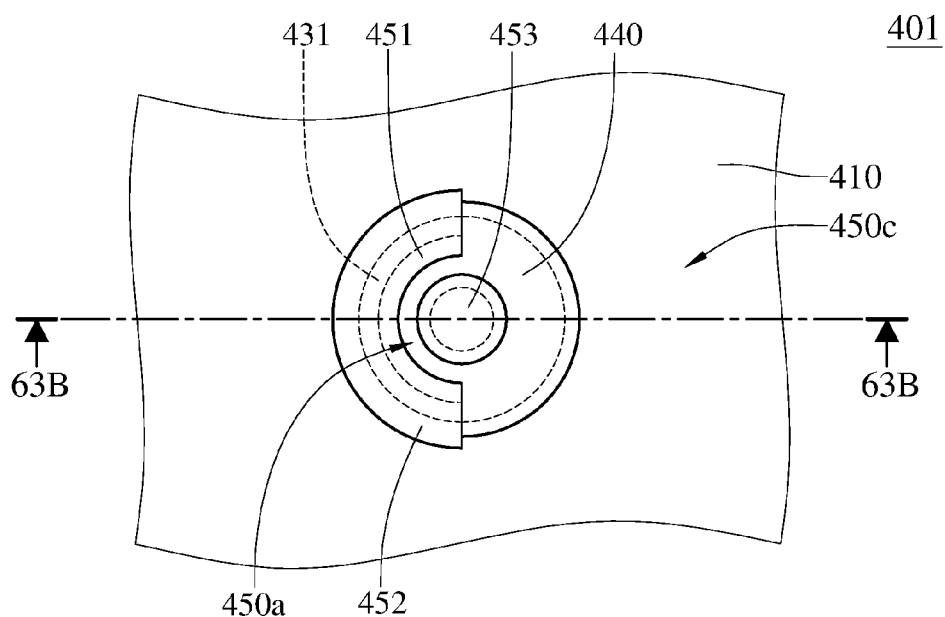
FIG. 63A is a top view of a circuit structure according to a ninth embodiment of the disclosure.
Figure 63B:
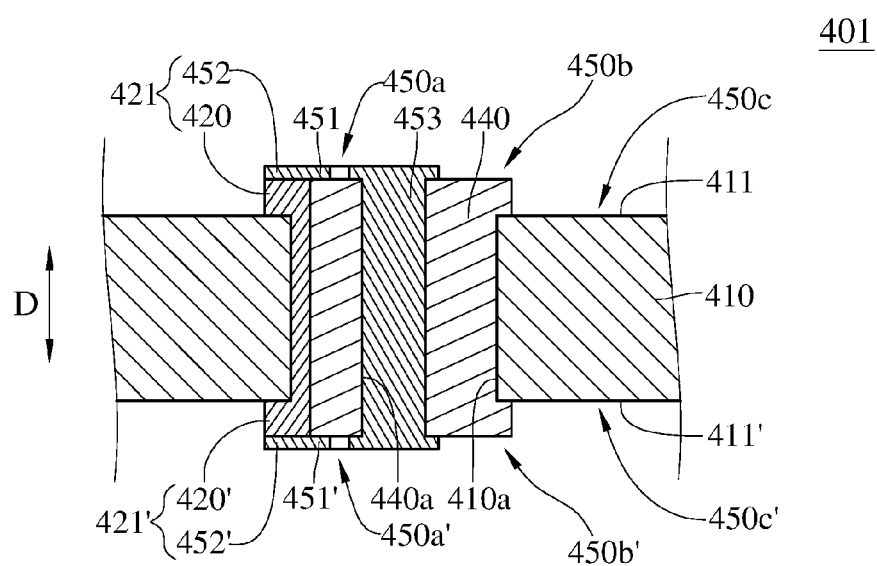
FIG. 63B is a cross-sectional view of the circuit structure along a line 63B-63B in FIG. 63A.

Please refer to FIG. 63A and FIG. 63B. FIG. 63A is a top view of a circuit structure according to a ninth embodiment of the disclosure. FIG. 63B is a cross-sectional view of the circuit structure along a line 63B-63B in FIG. 63A. In the ninth embodiment of the disclosure, the circuit structure 401 is similar to the circuit structure 400, and each of the similar components is given the same sign, respectively. Manufacturing steps of the circuit structure 401 are also similar to the manufacturing steps of the circuit structure 400 in FIG. 52A to FIG. 61A and FIG. 52B to FIG. 61B so that the manufacturing steps of the circuit structure 401 are not repeated hereafter.

In the circuit structure 401, except for the top opening 450a, the bottom opening 450a', the top opening 450b and the bottom opening 450b' are formed to expose the dielectric element 440, and a top opening 450c and a bottom opening 450c' are also formed to expose the core substrate 410. The top opening 450c is suitable for patterning the top conductive layer 421 or removing most of the top conductive layer 421 so that at least a part of the top surface 411 of the core substrate 410 is exposed. The bottom opening 450c' is suitable for patterning the bottom conductive layer 421' or removing most of the bottom conductive layer 421' so that at least a part of the bottom surface 411' of the core substrate 410 is exposed. In other embodiments of the present disclosure, the top opening can be used for removing entire of the top conductive layer, and the bottom opening can be used for removing entire of the bottom conductive layer.

Figure 64A:
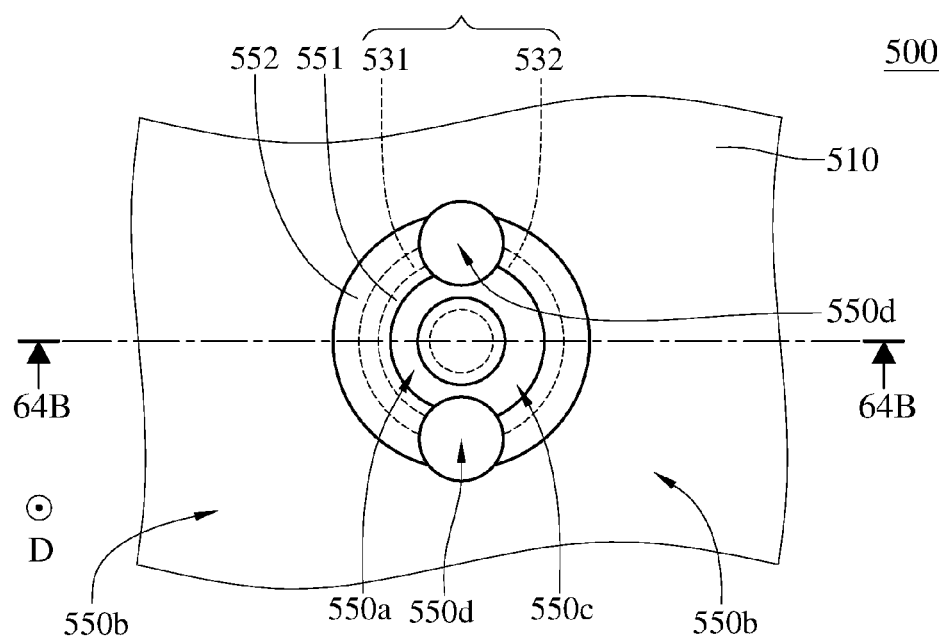
FIG. 64A is a top view of a circuit structure according to a tenth embodiment of the disclosure.
Figure 64B:
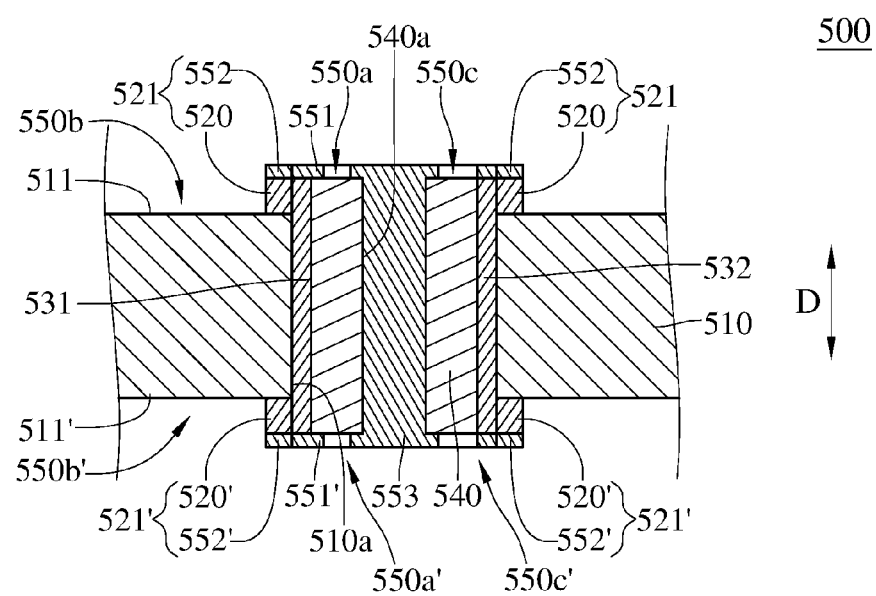
FIG. 64B is a cross-sectional view of the circuit structure along a line 64B-64B in FIG. 64A.
Figure 65A:
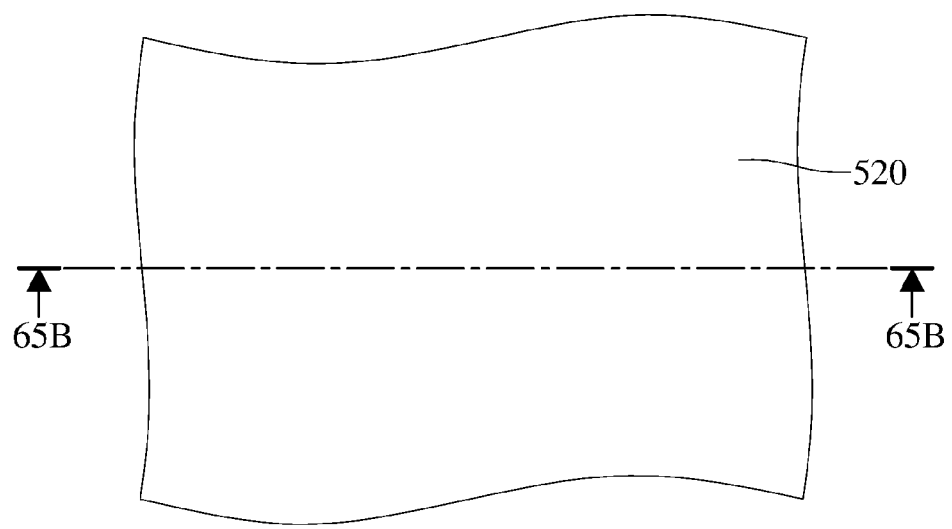
FIG. 65A, FIG. 66A, FIG. 67A, FIG. 68A, FIG. 69A, FIG. 70A, FIG. 71A and FIG. 72A are top views of the circuit structure in FIG. 64A at different manufacturing steps.
Figure 65B:
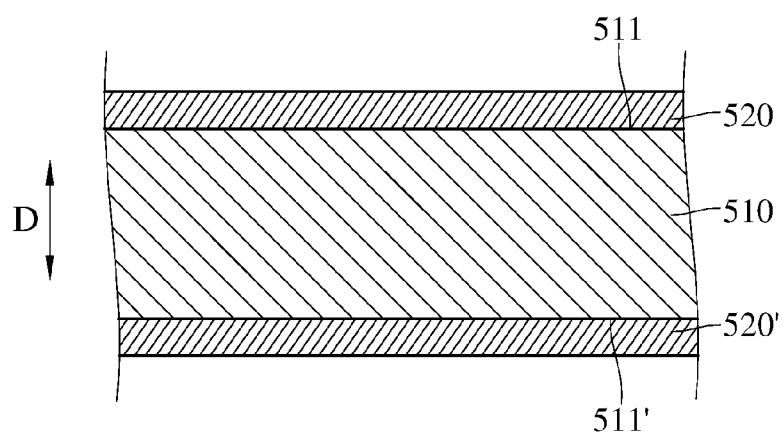
FIG. 65B, FIG. 66B, FIG. 67B, FIG. 68B, FIG. 69B, FIG. 70B, FIG. 71B and FIG. 72B are cross-sectional views of the circuit structure in FIG. 64B at different manufacturing steps.
Figure 66A:
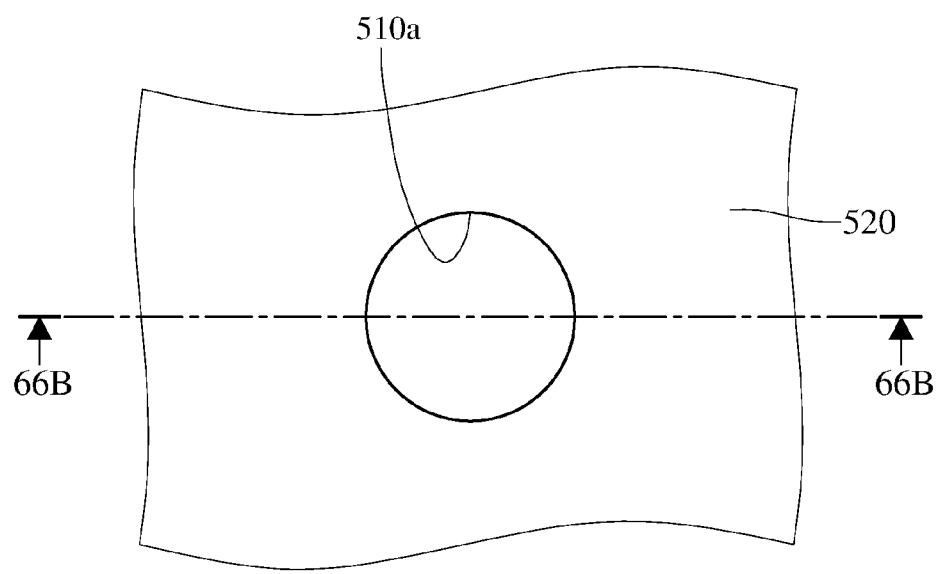
Figure 66B:
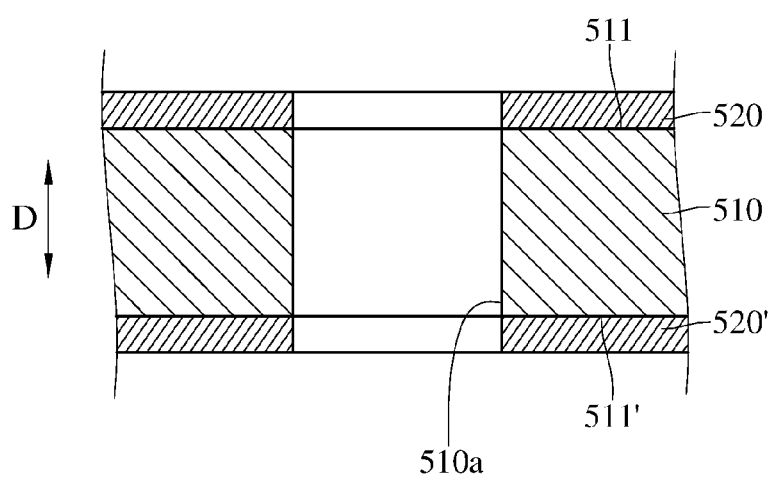

Please refer to FIG. 64A and FIG. 64B. FIG. 64A is a top view of a circuit structure according to a tenth embodiment of the disclosure. FIG. 64B is a cross-sectional view of the circuit structure along a line 64B-64B in FIG. 64A. In the tenth embodiment of the present disclosure, the circuit structure 500 includes a core substrate 510, a top conductive layer 521, a bottom conductive layer 521', a first arcuate conductor 531, a second arcuate conductor 532, a dielectric element 540, a top extension conductor 551, a bottom extension conductor 551' and a conductive via 533.

The circuit structure 500 in the tenth embodiment is similar to the circuit structure 100 in the first embodiment. The core substrate 510 includes a top surface 511, a bottom surface 511' and a through hole 510a extending along a direction D. The top conductive layer 521 can be a stacking structure including a top first conductive layer 520 and a top second conductive layer 552 stacking on the top first conductive layer 520. The bottom conductive layer 521' can be a stacking structure including a bottom first conductive layer 520' and a bottom second conductive layer 552' stacking on the bottom first conductive layer 520'.

In this embodiment, the first arcuate conductor 531 and the second arcuate conductor 532 are disposed on a sidewall of the through hole 510a, and the core substrate 410 is penetrated by the first arcuate conductor 531 and the second arcuate conductor 532. The conductive via 553 extends along the direction D and is located between the first arcuate conductor 531 and the second arcuate conductor 532 so that the first arcuate conductor 531 and the second arcuate conductor 532 are located at two opposite sides of the conductive via 553. The dielectric element 540 is disposed between the conductive via 553 and the first arcuate conductor 531, and the dielectric element 540 is also disposed between the conductive via 553 and the second arcuate conductor 532. The top extension conductor 551 and the bottom top extension conductor 551' are electrically connected to the first arcuate conductor 531 and extend toward the conductive via 553. The top extension conductor 551 and the bottom extension conductor 551' are electrically insu-lated from the conductive via 533. The top opening 550a separates the conductive via 553 and the top extension conductor 551, and the bottom opening 550a' separates the conductive via 553 and the bottom extension conductor 551'. The top opening 550c separates the conductive via 553 and the top second conductive layer 552, and the bottom opening 550c' separates the conductive via 553 and the bottom second conductive layer 552'. The top opening 550b is suitable for patterning the top conductive layer 521 or removing most of the top conductive layer 521 so that at least a part of the top surface 511 of the core substrate 110 is exposed. The bottom opening 550b' is suitable for patterning the bottom conductive layer 521' or removing most of the bottom conductive layer 521' so that at least a part of the bottom surface 511' of the core substrate 510 is exposed. In other embodiments of the present disclosure, the top opening can be used for removing entire of the top conductive layer, and the bottom opening can be used for removing entire of the bottom conductive layer.

Moreover, in the tenth embodiment of the disclosure, two openings 550d located between the first arcuate conductor 531 and the second arcuate conductor 532 so that the first arcuate conductor 531 and the second arcuate conductor 532 are electrically insulated from each other. The two openings 550d extend along the D direction. The first arcuate conductor 531 is connected to a reference potential. The reference potential, for example, is the ground potential or other potential. The second arcuate conductor 532, for example, does not electrically connected to any potential.

In the tenth embodiment of the disclosure, taking the top surface 511 of the core substrate 510 as a reference plane, a height of the top extension conductor 551 is equal to a height of a top end of the conductive via 553, but the disclosure is not limited thereto. In other embodiments of the disclosure, a height of the top extension conductor can be less than a height of a top end of the conductive via.

Furthermore, in other embodiments of the disclosure, the circuit structure further includes at least one insulating layer and at least one conductive line. The insulating layer can be disposed on the core substrate. The conductive line can be disposed on the insulating layer and electrically connected to at least one end of the conductive via. The conductive line can be electrically insulated from the arcuate conductor. At least a part of an orthogonal projection of the extension conductor on the core substrate and at least a part of an orthogonal projection of the conductive line on the core substrate can be overlapped with each other. In addition, the top extension conductor or the bottom extension conductor can extend and be electrically connected to the conductive via according the demand of the circuit design.

Please refer to FIG. 65A to FIG. 72B. FIG. 65A, FIG. 66A, FIG. 67A, FIG. 68A, FIG. 69A, FIG. 70A, FIG. 71A and FIG. 72A are top views of the circuit structure in FIG. 64A at different manufacturing steps. FIG. 65B, FIG. 66B, FIG. 67B, FIG. 68B, FIG. 69B, FIG. 70B, FIG. 71B and FIG. 72B are cross-sectional views of the circuit structure in FIG. 64B at different manufacturing steps. Wherein, the manufacturing process of the circuit structure 500 in FIG. 65A to FIG. 66A and FIG. 65B to FIG. 66B is similar to the manufacturing process of the circuit structure 100 in FIG. 2A to FIG. 3A and FIG. 2B to FIG. 3B so that the manufacturing steps of the circuit structure 500 in FIG. 65A to FIG. 66A and FIG. 65B to FIG. 66B are not repeated hereafter.

Figure 67A:
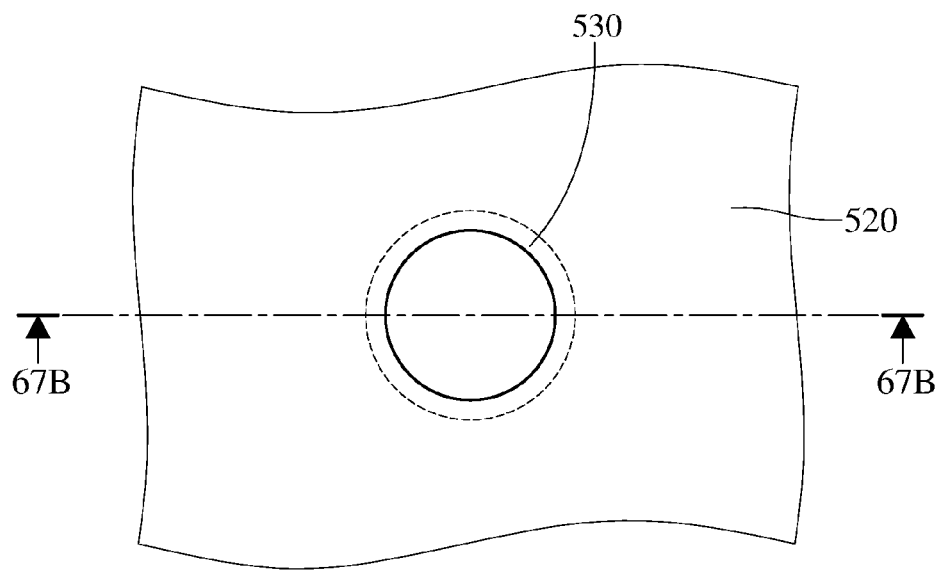
Figure 67B:
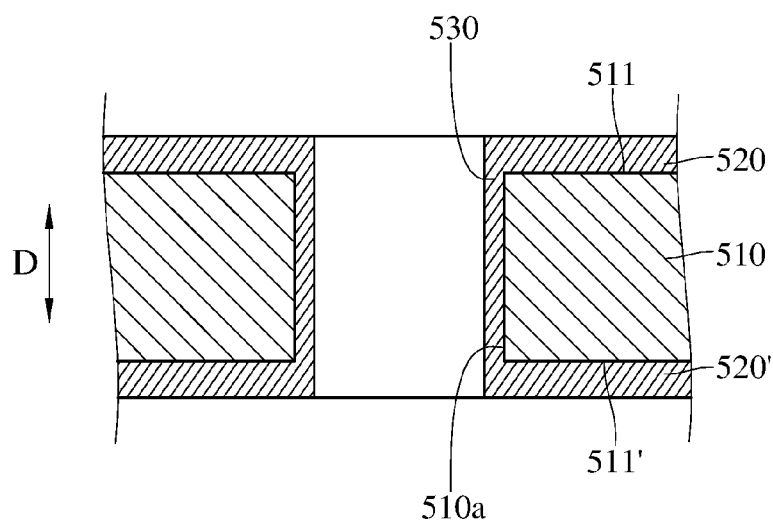

As shown in FIG. 67A and FIG. 67B, an annular conductive material 530 on a sidewall of the through hole 510a is formed. The annular conductive material 530 is electrically connected to the top first conductive layer 520 and the bottom first conductive layer 520'. The annular conductive material 530 extends along a direction D and penetrates the core substrate 510.

Figure 68A:
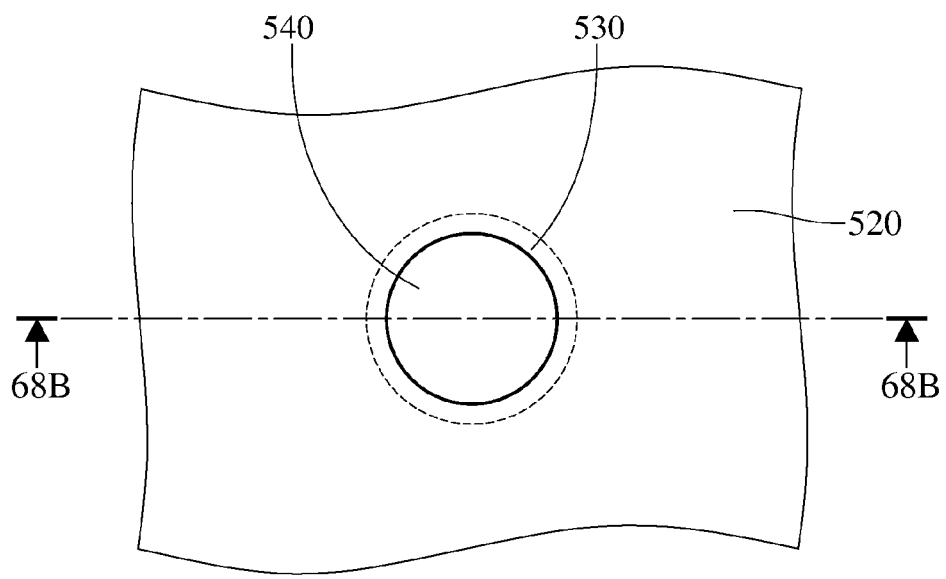
Figure 68B:
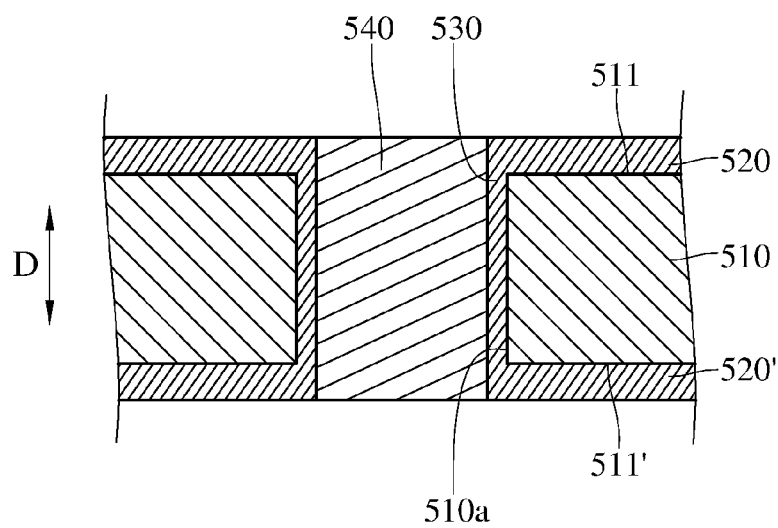

As shown in FIG. 68A and FIG. 68B, a dielectric element 540 is formed in the annular conductive material 530. The dielectric element 540 extends along the direction D.

Figure 69A:
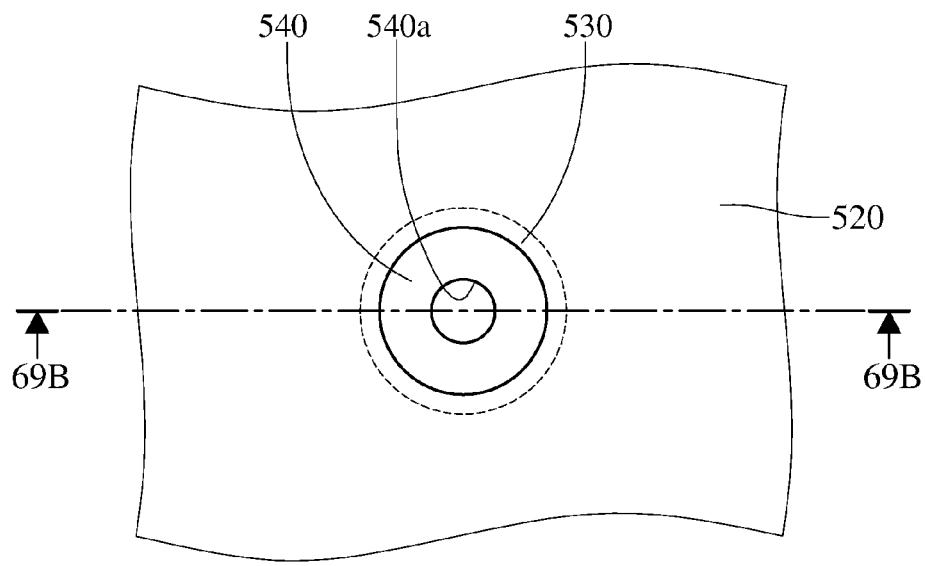
Figure 69B:
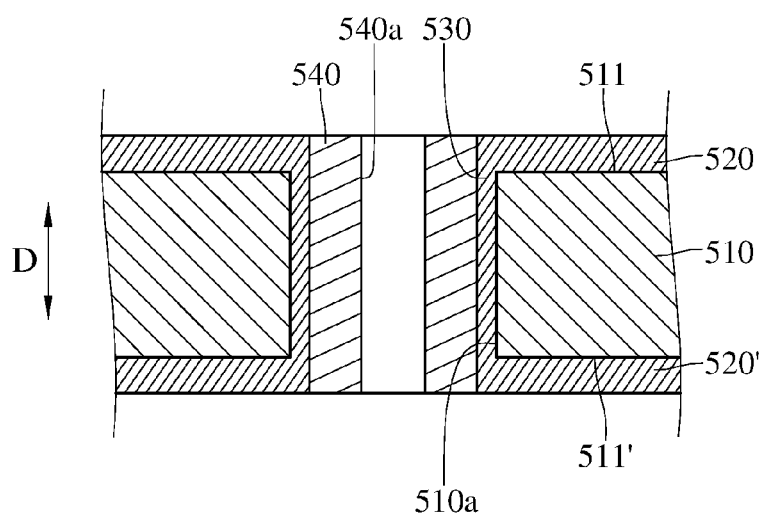

As shown in FIG. 69A and FIG. 69B, a through hole 540a penetrating the dielectric element 540 is formed. The through hole 540a extends along the direction D.

Figure 70A:
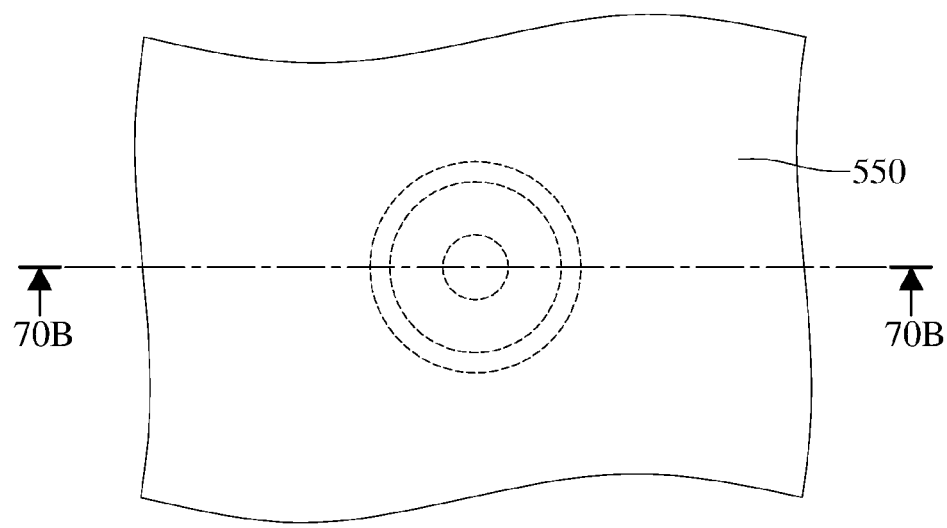
Figure 70B:
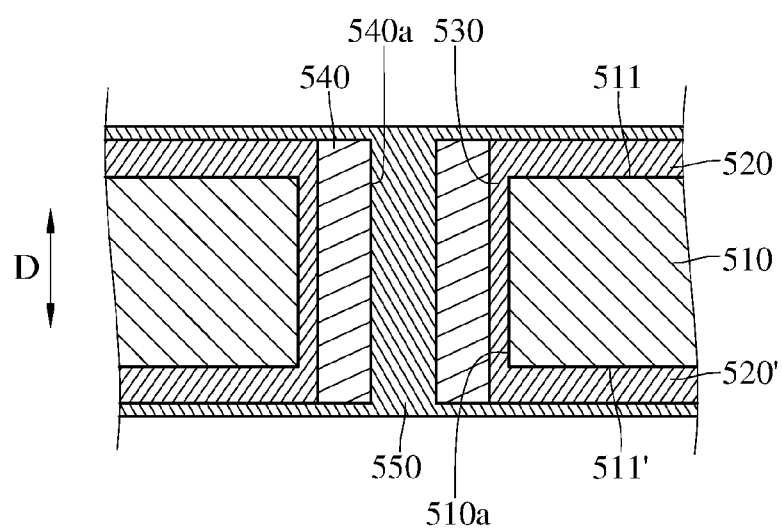
Figure 71A:
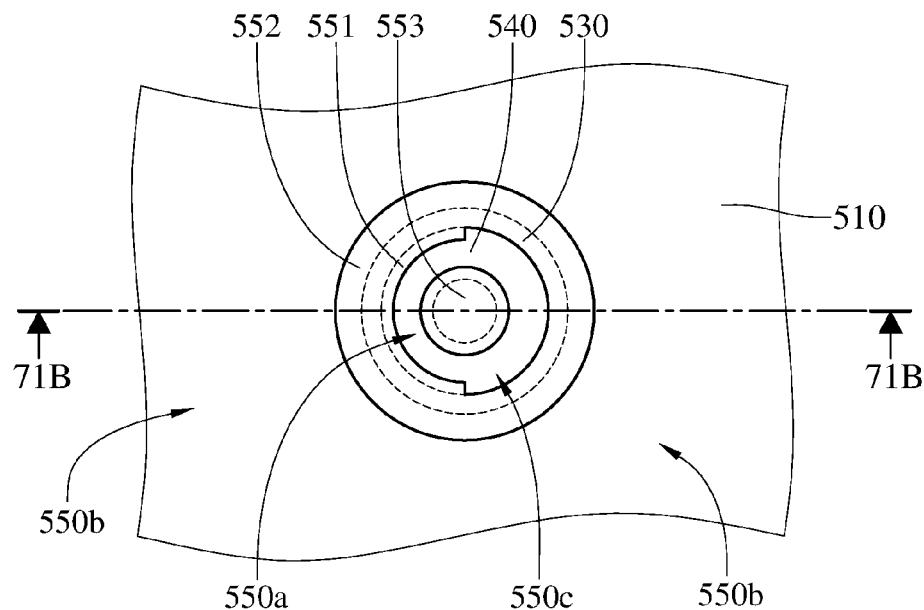
Figure 71B:
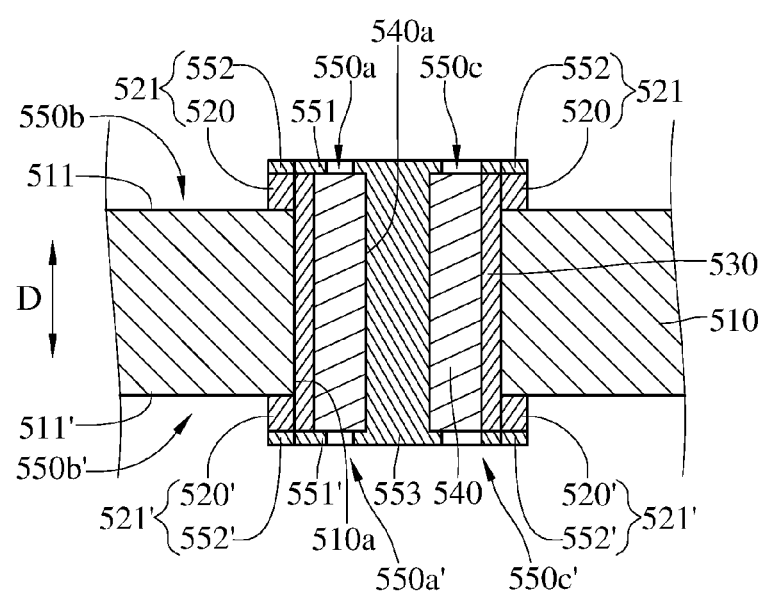

As shown in FIG. 70A and FIG. 70B, a conductive material 550 is formed on a sidewall of the through hole 540a, the dielectric element 540, the top first conductive layer 520 and the bottom first conductive layer 520'. As shown in FIG. 71A and FIG. 71B, a top opening 550a, a bottom opening 550a', a top opening 550c and a bottom opening 550c' are formed around the through hole 540a, and a top opening 550b and a bottom opening 550b' are formed around the dielectric element 540. As shown in FIG. 70B, the conductive material 550 is divided into a top extension conductor 551, a bottom extension conductor 551', a top second conductive layer 552, a bottom second conductive layer 552' and a conductive via 553. Specifically, the conductive via 553 and the top extension conductor 551 are separated by the top opening 550a, and the conductive via 553 and the bottom extension conductor 551' are separated by the bottom opening 550a'. The conductive via 553 and the top second conductive layer 552 are separated by the top opening 550c, and the conductive via 553 and the bottom second conductive layer 552' are separated by the bottom opening 550c'. The top opening 550b is suitable for patterning the top conductive layer 521 or removing most of the top conductive layer 521 so that at least a part of the top surface 511 of the core substrate 510 is exposed. The bottom opening 550b' is suitable for patterning the bottom conductive layer 521' or removing most of the bottom conductive layer 521' so that at least a part of the bottom surface 511' of the core substrate 510 is exposed.

Figure 72A:
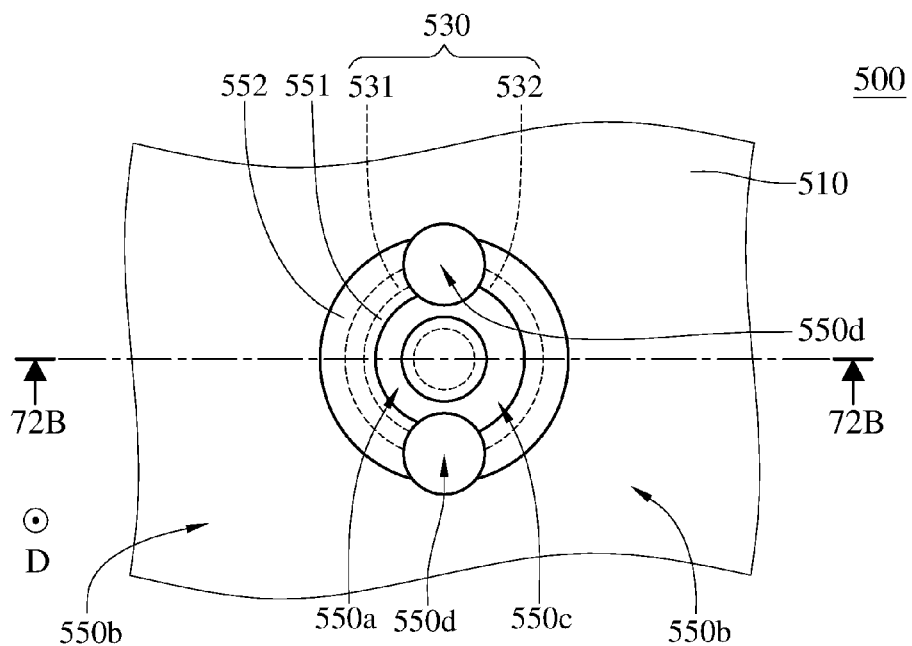
Figure 72B:
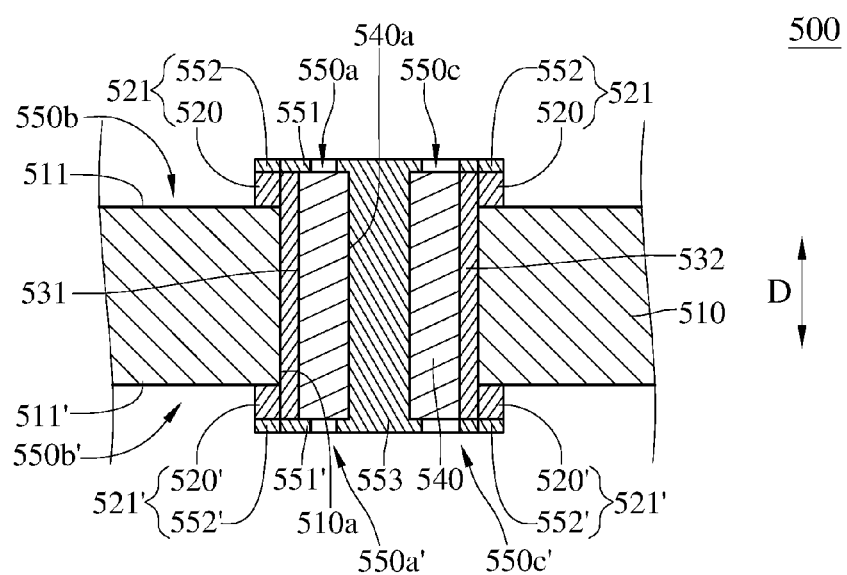

As shown in FIG. 72A and FIG. 72B, two openings 550d penetrating the core substrate 510 are formed. Two opposite ends of one of the two openings 550d are located at one connecting area of the top opening 550a and the top opening 550c and one connecting area of the bottom opening 550a' and the bottom opening 550c', respectively. Two opposite ends of the other openings 550d are located at the other connecting area of the top opening 550a and the top opening 550c and the other connecting area of the bottom opening 550a' and the bottom opening 550c', respectively. The two openings 550d extend along the direction D. The annular conductive material 530 is divided into the first arcuate conductor 531 and the second arcuate conductor 532 by the two openings 550d, and the top extension conductors 551 as well as the bottom extension conductor 551' are electrically connected to the first arcuate conductor 531.

Figure 73A:
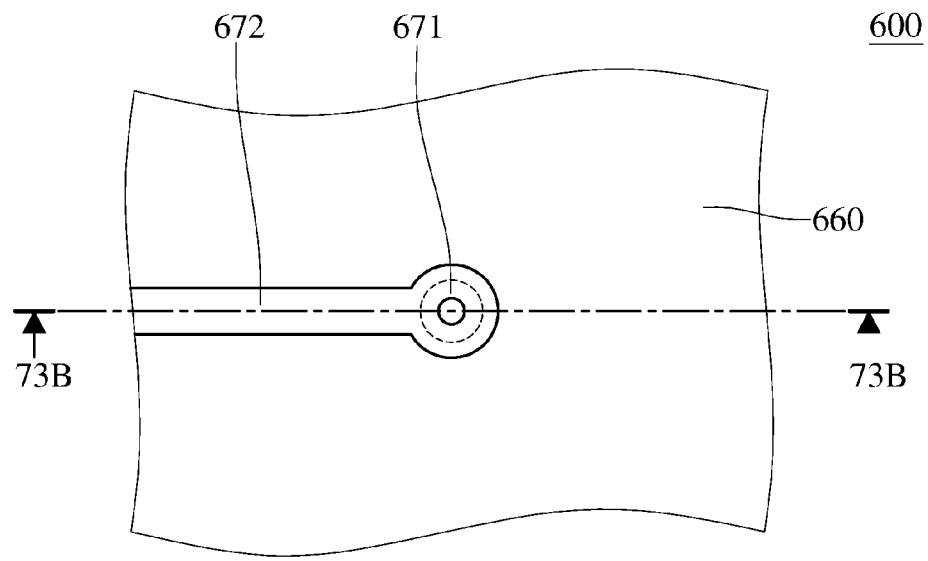
FIG. 73A is a top view of a circuit structure according to an eleventh embodiment of the disclosure.
Figure 73B:
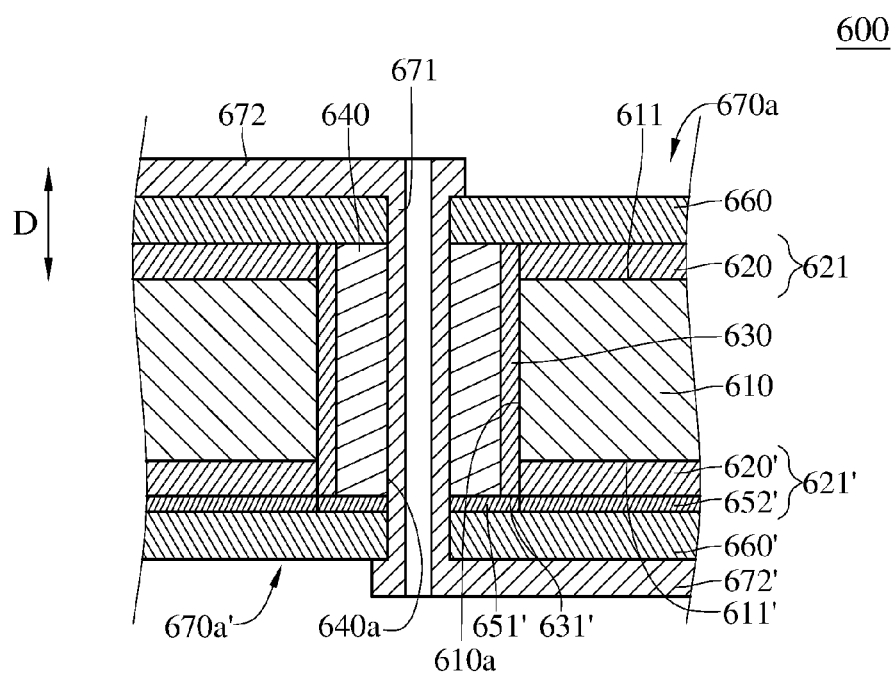
FIG. 73B is a cross-sectional view of the circuit structure along a line 73B-73B in FIG. 73A.

Please refer to FIG. 73A and FIG. 73B. FIG. 73A is a top view of a circuit structure according to an eleventh embodiment of the disclosure. FIG. 73B is a cross-sectional view of the circuit structure along a line 73B-73B in FIG. 73A. In the eleventh embodiment of the present disclosure, the circuit structure 600 includes a core substrate 610, a top conductive layer 621, a bottom conductive layer 621', a annular conductor 630, a dielectric element 640, a bottom extension conductor 651', a top insulating layer 660, a bottom insulating layer 660', a conductive via 671, a top conductive line 672 and a bottom conductive line 672'.

The core substrate 610 includes a top surface 611, a bottom surface 611' and a through hole 610a. The through hole 610a extends along a direction D. The annular conductor 630 is disposed on a sidewall of the through hole 610a and extends along the direction D.

The dielectric element 640 is disposed in the annular conductor 630, and a through hole 640a penetrates the dielectric element 640. The conductive via 671 extending along the direction D is disposed in the annular conductor 630. Specifically, the conductive via 671 is disposed on a sidewall of the through hole 640a. The dielectric element 640 is located between the conductive via 671 and the annular conductor 630. A dielectric constant of the dielectric element 640 is from 1 to 6.

The bottom extension conductor 651' is electrically connected to a bottom end 631' of the annular conductor 630 and extends toward the conductive via 671. The bottom extension conductor 651' extends toward the conductive via 671 and is electrically connected to the conductive via 671.

The top conductive layer 621 is formed by a top first conductive layer 620. The bottom conductive layer 621' can be a stacking structure including a bottom first conductive layer 620' and a bottom second conductive layer 652' stacking on the bottom first conductive layer 620'. The bottom second conductive layer 652' covers a part or all of the bottom first conductive layer 620'.

The top insulating layer 660 located on a top surface 611 of the core substrate 610 covers the top conductive layer 621. The bottom insulating layer 660' located under a bottom surface 611' of the core substrate 610 covers the bottom conductive layer 621'. The top conductive line 672 is disposed on a surface of the top insulating layer 660 and electrically connected to a top end of the conductive via 671. The bottom conductive line 672' is disposed under a surface of the bottom insulating layer 660' and electrically connected to a bottom end of the conductive via 671. The top opening 670a is suitable for patterning the top conductive line 672, and the bottom opening 670a' is suitable for patterning the bottom conductive line 672'.

The following describes a manufacturing process of the circuit structure 600. Please refer to FIG. 74A to FIG. 82B. FIG. 74A, FIG. 75A, FIG. 76A, FIG. 77A, FIG. 78A, FIG. 79A, FIG. 80A, FIG. 81A and FIG. 82A are top views of the circuit structure in FIG. 73A at different manufacturing steps. FIG. 74B, FIG. 75B, FIG. 76B, FIG. 77B, FIG. 78B, FIG. 79B, FIG. 80B, FIG. 81B and FIG. 82B are cross-sectional views of the circuit structure in FIG. 73B at different manufacturing steps.

Figure 74A:
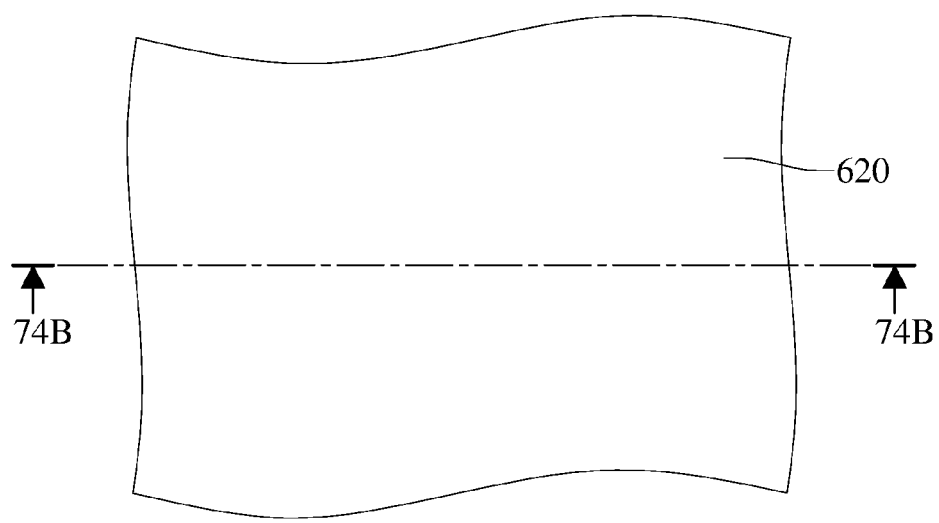
FIG. 74A, FIG. 75A, FIG. 76A, FIG. 77A, FIG. 78A, FIG. 79A, FIG. 80A, FIG. 81A and FIG. 82A are top views of the circuit structure in FIG. 73A at different manufacturing steps.
Figure 74B:
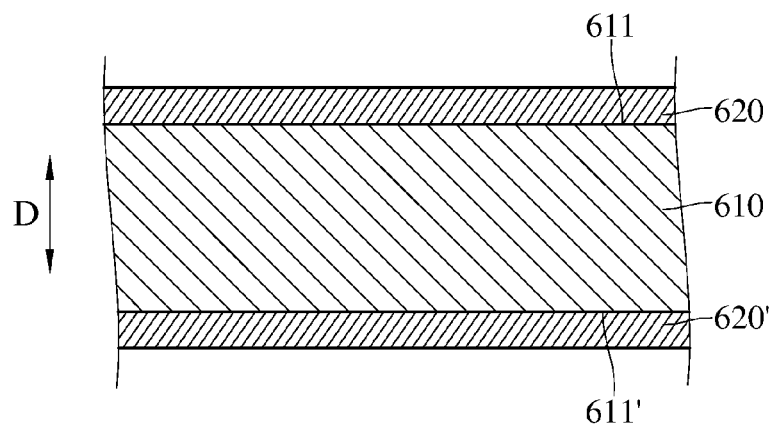
FIG. 74B, FIG. 75B, FIG. 76B, FIG. 77B, FIG. 78B, FIG. 79B, FIG. 80B, FIG. 81B and FIG. 82B are cross-sectional views of the circuit structure in FIG. 73B at different manufacturing steps.

As shown in FIG. 74A and FIG. 74B, a core substrate 610 is provided. A top first conductive layer 620 is formed on a top surface 611 of the core substrate 610, and a bottom first conductive layer 620' is formed under a bottom surface 611' of the core substrate 610.

Figure 75A:
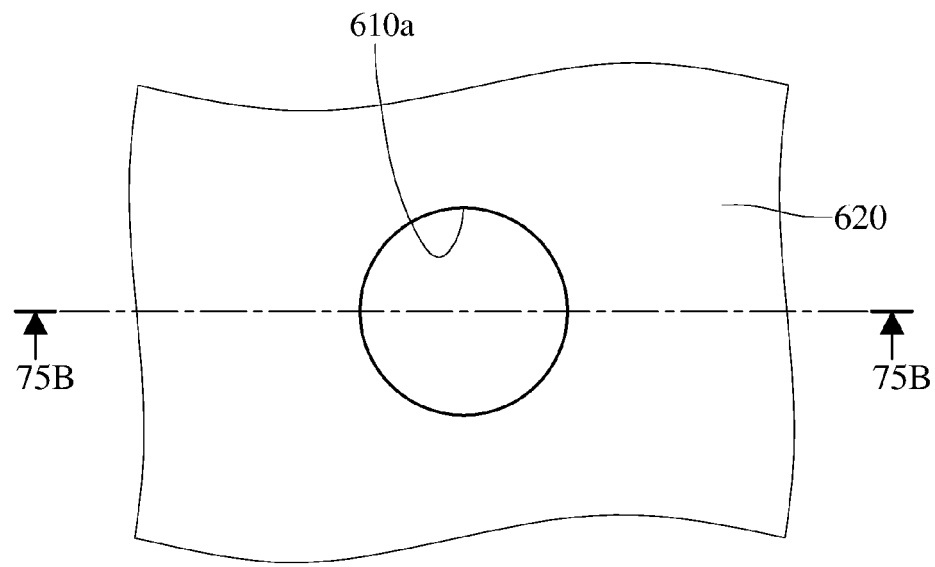
Figure 75B:
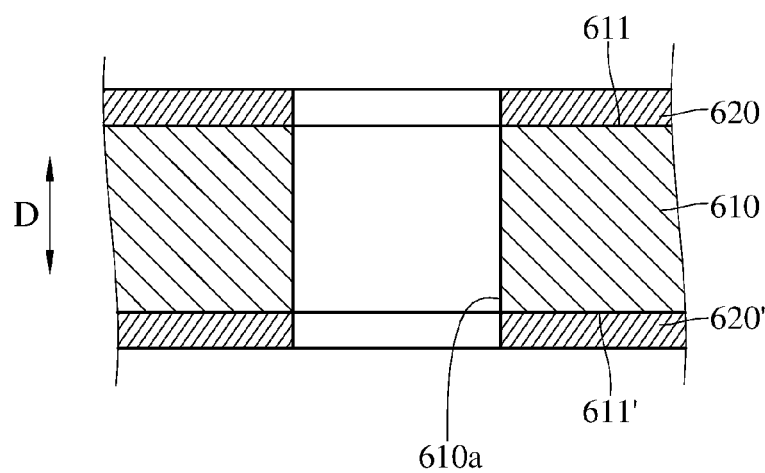

As shown in FIG. 75A and FIG. 75B, a through hole 610a penetrating the top first conductive layer 620, the core substrate 610 and the bottom first conductive layer 620' is formed. The through hole 610a extends along a direction D.

Figure 76A:
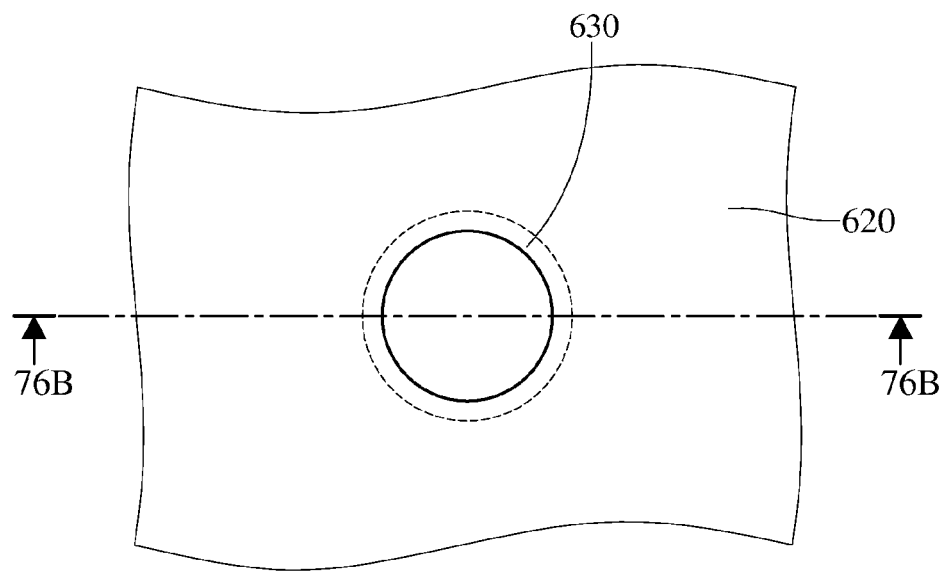
Figure 76B:
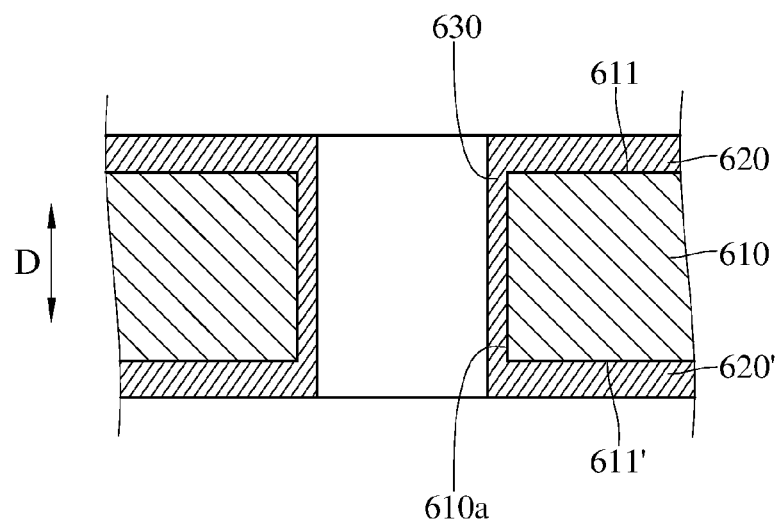

As shown in FIG. 76A and FIG. 76B, an annular conductor 630 is formed on a sidewall of the through hole 610a. The annular conductor 630 is electrically connected to the top first conductive layer 620 and the bottom first conductive layer 620'. The annular conductor 630 extends along the direction D and penetrates the core substrate 610.

Figure 77A:
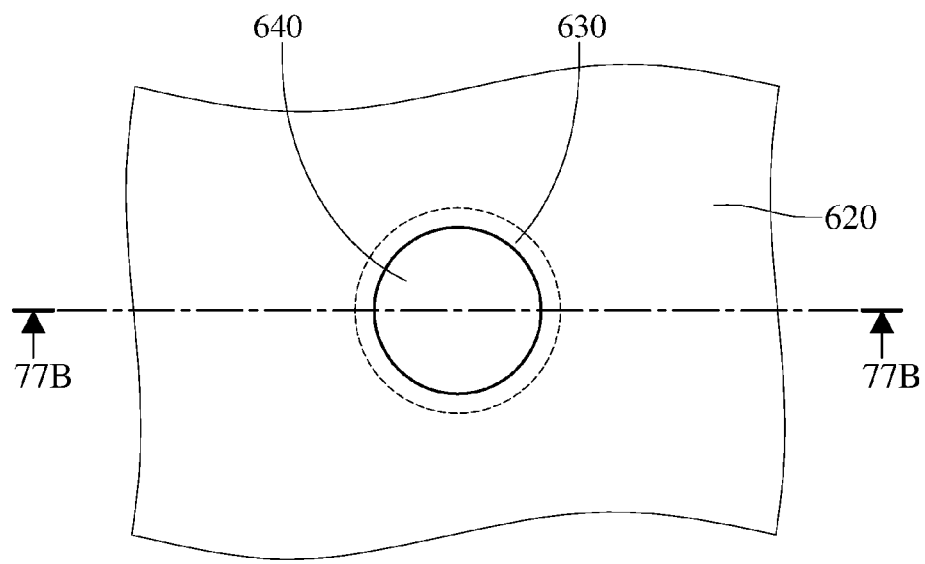
Figure 77B:
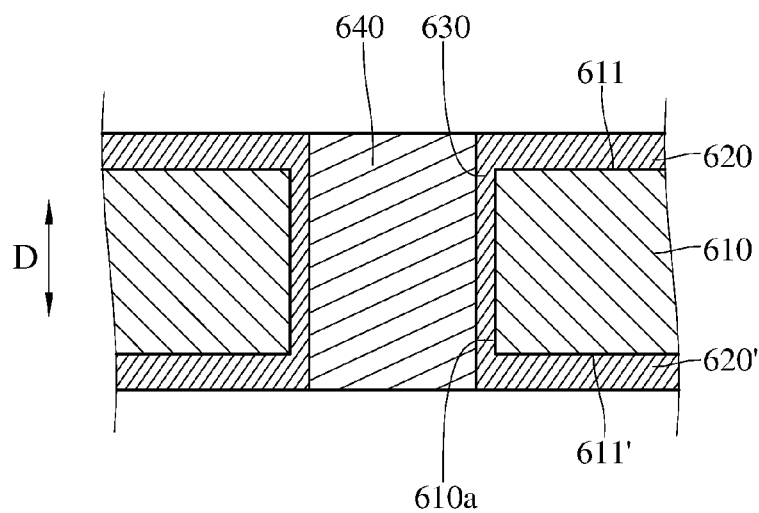

As shown in FIG. 77A and FIG. 77B, a dielectric element 640 is formed in the annular conductor 630. The dielectric element 640 extends along the direction D.

Figure 78A:
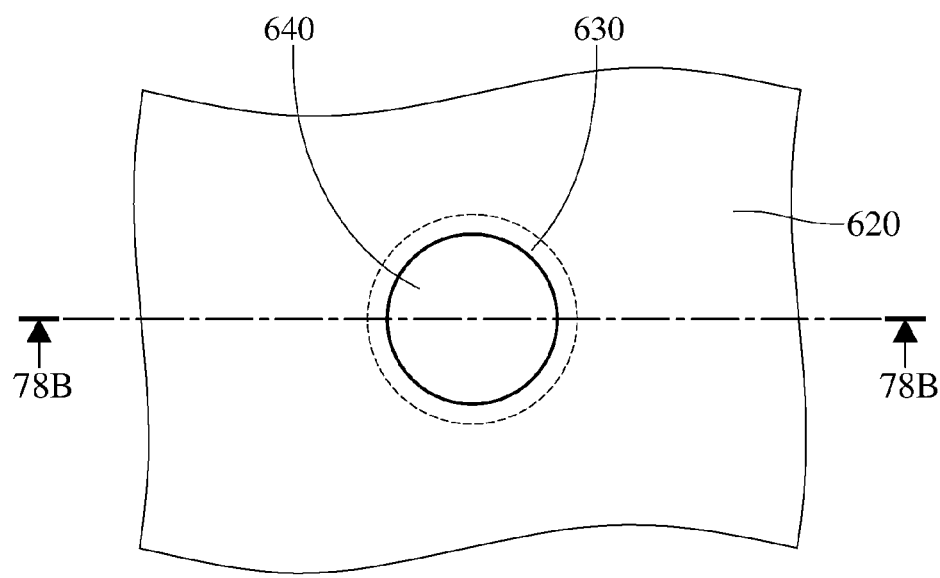
Figure 78B:
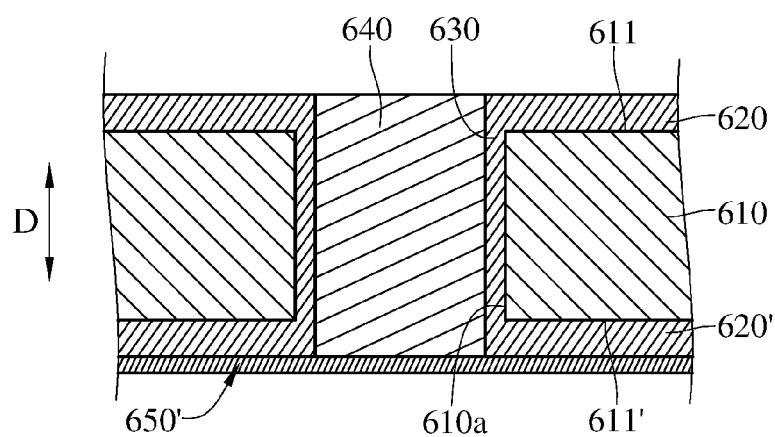
Figure 79A:
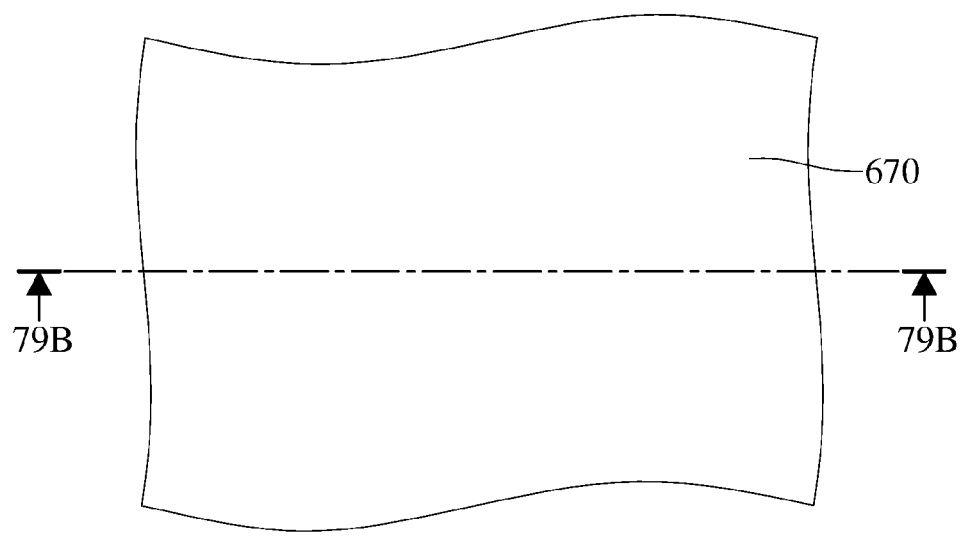
Figure 79B:
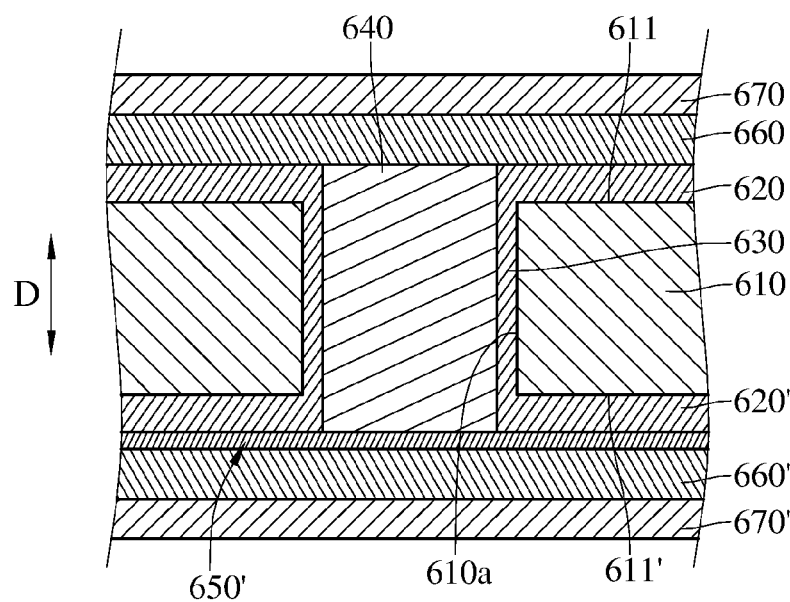

As shown in FIG. 78A and FIG. 78B, a bottom conductive material 650' is formed under the bottom first conductive layer 620' and a surface of the dielectric element 640. As shown in FIG. 79A and FIG. 79B, a top insulating layer 660 covering the top first conductive layer 620 and the dielectric element 640 is formed, and a top conductive line material 670 is formed on a surface of the top insulating layer 660. A bottom insulating layer 660' covering the bottom conductive material 650' is formed, and a bottom conductive line material 670' is formed under a surface of the bottom insulating layer 660'.

Figure 80A:
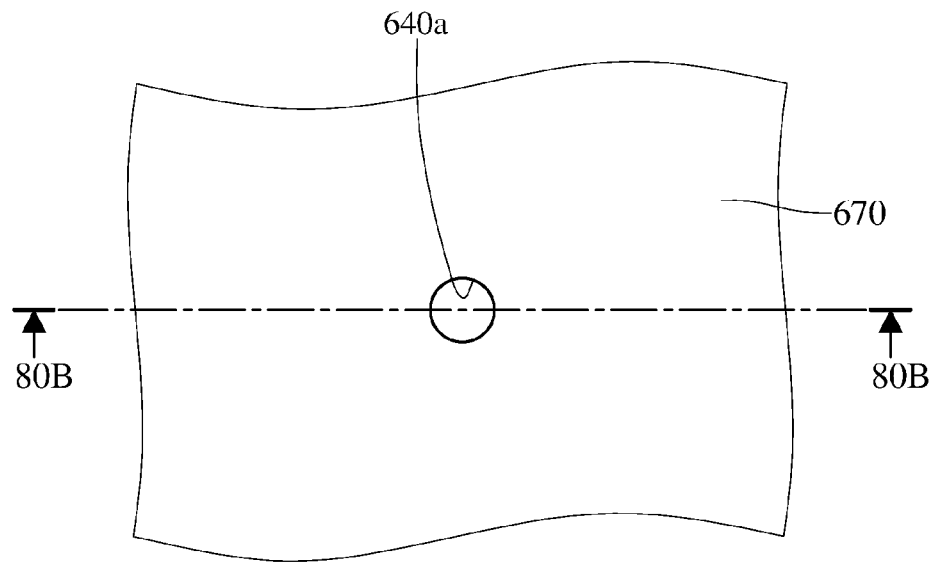
Figure 80B:
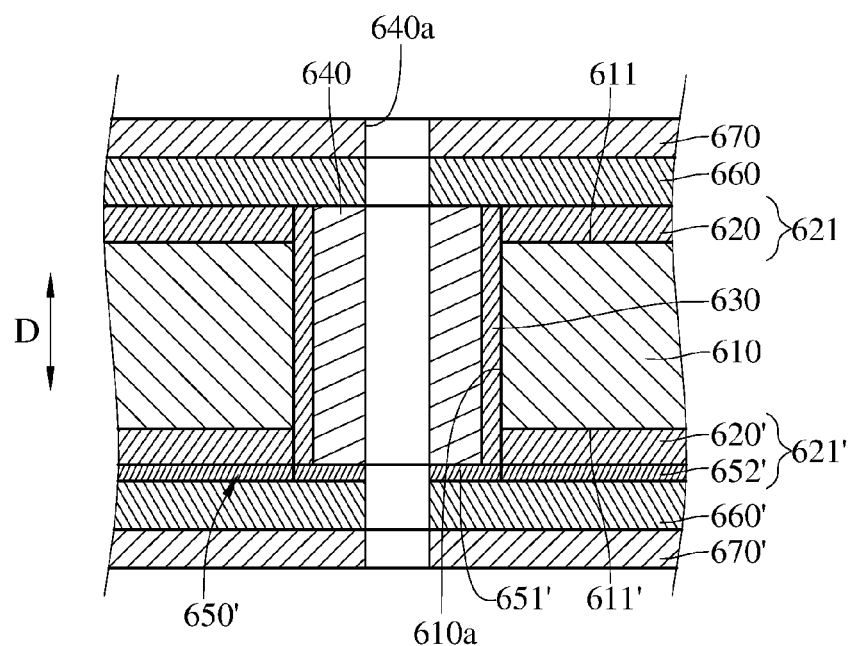

As shown in FIG. 80A and FIG. 80B, a through hole 640a penetrating the top conductive line material 670, the top insulating layer 660, the dielectric element 640, the bottom conductive material 650', the bottom insulating layer 660' and the bottom conductive line material 670' is formed. The through hole 640a extends along the direction D. Moreover, the bottom conductive material 650' is divided into a bottom extension conductor 651' and a bottom second conductive layer 652'. The bottom extension conductor 651' extends from the annular conductor 630 to the conductive via 671, and the bottom second conductive layer 652' extends exterior from the annular conductor 630. The bottom conductive layer 621' can be a stacking structure including the bottom first conductive layer 620' and the bottom second conductive layer 652' stacking on the bottom first conductive layer 620'.

Figure 81A:
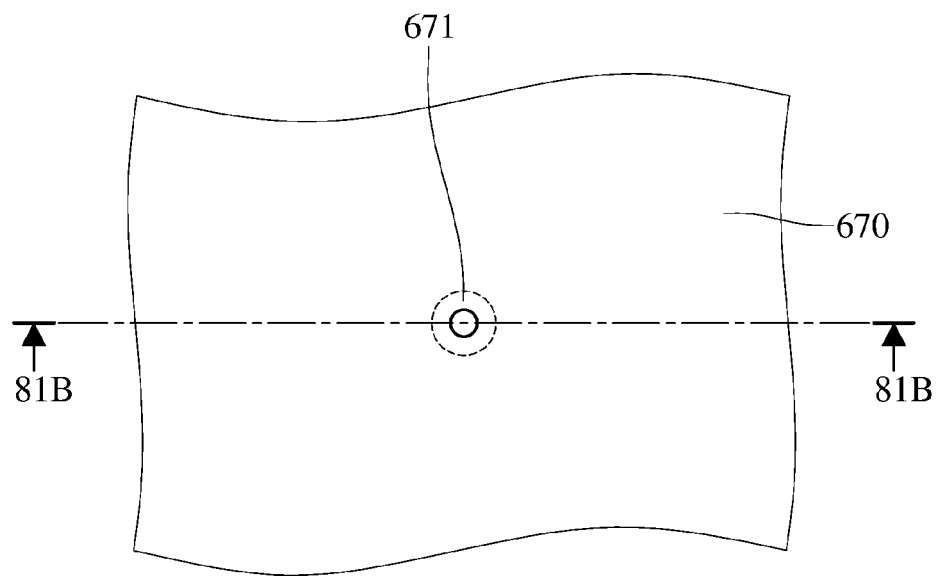
Figure 81B:
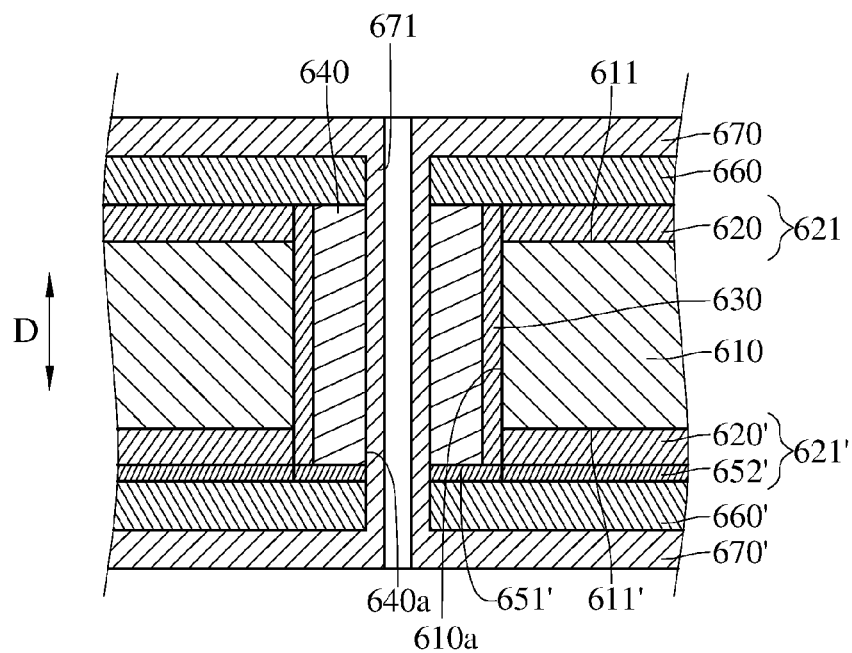

As shown in FIG. 81A and FIG. 81B, a conductive via 671 is formed in the through hole 640a. The conductive via 671 is electrically connected to the top conductive line material 670, the bottom conductive line material 670' and the bottom extension conductor 651'. The through hole 640a extends along the direction D; therefore the conductive via 671 extends along the direction D.

Figure 82A:
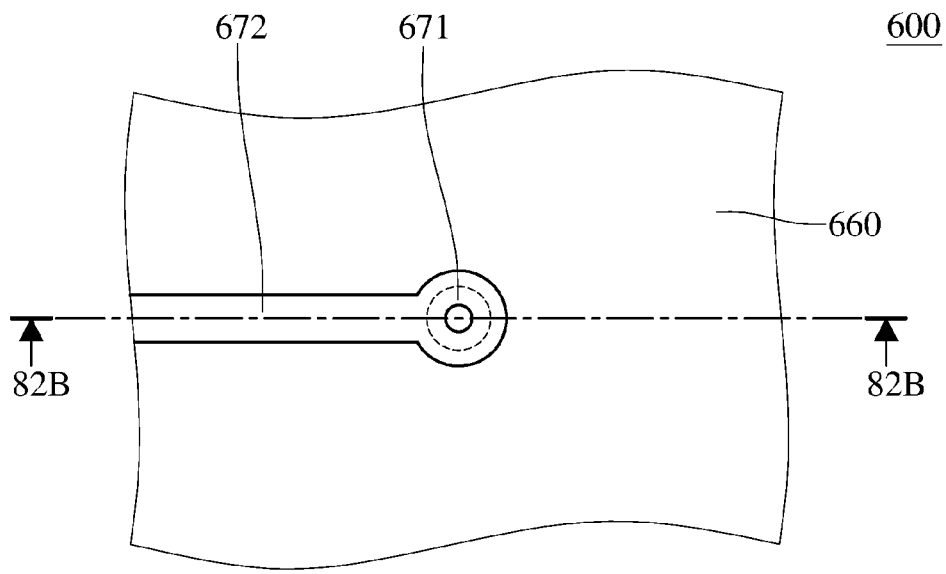
Figure 82B:
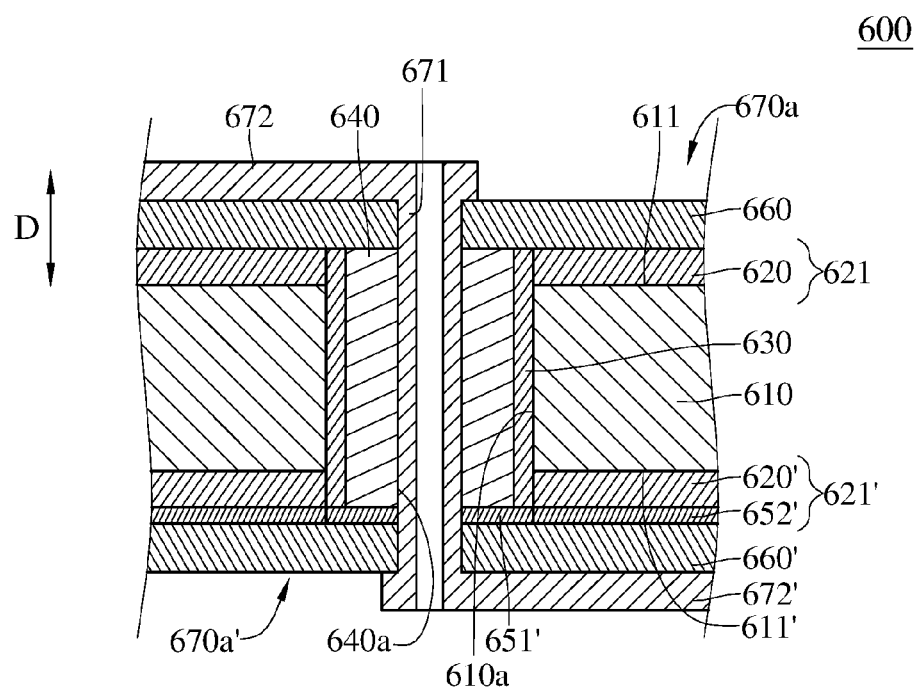

As shown in FIG. 82A and FIG. 82B, the top conductive line material 670 in FIG. 81B is patterned by the top opening 670a to form a top conductive line 672. The bottom conductive line material 670' in FIG. 81B is patterned by the bottom opening 670a' to form a bottom conductive line 672'.

According to the circuit structure in this disclosure, the extension of the extension conductor and the annular conductor are favorable for providing a uniform electrical field applied on the electrical signals when the electrical signals pass through the conductive via and matching the impedance of the conductive lines to the impedance of the conductive vias. Therefore, the problem about the electrical signal loss during transmitting by electrical signal reflection is solved.

What is claimed is:

1. A circuit structure, comprising:
   an annular conductor extending along a direction;
   a core substrate penetrated by the annular conductor;
   a conductive via disposed in the annular conductor and extending along the direction;
   at least one extension conductor electrically connected to at least one end of the annular conductor and extending toward the conductive via;
   at least one conductive layer electrically connected to the at least one extension conductor; and
   at least one conductive line disposed on the core substrate, the at least one conductive line electrically connected to at least one end of the conductive via and electrically insulated from the annular conductor, the at least one conductive layer and the at least one extension conductor;
   wherein an orthogonal projection of the at least one extension conductor on the core substrate and an orthogonal projection of the at least one conductive line on the core substrate are partially overlapped with each other;
   wherein a height of the at least one extension conductor from at least one surface of the core substrate is less than a height of the conductive via from the at least one surface of the core substrate.

2. The circuit structure according to claim 1, wherein the at least one extension conductor is electrically insulated from the conductive via.

3. The circuit structure according to claim 1, wherein the at least one extension conductor is electrically connected to the conductive via.

4. The circuit structure according to claim 1, further comprising a dielectric element disposed between the conductive via and the annular conductor.

5. The circuit structure according to claim 4, wherein a dielectric constant of the dielectric element is from 1 to 6.

6. The circuit structure according to claim 1, wherein the at least one extension conductor and the annular conductor are electrically connected to a reference potential.

7. The circuit structure according to claim 1, further comprising:
   at least one insulating layer disposed on the core substrate, and the at least one conductive line disposed on the at least one insulating layer.

8. A circuit structure, comprising:
   a conductive via extending along a direction;
   a first arcuate conductor disposed at one side of the conductive via, and the first arcuate conductor electrically insulated from the conductive via;
   a core substrate penetrated by the first arcuate conductor;
   at least one extension conductor electrically connected to at least one end of the first arcuate conductor and extending toward the conductive via;
   at least one conductive layer electrically connected to the at least one extension conductor; and
   at least one conductive line disposed on the core substrate, the at least one conductive line electrically connected to at least one end of the conductive via and electrically insulated from the first arcuate conductor, the at least one conductive layer and the at least one extension conductor;
   wherein an orthogonal projection of the at least one extension conductor on the core substrate and an orthogonal projection of the at least one conductive line on the core substrate are partially overlapped with each other;
   wherein a height of the at least one extension conductor from at least one surface of the core substrate is less than a height of the conductive via from the at least one surface of the core substrate.

9. The circuit structure according to claim 8, wherein the at least one extension conductor is electrically insulated from the conductive via.

10. The circuit structure according to claim 8, wherein the at least one extension conductor is electrically connected to the conductive via.

11. The circuit structure according to claim 8, further comprising a second arcuate conductor disposed at another side of the conductive via, and the second arcuate conductor electrically insulated from the first arcuate conductor.

12. The circuit structure according to claim 8, further comprising a dielectric element surrounding the conductive via, the conductive via having two ends that are opposite to each other and exposed, and the dielectric element located between the conductive via and the first arcuate conductor.

13. The circuit structure according to claim 12, wherein a dielectric constant of the dielectric element is from 1 to 6.

14. The circuit structure according to claim 8, wherein the first arcuate conductor and the at least one extension conductor are electrically connected to a reference potential.

15. The circuit structure according to claim 8, wherein the at least one conductive layer is disposed on the at least one surface of the core substrate, and the at least one conductive layer is electrically connected to at least one end of the first arcuate conductor and the at least one extension conductor.

16. The circuit structure according to claim 15, wherein the at least one conductive layer comprises a first conductive layer and a second conductive layer, the first conductive layer is disposed on the at least one surface of the core substrate, and the second conductive layer is disposed on a part of the first conductive layer.

17. The circuit structure according to claim 8, further comprising:
- at least one insulating layer disposed on the core substrate, and the at least one conductive line disposed on the at least one insulating layer.

18. The circuit structure according to claim 1, wherein the at least one conductive layer is disposed on the at least one surface of the core substrate, and the at least one conductive layer is electrically connected to the at least one end of the annular conductor.

19. The circuit structure according to claim 18, wherein the at least one conductive layer comprises a first conductive layer and a second conductive layer, the first conductive layer is disposed on the at least one surface of the core substrate, and the second conductive layer is disposed on a part of the first conductive layer.

\* \* \* \* \*